(12) United States Patent
Kim et al.

(10) Patent No.: US 12,418,752 B2
(45) Date of Patent: Sep. 16, 2025

(54) SOUND APPARATUS

(71) Applicant: LG Display Co., Ltd., Seoul (KR)

(72) Inventors: Daeho Kim, Paju-si (KR); YeongRak Choi, Paju-si (KR); MinKyu Choi, Paju-si (KR); Seungo Jeon, Paju-si (KR); Kwangho Kim, Paju-si (KR); Jeongbeom Lee, Paju-si (KR); Taehyoung Kim, Paju-si (KR); KwanHo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 300 days.

(21) Appl. No.: 18/090,661

(22) Filed: Dec. 29, 2022

(65) Prior Publication Data
US 2023/0217189 A1 Jul. 6, 2023

(30) Foreign Application Priority Data
Dec. 31, 2021 (KR) .................. 10-2021-0194781

(51) Int. Cl.
*H04R 17/00* (2006.01)
*H04R 1/02* (2006.01)
*H10N 30/20* (2023.01)

(52) U.S. Cl.
CPC ............ *H04R 17/00* (2013.01); *H04R 1/028* (2013.01); *H10N 30/204* (2023.02); *H04R 2499/15* (2013.01)

(58) Field of Classification Search
None
See application file for complete search history.

(56) References Cited

U.S. PATENT DOCUMENTS

| 8,259,930 | B2* | 9/2012 | Kawasaki | H04M 1/02 455/566 |
| 11,218,798 | B2* | 1/2022 | Yang | G06F 1/1684 |
| 11,571,712 | B2* | 2/2023 | Ishii | H10N 30/708 |
| 2015/0023530 | A1* | 1/2015 | Takahashi | G10K 9/121 381/190 |
| 2016/0088399 | A1 | 3/2016 | Watanabe | |
| 2016/0241689 | A1* | 8/2016 | Watanabe | H10N 30/2047 |
| 2017/0105294 | A1* | 4/2017 | Shimoda | G06F 3/016 |
| 2020/0280796 | A1* | 9/2020 | Lee | H04R 9/025 |
| 2020/0314551 | A1* | 10/2020 | Kim | H04R 7/045 |
| 2021/0168540 | A1* | 6/2021 | Liao | H04R 9/06 |

FOREIGN PATENT DOCUMENTS

| CN | 108337618 A | 7/2018 |
| CN | 108881523 A | 11/2018 |
| CN | 211720577 U | 10/2020 |

(Continued)

*Primary Examiner* — Paul W Huber
(74) *Attorney, Agent, or Firm* — Birch, Stewart, Kolasch & Birch, LLP

(57) ABSTRACT

A sound apparatus can include a vibration member; a housing at a rear surface of the vibration member; a connection member disposed between the vibration member and the housing; and a vibration apparatus configured to vibrate the vibration member. The vibration apparatus can include at least one piezoelectric element for producing sound. Also, the connection member can have a first stiffness that is less than a second stiffness of the housing, and the vibration member can be isolated from the housing by the connection member.

26 Claims, 23 Drawing Sheets

(56) References Cited

FOREIGN PATENT DOCUMENTS

| | | |
|---|---|---|
| JP | 2005-236352 A | 9/2005 |
| JP | 2007-27923 A | 2/2007 |
| JP | 2013-229908 A | 11/2013 |
| JP | 2014-82572 A | 5/2014 |
| JP | 2015-115629 A | 6/2015 |
| JP | 2015-149368 A | 6/2015 |
| JP | 2021-141584 A | 9/2021 |
| JP | 2021-180486 A | 11/2021 |
| KR | 10-2012-0136582 A | 12/2012 |
| WO | WO 2012/157691 A1 | 11/2012 |
| WO | WO2015/064112 A1 | 5/2015 |

* cited by examiner

SOUND APPARATUS

CROSS-REFERENCE TO RELATED APPLICATIONS

This application claims the benefit of and priority to Korean Patent Application No. 10-2021-0194781 filed on Dec. 31, 2021 in the Republic of Korea, the entirety of which is hereby incorporated by reference into the present application.

BACKGROUND

Technical Field

The present disclosure relates to a sound apparatus.

Discussion of the Related Art

An apparatus includes a separate speaker or a sound apparatus providing a sound. When a speaker is disposed in an apparatus, the speaker occupies a space, due to this, the design and spatial disposition of the apparatus are limited due to space constraints, particularly when the speaker is rather large.

A speaker applied to the apparatus can be, for example, an actuator including a magnet and a coil. However, when an actuator is applied to the apparatus, a thickness thereof is thickened. Therefore, piezoelectric elements for realizing a thin thickness are attracting much attention.

Because piezoelectric elements have a fragile characteristic, the piezoelectric elements are easily damaged due to an external impact, and due to this, have a problem where reliability is low in sound reproduction. And, when a speaker such as a piezoelectric element or the like is applied to a flexible apparatus, there is a problem where damage occurs due to a fragile characteristic. For example, if a piezoelectric element for providing sound is applied to a mobile device, the piezoelectric element may be damaged if the mobile device is dropped, which can severely impair sound quality. Also, if a piezoelectric element for providing sound is applied to a vehicle, the piezoelectric element may be damaged vehicle is involved in a minor accident or even when going over rough terrain, which can severely impair sound quality. Also, when the actuator is applied to an apparatus, there may be sound quality issues, such as an impaired bass response, impaired reproduction of midrange frequencies, or harsh high frequency sounds that are too loud related to the lower frequency sounds.

SUMMARY OF THE DISCLOSURE

The inventors of the present disclosure have recognized the problems described above and have performed various experiments for implementing a sound apparatus (or a vibration apparatus) which can enhance the quality of a sound and a sound pressure level characteristic. Through the various experiments, the inventors have invented a new sound apparatus (or vibration apparatus) and an apparatus including the same, which can enhance the quality of a sound.

Accordingly, the present disclosure is directed to providing an apparatus and a vehicular apparatus including the same that substantially obviate one or more problems due to limitations and disadvantages of the related art.

An aspect of the present disclosure is directed to providing an apparatus which can vibrate a vibration member to generate a vibration or a sound and can enhance a sound characteristic and/or a sound pressure level characteristic.

Additional features and aspects of the disclosure will be set forth in the description that follows, and in part will become apparent from the description or can be learned by practice of the inventive concepts provided herein. Other features and aspects of the inventive concepts can be realized and attained by the structure particularly pointed out in the written description, or derivable therefrom, and claims hereof as well as the appended drawings.

To achieve these and other aspects of the inventive concepts, as embodied and broadly described, a sound apparatus comprises a vibration member, a housing at a rear surface of the vibration member, a connection member between the vibration member and the housing, and a vibration apparatus vibrating the vibration member.

In addition to the above-mentioned advantageous effects of the present disclosure, other features and advantages of the present disclosure will be described below or can be clearly understood by those skilled in the art from such description or explanation.

A sound apparatus according to an embodiment of the present disclosure can include an apparatus (or a sound apparatus) which vibrates a display panel or a vibration member and can generate a sound so that a sound of the apparatus travels toward a front surface of the display panel or the vibration member.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory, and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain principles of the disclosure

Figure 1:
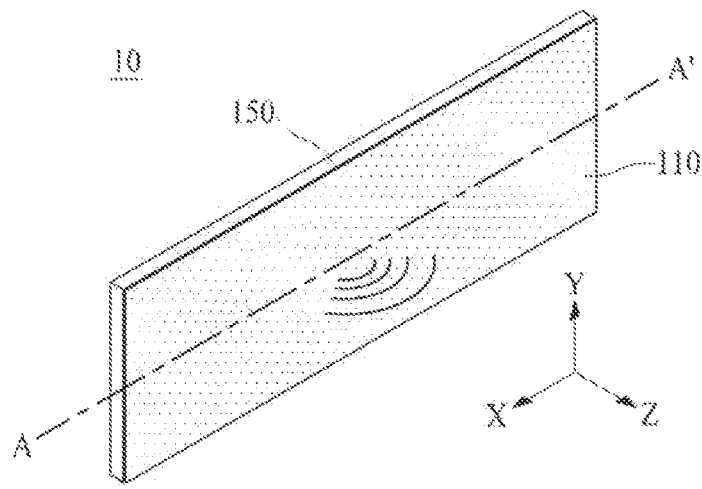
FIG. 1 is a perspective view illustrating a sound apparatus according to an embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Same reference numerals designate same elements throughout. Names of the respective elements used in the following explanations are selected only for convenience of writing the specification and can be thus different from those used in actual products.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part can be added unless "only" is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts can be disposed between the two parts unless a more limiting term, such as "just" or "direct(ly)" is used. In the description of embodiments, when a structure is described as being positioned "on or above" or "under or below" another structure, this description should be construed as including a case in which the structures contact each other as well as a case in which a third structure is disposed therebetween.

In describing a time relationship, for example, when the temporal order is described as, for example, "after," "subsequent," "next," and "before,", or the like a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element or layer is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. Also, for convenience of description, a scale, size and thickness of each of elements illustrated in the accompanying drawings differs from a real scale, and thus, embodiments of the present disclosure are not limited to a scale illustrated in the drawings.

Figure 2:
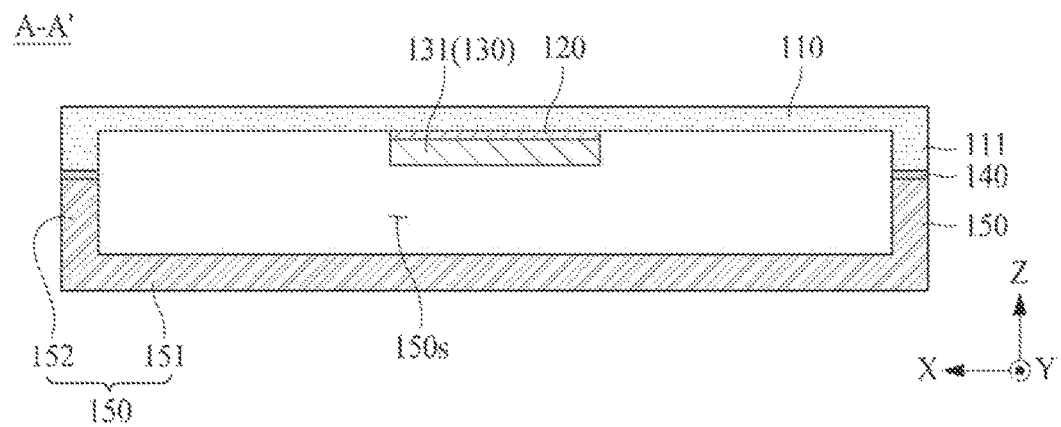
FIG. 2 is a cross-sectional view taken along line A-A' illustrated in FIG. 1 according to an embodiment of the present disclosure.

FIG. 1 is a perspective view illustrating a sound apparatus 10 according to an embodiment of the present disclosure. FIG. 2 is a cross-sectional view taken along line A-A' illustrated in FIG. 1.

Figure 3:
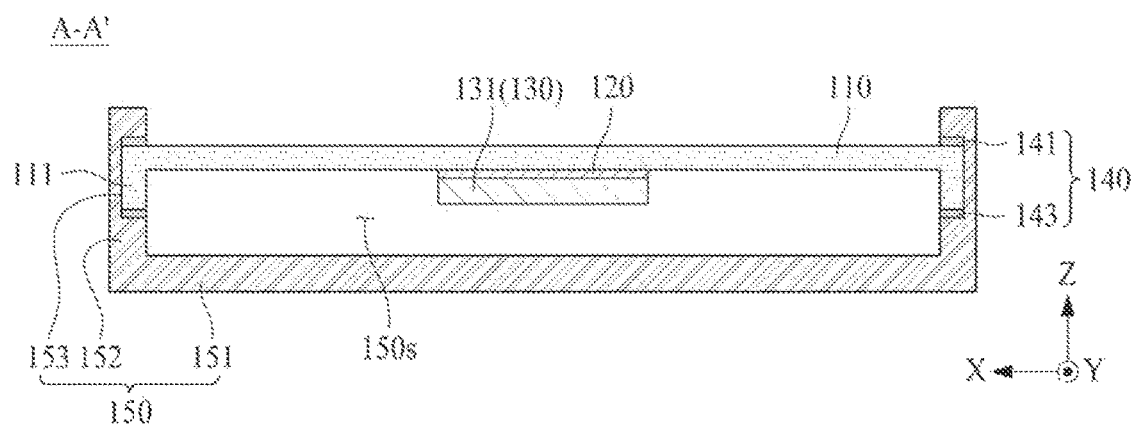
FIG. 3 is another cross-sectional view taken along line A-A' illustrated in FIG. 1 according to an embodiment of the present disclosure.

With reference to FIGS. 1 to 3, the sound apparatus 10 according to an embodiment of the present disclosure can include a vibration member 110 and a vibration apparatus 130.

The vibration member 110 can output a sound according to a vibration of the vibration apparatus 130. Accordingly, the vibration member 110 can be referred to as a vibration object, a vibration plate, a vibration panel, a sound plate, or a sound output member, or the like, but embodiments of the present disclosure are not limited thereto.

The vibration member 110 can be configured to be transparent, translucent, or opaque. The vibration member 110 according to an embodiment of the present disclosure can include a metal material or a nonmetal material (or a composite nonmetal material) having a material characteristic suitable for outputting a sound based on a vibration. The metal material of the vibration member 110 according to an embodiment of the present disclosure can include any one or more materials of stainless steel, aluminum (Al), an Al alloy, magnesium (Mg), a Mg alloy, and a magnesium-lithium (Mg—Li) alloy, but embodiments of the present disclosure are not limited thereto. The nonmetal material (or the composite nonmetal material) of the vibration member 110 can include one or more of glass, plastic, fiber, leather, wood, cloth, rubber, carbon, mirror, and paper, but embodiments of the present disclosure are not limited thereto.

The vibration member 110 according to an embodiment of the present disclosure can implement a signage panel such as an analog signage or the like, e.g., an advertising signboard, a poster, or a noticeboard, or the like. For example, in a situation where the vibration member 110 implements the signage panel, the analog signage can include signage content, such as a sentence, a picture, and a sign, or the like. The signage content can be disposed at the vibration member 110 to be visible. For example, the signage content can be directly attached on one or more of a first surface (or a front surface) of the vibration member 110 and a second surface (or a rear surface) different from (or opposite to) the first surface. For example, the signage content can be printed on a medium such as paper or the like, and the medium with the signage content printed thereon can be directly attached on one or more of the first surface and the second surface of the vibration member 110. For example, when the signage content is attached on the second surface of the vibration member 110, the vibration member 110 can be configured to be a transparent material.

The vibration member 110 according to another embodiment of the present disclosure can include one or more of a display panel including a pixel configured to display an image, a light emitting diode lighting panel, an organic light emitting lighting panel, and an inorganic light emitting lighting panel.

The vibration member 110 according to another embodiment of the present disclosure can include one or more of a display panel including a pixel configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

The vibration member 110 according to an embodiment of the present disclosure can include a plate structure having a tetragonal shape. The vibration member 110 can have a horizontal length (or a widthwise length) parallel to a first direction X and a vertical length (or a lengthwise length) parallel to a second direction Y intersecting with the first direction X. For example, the vibration member 110 can have a rectangular shape where a horizontal length is relatively longer than a vertical length. However, the present disclosure is not limited thereto, and the vibration member 110 can have a square shape where a horizontal length is the same as a vertical length, a triangular shape, a circular shape or an oval shape, etc. For example, due to the compact size of the vibration member 110, the vibration member 110 can fit in places where a coil speaker cannot fit.

The vibration member 110 according to an embodiment of the present disclosure can include a protrusion portion (or a vibration member protrusion portion) 111 which is formed to surround an edge of the vibration member 110 at a second surface of the vibration member 110. In FIG. 2, the protrusion portion 111 can denote an element which protrudes from the rear surface of the vibration member 110. For example, the protrusion portion 111 and the vibration member 110 can be provided as one body, but embodiments of the present disclosure are not limited thereto. For example, the protrusion portion 111 can be referred to as a protrusion portion 111.

The protrusion portion 111 can include the same material as that of the vibration member 110 and can be formed to protrude from the second surface of the vibration member 110.

The vibration member 110 according to an embodiment of the present disclosure can be configured to have a plurality of natural vibration frequencies (or a natural frequency). The vibration member 110 can include a non-planar structure, and thus, can have a plurality of natural vibration frequencies. The vibration member 110 can have a plurality of natural vibration frequencies which differ for each region (or area) of the vibration member 110. For example, the vibration member 110 can have a plurality of natural vibration frequencies which differ based on a thickness of each region (or area).

The vibration apparatus 130 can be configured to autonomously vibrate (or displace or drive) based on an electrical signal (or a voice signal) applied thereto, or can be configured to vibrate (or displace or drive) a vibration member (or a vibration plate or a vibration object) 110. For example, the vibration apparatus 130 can be referred to as a vibration structure, a vibrator, a vibration generating apparatus, a vibration generating device, a vibration generator, a sounder, a sound device, a sound generating device, or a sound generator, or the like, but embodiments of the present disclosure are not limited thereto.

The vibration apparatus 130 according to an embodiment of the present disclosure can include a piezoelectric material (or an electroactive material) having a piezoelectric characteristic. The vibration apparatus 130 can vibrate (or displace or drive) the vibration member 110 based on a vibration (or a displacement or driving) of a piezoelectric material generated by an electrical signal (or a voice signal) applied thereto. For example, the vibration apparatus 130 can vibrate (or displace or drive) as contraction and expansion are alternately repeated by a piezoelectric effect (or a piezoelectric characteristic). For example, the vibration apparatus 130 can vibrate (or displace or drive) in a vertical direction (or a thickness direction) Z as contraction and expansion are alternately repeated by an inverse piezoelectric effect.

The vibration apparatus 130 according to an embodiment of the present disclosure can include one or more vibration devices 131 having a piezoelectric type.

The one or more vibration devices 131 according to an embodiment of the present disclosure can be configured to have flexibility. For example, the one or more vibration devices 131 can be configured to be bent in a non-planar shape including a curved surface. For example, the one or more vibration devices 131 according to an embodiment of the present disclosure can be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible exciter, or a flexible transducer, or the like, but embodiments of the present disclosure are not limited thereto.

The one or more vibration devices 131 according to an embodiment of the present disclosure can include a tetragonal shape which has a first length parallel to a first direction X and a second length parallel to a second direction Y intersecting with the first direction X. For example, the one or more vibration devices 131 can include a square shape where the first length is the same as the second length. However, embodiments of the present disclosure are not limited thereto, and the one or more vibration devices 131 can include a rectangular shape where one of the first length and the second length is greater than the other length, a non-tetragonal shape, a triangular shape, a circular shape, or an oval shape.

The vibration apparatus 130 according to an embodiment of the present disclosure can be connected or coupled to a second surface of the vibration member 110 by an adhesive member 120.

The adhesive member 120 can be disposed between the vibration member 110 and the vibration apparatus 130. For example, the adhesive member 120 can be disposed between the vibration member 110 and one or more vibration devices 131. For example, the adhesive member 120 can connect or couple the one or more vibration devices 131 to the second surface of the vibration member 110.

The adhesive member 120 according to an embodiment of the present disclosure can include an adhesive layer (or a tacky layer or an adhesive film) which is good in adhesive force or attaching force. For example, the adhesive member 120 can include a double-sided adhesive tape, a double-sided foam pad, an adhesive film, or a tacky sheet. For example, when the adhesive member 120 includes a tacky sheet or adhesive film (or a tacky layer), the adhesive member 120 can include only an adhesive layer or a tacky layer without a base member such as a plastic material or the like.

The adhesive layer (or a tacky layer) of the adhesive member 120 according to an embodiment of the present disclosure can include epoxy, acrylic, silicone, or urethane, but embodiments of the present disclosure are not limited thereto.

The adhesive layer (or a tacky layer) of the adhesive member 120 according to another embodiment of the present disclosure can include a pressure sensitive adhesive (PSA), an optically clear adhesive (OCA), or an optically clear resin (OCR), but embodiments of the present disclosure are not limited thereto.

The sound apparatus 10 according to an embodiment of the present disclosure can further include a housing 150 and a connection member 140.

The housing 150 can be disposed at a rear surface of the vibration member 110 to cover the second surface of the vibration member 110 and the one or more vibration devices 131. The housing 150 can include an accommodation space 150s for accommodating the vibration apparatus 130 and can have a box shape where one side is opened. In addition, an opening of one side of the accommodation space 150s is covered by the vibration member 110, and a predetermined air gap can be formed between the accommodation space 150s and the vibration member 110. For example, the accommodation space 150s can act as a type of sound space or resonance chamber.

The housing 150 according to an embodiment of the present disclosure can include one or more of a metal material and a nonmetal material (or a composite nonmetal material), but embodiments of the present disclosure are not limited thereto. For example, the housing 150 can include one or more materials of a metal material, plastic, and wood, but embodiments of the present disclosure are not limited thereto. For example, the housing 150 can be referred to as various terms, such as a case, an outer case, a case member, a housing member, a cabinet, an enclosure, a sealing member, a sealing cap, a sealing box, or a sound box, or the like, but embodiments of the present disclosure are not limited thereto. For example, the accommodation space 150s of the housing 150 can be referred to as various terms, such as a gap space, an air gap, a vibration space, a sound space, a sound box, a resonance chamber, or a sealing space, but embodiments of the present disclosure are not limited thereto.

The housing 150 according to an embodiment of the present disclosure can maintain an impedance component based on air, which acts on the vibration member 110 when the vibration member 110 vibrates. For example, air near the vibration member 110 can resist a vibration of the vibration member 110 and can act as an impedance component having a reactance component and a different resistance based on a frequency. Therefore, the housing 150 can configure the closed space, which surrounds the vibration apparatus 130, and thus, can maintain an impedance component (or an air impedance or an acoustic impedance) which acts on the vibration member 110 due to air, thereby enhancing a sound characteristic and/or a sound pressure level characteristic of a low-pitched sound band generated based on the vibration of the vibration member 110 and enhancing the quality of a sound of a high-pitched sound band generated based on the vibration of the vibration member 110.

The housing 150 according to an embodiment of the present disclosure can include a bottom portion 151 and a lateral portion 152.

The bottom portion 151 can be disposed at the rear surface of the vibration member 110 to cover the second surface of the vibration member 110 and the vibration apparatus 130. For example, the bottom portion 151 can be disposed to be spaced apart from the second surface of the vibration member 110 and the vibration apparatus 130. For example, the bottom portion 151 can be referred to as various terms, such as a floor portion, a housing plate, a housing floor portion, or a housing bottom portion, or the like, but embodiments of the present disclosure are not limited thereto.

The lateral portion 152 can be connected to a periphery portion of the bottom portion 151. For example, the lateral portion 152 can be bent from the periphery portion of the bottom portion 151 along a third direction Z parallel to a thickness direction of the vibration member 110. For example, the lateral portion 152 can include first to fourth lateral portions. For example, the lateral portion 152 can be referred to as a housing lateral surface or a housing sidewall, or the like, but embodiments of the present disclosure are not limited thereto.

The lateral portion 152 can be integrated into the bottom portion 151. For example, the bottom portion 151 and the lateral portion 152 can be integrated as one body, and thus, the accommodation space 150s surrounded by the lateral portion 152 can be provided on the bottom portion 151. Accordingly, the bottom portion 151 and the lateral portion 152 can have a box shape where one side is opened or a tray shape.

The lateral portion 152 can be connected or coupled to the second surface of the vibration member 110 by the connection member 140. For example, the lateral portion 152 can be connected or coupled to a periphery portion of the second surface of the vibration member 110 by the connection member 140.

According to an embodiment of the present disclosure, when the housing 150 includes the lateral portion 152, the connection member 140 can be disposed between the lateral portion 152 of the housing 150 and the protrusion portion 111 of the vibration member 110. For example, the connection member 140 can connect or couple one end of the lateral portion 152 of the housing 150 and one end of the protrusion portion 111.

According to an embodiment of the present disclosure, the connection member 140 which is disposed between the housing 150 and the vibration member 110 can be configured to minimize or prevent the transfer of a vibration of the vibration member 110 to the housing 150 (e.g., made of a shock absorbing material). The connection member 140 can include a material characteristic suitable for blocking a vibration. For example, the connection member 140 can include a material having elasticity. For example, the connection member 140 can include a material having elasticity for vibration absorption (or impact absorption). The connection member 140 according to an embodiment of the present disclosure can be configured as polyurethane materials or polyolefin materials, but embodiments of the present disclosure are not limited thereto. For example, the connection member 140 according to an embodiment of the present disclosure can include one or more of a double-sided polyurethane tape, a double-sided polyurethane foam tape, or a double-sided sponge tape.

The connection member 140 according to an embodiment of the present disclosure can have a thickness for minimizing or preventing the transfer of a vibration of the vibration member 110 to the housing 150. The connection member 140 can absorb a vibration of the vibration member 110 based on a thickness and elasticity, thereby minimizing or preventing the transfer of a vibration of the vibration member 110 to the housing 150. In addition, the connection member 140 can prevent a physical contact (or friction) between the vibration member 110 and the housing 150, and thus, can prevent the occurrence of noise (or a noise sound) caused by the physical contact (or friction) between the vibration member 110 and the housing 150. For example, the connection member 140 can be referred to as a buffer member, an elastic member, a damping member, a vibration absorption member, or a vibration blocking member, or the like, but embodiments of the present disclosure are not limited thereto.

The one or more vibration devices 131 according to an embodiment of the present disclosure can vibrate based on a vibration driving signal (or a sound signal or a voice signal) provided from a sound processing circuit to vibrate the vibration member 110, thereby generating or outputting a sound. In a sound generated based on a vibration of the vibration member 110, a sound pressure level characteristic can increase based on a vibration, having various natural vibration frequencies, of the vibration member 110, and a reproduction-pitched sound band can be extended.

Because the vibration member 110 of the sound apparatus 10 according to an embodiment of the present disclosure further includes the protrusion portion 111, a sound output characteristic of the sound apparatus 10 can be improved, and in detail, a dip phenomenon can be reduced and a sound characteristic can be enhanced. Dip can be a phenomenon where the occurrence of a specific frequency is prevented or attenuated and a low sound pressure level is generated. A sound output characteristic of the sound apparatus 10 can be reduced by the dip phenomenon.

FIG. 3 is another cross-sectional view taken along line A-A' illustrated in FIG. 1. FIG. 3 illustrates a sound apparatus according to another embodiment of the present disclosure and illustrates an embodiment implemented by modifying a structure of the housing of FIG. 2. Therefore, in the following description, their repetitive descriptions of the other elements except the vibration member and the housing and relevant elements may be omitted.

With reference to FIG. 3, a housing 150 can further include a second groove portion 153 which is formed inward from a lateral portion 152, and the second groove portion 153 of the housing 150 can accommodate and fix a protrusion portion 111 of a vibration member 110. In addition, according to an embodiment of the present disclosure, a connection member 140 can include a first connection member 141 between a first surface of the vibration member 110 and the groove portion 153 of the housing 150, and a second connection member 143 between the protrusion portion 111 and the second groove portion 153 of the housing 150. According to an embodiment of the present disclosure, the first and second connection members 141 and 143 can include the same material as that of the connection member 140. For example, a second groove portion 153 can be a groove portion or a first groove portion, but embodiments of the present disclosure are not limited thereto. For example, the vibration member 110 can float or be isolated within second groove portion 153 by attaching first and second connection members 141 and 143 above and below the protrusion portion 111, which can securely fix the vibration member 110 while also reducing vibrations and absorbing shocks or impacts (e.g., the protrusion portion 111 of vibration member 110 can be cushioned within the second groove portion 153 by the first and second connection members 141 and 143).

According to an embodiment of the present disclosure, the vibration member 110 can be fixed by the second groove portion 153 or can be inserted into the second groove portion 153. For example, because both ends of the vibration member 110 are fixed by the second groove portion 153, a reflected wave can be offset at the both ends of the vibration member 110, and thus, the peak or dip phenomenon of a sound characteristic caused by a standing wave can be reduced and a sound characteristic of a low-pitched sound band can be enhanced. The peak can be a phenomenon where a sound pressure level bounces in a specific frequency, and the dip can be phenomenon where a low pressure level occurs because the occurrence of a specific frequency is prevented. A sound output characteristic of the sound apparatus can be reduced by the peak or dip phenomenon. In detail, in the sound apparatus according to another embodiment of the present disclosure, a sound characteristic of the low-pitched sound band can be enhanced, and a dip phenomenon of a middle-pitched sound band and a dip phenomenon of a high-pitched sound band can be reduced. For example, the low pitched sound can be a frequency range of 500 Hz or less, the middle-pitched sound band can be a frequency range of 500 Hz to 2,000 Hz, and the high-pitched sound band can be a frequency range of 2,000 Hz to 20,000 Hz. However, the frequency ranges of the middle-pitched sound band and a middle-high-pitched sound band according an embodiment of the present disclosure are not limited thereto.

Figure 4:
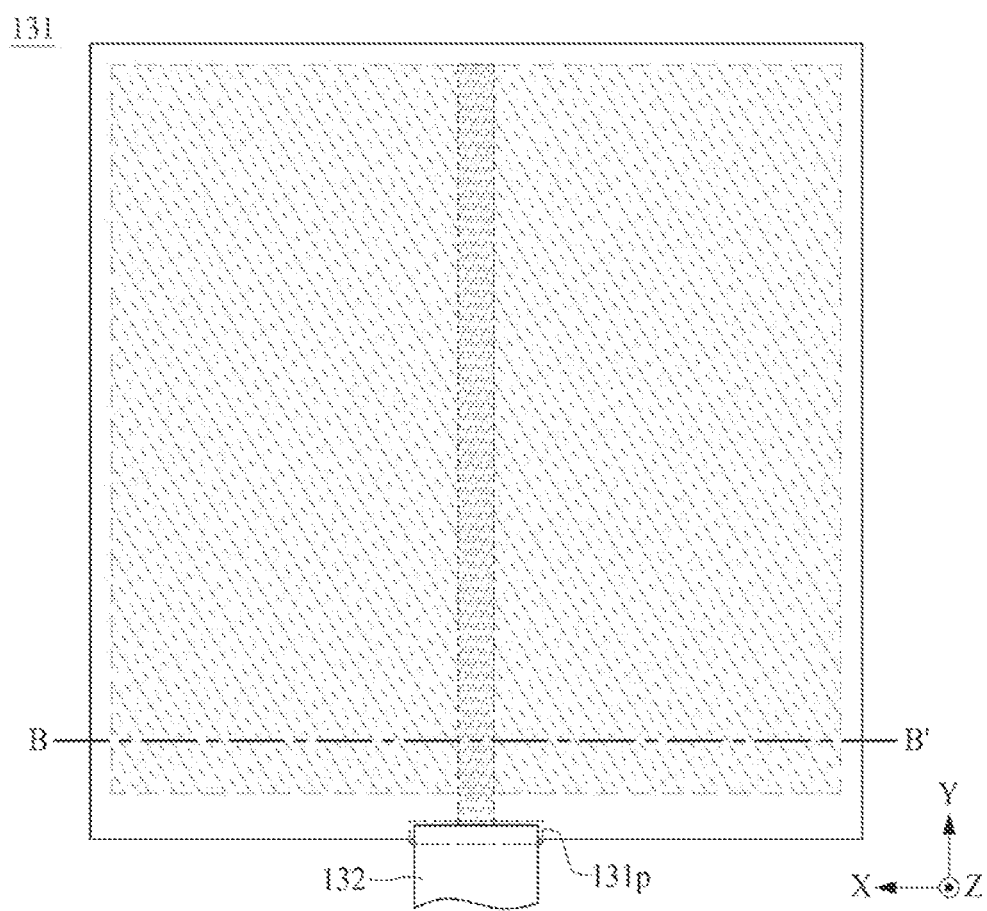
FIG. 4 illustrates a vibration device according to an embodiment of the present disclosure.
Figure 5:
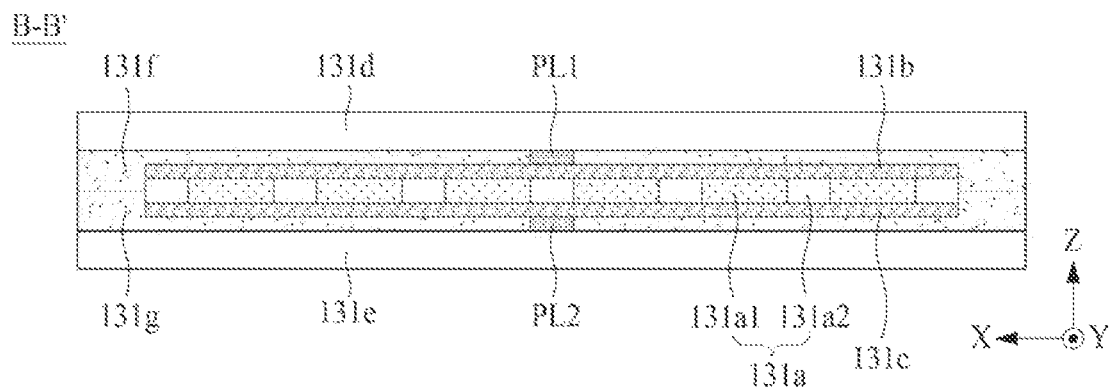
FIG. 5 is a cross-sectional view taken along line B-B' illustrated in FIG. 4 according to an embodiment of the present disclosure.
Figure 6:
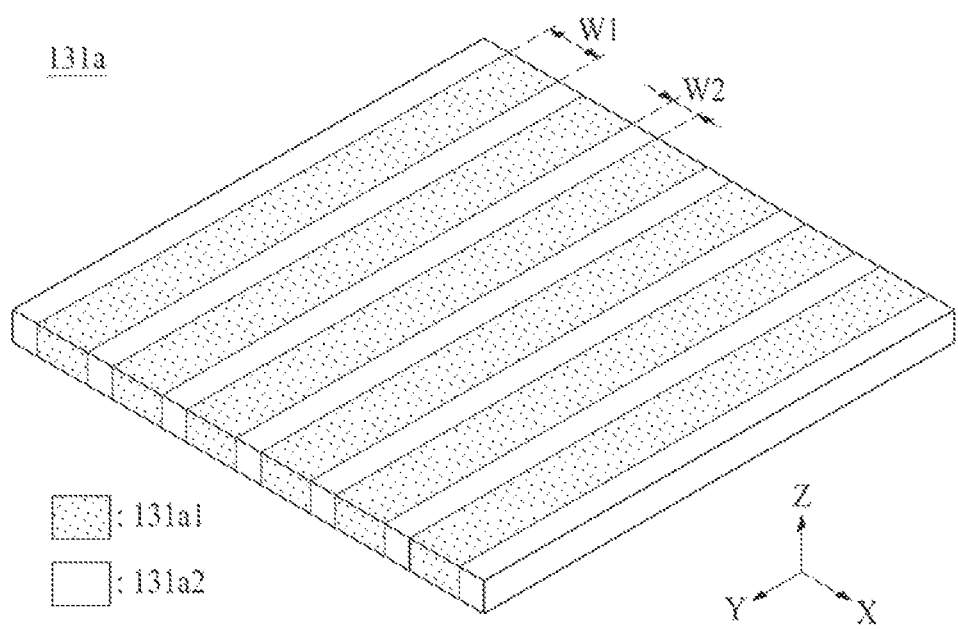
FIG. 6 is a perspective view illustrating a piezoelectric vibration portion illustrated in FIG. 5 according to an embodiment of the present disclosure.

FIG. 4 illustrates a vibration device according to an embodiment of the present disclosure, FIG. 5 is a cross-sectional view taken along line B-B' illustrated in FIG. 4, and FIG. 6 is a perspective view illustrating a piezoelectric vibration portion illustrated in FIG. 5. FIGS. 4 to 6 illustrate another embodiment of the vibration device illustrated in one or more of FIGS. 1 to 3.

With reference to FIGS. 4 to 6, a vibration device 131 according to an embodiment of the present disclosure can be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, or the like, but embodiments of the present disclosure are not limited thereto.

The vibration device 131 according to an embodiment of the present disclosure can include a vibration generating portion which has a piezoelectric vibration portion 131a, a first electrode portion 131b, and a second electrode portion 131c.

The piezoelectric vibration portion 131a can include a piezoelectric material (or an electroactive material) which includes a piezoelectric effect. For example, the piezoelectric material can have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. The piezoelectric vibration portion 131a can be referred to as a vibration layer, a piezoelectric layer, a piezoelectric material layer, an electroactive layer, a vibration portion, a piezoelectric material portion, an electroactive portion, a piezoelectric structure, a piezoelectric composite layer, a piezoelectric composite, or a piezoelectric ceramic composite, or the like, but embodiments of the present disclosure are not limited thereto. The piezoelectric vibration portion 131a can be formed of a transparent, semitransparent, or opaque piezoelectric material (or an electroactive material) and can be transparent, semitransparent, or opaque.

The piezoelectric vibration portion 131a according to an embodiment of the present disclosure can include a plurality of first portions 131a1 and a plurality of second portions 131a2. For example, the plurality of first portions 131a1 and the plurality of second portions 131a2 can be alternately and repeatedly arranged along a first direction X (or a second direction Y). For example, the first direction X can be a widthwise direction of the piezoelectric vibration portion 131a, the second direction Y can be a lengthwise direction of the piezoelectric vibration portion 131a, but embodiments of the present disclosure are not limited thereto. For example, the first direction X can be the lengthwise direction of the piezoelectric vibration portion 131a, and the second direction Y can be the widthwise direction of the piezoelectric vibration portion 131a.

Each of the plurality of first portions 131a1 can be configured as an inorganic material portion. The inorganic material portion can include a piezoelectric material, a composite piezoelectric material, or an electroactive material which includes a piezoelectric effect.

Each of the plurality of first portions 131a1 can be configured as a ceramic-based material for generating a relatively high vibration, or can be configured as a piezoelectric ceramic having a perovskite-based crystalline structure. The perovskite crystalline structure can have a piezoelectric effect and an inverse piezoelectric effect, and can be a plate-shaped structure having orientation. The perovskite crystalline structure can be represented by a chemical formula "$ABO_3$". In the chemical formula, "A" can include a divalent metal element, and "B" can include a tetravalent metal element. For example, in the chemical formula "$ABO_3$", "A", and "B" can be cations, and "0" can be anions. For example, each of the plurality of first portions 131a1 can include at least one or more among lead (II) titanate (PbTiO$_3$), lead zirconate (PbZrO$_3$), lead zirconate titanate (PbZrTiO$_3$), barium titanate (BaTiO$_3$), and strontium titanate (SrTiO$_3$), but embodiments of the present disclosure are not limited thereto.

The first portions 131a1 of the piezoelectric vibration portion 131a according to an embodiment of the present disclosure can include a lead zirconate titanate (PZT)-based material, including lead (Pb), zirconium (Zr), and titanium (Ti); or can include a lead zirconate nickel niobate (PZNN)-based material, including lead (Pb), zirconium (Zr), nickel (Ni), and niobium (Nb), but embodiments of the present disclosure are not limited thereto. In addition, the first portions 131a1 of the piezoelectric vibration portion 131a can include at least one or more of calcium titanate (CaTiO$_3$), BaTiO$_3$, and SrTiO$_3$, each without lead (Pb), but embodiments of the present disclosure are not limited thereto.

Each of the plurality of first portions 131a1 according to an embodiment of the present disclosure can be disposed between the plurality of second portions 131a2 and can have a first width W1 parallel to the first direction X (or the second direction Y) and a length parallel to the second direction Y (or the first direction X). Each of the plurality of second portions 131a2 can have a second width W2 parallel to the first direction X (or the second direction Y) and can have a length parallel to the second direction Y (or the first direction X). The first width W1 can be the same as or different from the second width W2. For example, the first width W1 can be greater than the second width W2. For example, the first portion 131a1 and the second portion 131a2 can include a line shape or a stripe shape which has the same size or different sizes. Therefore, the piezoelectric vibration portion 131a can include a 2-2 composite structure having a piezoelectric characteristic of a 2-2 vibration mode, and thus, can have a resonance frequency of 20 kHz or less, but embodiments of the present disclosure are not limited thereto. For example, a resonance frequency of the piezoelectric vibration portion 131a can vary based on at least one or more of a shape, a length, and a thickness, or the like.

In the piezoelectric vibration portion 131a, each of the plurality of first portions 131a1 and the plurality of second portions 131a2 can be disposed (or arranged) at the same plane (or the same layer) in parallel. Each of the plurality of second portions 131a2 can be configured to fill a gap between two adjacent first portions of the plurality of first portions 131a1 and can be connected or adhered to a second portion 131a2 adjacent thereto. Therefore, the piezoelectric vibration portion 131a can extend by a desired size or length based on the side coupling (or connection) of the first portion 131a1 and the second portion 131a2.

In the piezoelectric vibration portion 131a, a width (or a size) W2 of each of the plurality of second portions 131a2 can progressively decrease in a direction from a center portion to both peripheries (or both ends) of the piezoelectric vibration portion 131a or the vibration device 131. For example, the widths of the plurality of second portions 131a2 can be larger in the center area and smaller at the outer edges.

According to an embodiment of the present disclosure, a second portion 131a2, having a largest width W2 among the plurality of second portions 131a2, can be located at a portion at which a highest stress can concentrate when the piezoelectric vibration portion 131a or the vibration device 131 is vibrating in a vertical direction Z (or a thickness direction). A second portion 131a2, having a smallest width W2 among the plurality of second portions 131a2, can be located at a portion where a relatively low stress can occur when the piezoelectric vibration portion 131a or the vibration device 131 is vibrating in the vertical direction Z. For example, the second portion 131a2, having the largest width W2 among the plurality of second portions 131a2, can be disposed at the center portion of the piezoelectric vibration portion 131a, and the second portion 131a2, having the smallest width W2 among the plurality of second portions 131a2 can be disposed at each of the both peripheries of the piezoelectric vibration portion 131a. Therefore, when the piezoelectric vibration portion 131a or the vibration device 131 is vibrating in the vertical direction Z, interference of a sound wave or overlapping of a resonance frequency, each occurring in the portion on which the highest stress concentrates, can be reduced or minimized. Thus, the dipping phenomenon or the attenuation of a sound pressure level occurring in the low-pitched sound band can be reduced, thereby improving flatness of a sound characteristic in the low-pitched sound band.

In the piezoelectric vibration portion 131a, each of the plurality of first portions 131a1 can have different sizes (or widths). For example, a size (or a width) of each of the plurality of first portions 131a1 can progressively decrease or increase in a direction from the center portion to the both peripheries (or both ends) of the piezoelectric vibration portion 131a or the vibration device 131. Accordingly, in the piezoelectric vibration portion 131a, a sound pressure level characteristic of a sound can be enhanced and a sound reproduction band can increase, based on various natural vibration frequencies according to a vibration of each of the plurality of first portions 131a1 having different sizes.

The plurality of second portions 131a2 can be disposed between the plurality of first portions 131a1. Therefore, in the piezoelectric vibration portion 131a or the vibration device 131, vibration energy by a link in a unit lattice of each first portion 131a1 can increase by a corresponding second portion 131a2, and thus, a vibration characteristic can increase, and a piezoelectric characteristic and flexibility can be secured. For example, the second portion 131a2 can include one or more of an epoxy-based polymer, an acrylic-based polymer, and a silicone-based polymer, but embodiments of the present disclosure are not limited thereto.

The plurality of second portions 131a2 according to an embodiment of the present disclosure can be configured as an organic material portion. For example, the organic material portion can be disposed between the inorganic material portions, and thus, can absorb an impact applied to the inorganic material portion (or the first portion), can release a stress concentrating on the inorganic material portion to enhance the total durability of the piezoelectric vibration portion 131a or the vibration device 131, and can provide flexibility to the piezoelectric vibration portion 131a or the vibration device 131.

The plurality of second portions 131a2 according to an embodiment of the present disclosure can have a modulus (or Young's modulus) and viscoelasticity that are lower than those of each first portion 131a1, and thus, the second portion 131a2 can enhance the reliability of each first portion 131a1 vulnerable to an impact due to a fragile characteristic. For example, the second portion 131a2 can be configured as a material having a loss coefficient of about 0.01 to about 1 (e.g., 0.5) and modulus of about 0.1 GPa (Giga pascal) to about 10 GPa (Giga pascal) (e.g., 5 GPa).

The organic material portion configured at the second portion 131a2 can include one or more of an organic material, an organic polymer, an organic piezoelectric material, or an organic non-piezoelectric material that has a flexible characteristic in comparison with the inorganic material portion of the first portions 131a1. For example, the second portion 131a2 can be referred to as an adhesive portion, an elastic portion, a bending portion, a damping portion, or a flexible portion each having flexibility, but embodiments of the present disclosure are not limited thereto.

The plurality of first portions 131a1 and the second portion 131a2 can be disposed on (or connected to) the same plane, and thus, the piezoelectric vibration portion 131a according to an embodiment of the present disclosure can have a single thin film-type. For example, the piezoelectric vibration portion 131a can have a structure in which a plurality of first portions 131a1 are connected to one side. For example, the plurality of first portions 131a1 can have a structure connected to a whole the piezoelectric vibration portion 131a. For example, the piezoelectric vibration portion 131a can be vibrated in a vertical direction by the first portion 131a1 having a vibration characteristic and can be bent in a curved shape by the second portion 131a2 having flexibility. In addition, in the piezoelectric vibration portion 131a according to an embodiment of the present disclosure, a size of the first portion 131a1 and a size of the second portion 131a2 can be adjusted based on a piezoelectric characteristic and flexibility needed for the piezoelectric vibration portion 131a or the vibration device 131. As an embodiment of the present disclosure, when the piezoelectric vibration portion 131a needs a piezoelectric characteristic rather than flexibility, a size of the first portion 131a1 can be adjusted to be greater than that of the second portion 131a2. As another embodiment of the present disclosure, when the piezoelectric vibration portion 131a needs flexibility rather than a piezoelectric characteristic, a size of the second portion 131a2 can be adjusted to be greater than a size of the first portion 131a1. Accordingly, a size of the piezoelectric vibration portion 131a can be adjusted based on a characteristic needed therefor, and thus, the piezoelectric vibration portion 131a can be easy to design or modifiable.

The first electrode portion 131b can be disposed at a first surface (or an upper surface) of the piezoelectric vibration portion 131a. The first electrode portion 131b can be disposed at or coupled to a first surface of each of a plurality of first portions 131a1 and a first surface of each of a plurality of second portions 131a2 in common and can be electrically connected to the first surface of each of the plurality of first portions 131a1. For example, the first electrode portion 131b can be a single-body electrode (or a common electrode) shape which is disposed at a whole first surface of the piezoelectric vibration portion 131a. For example, the first electrode portion 131b can have substantially the same shape as that of the piezoelectric vibration portion 131a, but embodiments of the present disclosure are not limited thereto.

The first electrode portion 131b according to an embodiment of the present disclosure can be formed of a transparent conductive material, a semitransparent conductive material, or an opaque conductive material. For example, the transparent conductive material or the semitransparent conductive material can include indium tin oxide (ITO) or indium zinc oxide (IZO), but embodiments of the present disclosure are not limited thereto. The opaque conductive material can include aluminum (Al), copper (Cu), gold (Au), silver (Ag), molybdenum (Mo), Mg, or the like, or an alloy thereof, but embodiments of the present disclosure are not limited thereto.

The second electrode portion 131c can be disposed at a second surface (or a rear surface) different from (or opposite to) the first surface of the piezoelectric vibration portion 131a. The second electrode portion 131c can be disposed at or coupled to a second surface of each of a plurality of first portions 131a1 and the second surface of each of a plurality of second portions 131a2 in common and can be electrically connected to a second surface of each of the plurality of first portions 131a1. For example, the second electrode portion 131c can be a single-body electrode (or a common electrode) shape which is disposed at a whole second surface of the piezoelectric vibration portion 131a. The second electrode portion 131c can have the same shape as the piezoelectric vibration portion 131a, but embodiments of the present disclosure are not limited thereto. The second electrode portion 131c according to an embodiment of the present disclosure can be formed of a transparent conductive material, a semitransparent conductive material, or an opaque conductive material. For example, the second electrode portion 131c can be formed of the same material as the first electrode portion 131b, but embodiments of the present disclosure are not limited thereto. As another embodiment of the present disclosure, the second electrode portion 131c can be formed of a different material than the first electrode portion 131b.

The piezoelectric vibration portion 131a can be polarized by a certain voltage applied to the first electrode portion 131b and the second electrode portion 131c in a certain temperature atmosphere, or a temperature atmosphere that can be changed from a high temperature to a room temperature, but embodiments of the present disclosure are not limited thereto. For example, the piezoelectric vibration portion 131a can alternately and repeatedly contract and expand based on an inverse piezoelectric effect according to a sound signal (or a voice signal) applied to the first electrode portion 131b and the second electrode portion 131c from the outside to vibrate. For example, the piezoelectric vibration portion 131a can vibrate based on a vertical-direction vibration and a planar direction vibration by the first electrode portion 131b and the second electrode portion 131c. The piezoelectric vibration portion 131a can increase the displacement of a vibration member (or a vibration plate or a vibration object) by contraction and expansion of the planar direction, thereby further improving the vibration.

The vibration device 131 according to an embodiment of the present disclosure can further include a first cover member 131d and a second cover member 131e.

The first cover member 131d can be disposed at the first surface of the vibration device 131. For example, the first cover member 131d can be configured to cover the first electrode portion 131b. Accordingly, the first cover member 131d can protect the first electrode portion 131b.

The second cover member 131e can be disposed at the second surface of the vibration device 131. For example, the second cover member 131e can be configured to cover the second electrode portion 131c. Accordingly, the second cover member 131e can protect the second electrode portion 131c.

The first cover member 131d and the second cover member 131e according to an embodiment of the present disclosure can each include one or more material of a plastic, a fiber, and wood, but embodiments of the present disclosure are not limited thereto. For example, each of the first cover member 131d and the second cover member 131e can include the same or different material. For example, each of the first cover member 131d and the second cover member 131e can be a polyimide (PI) film or a polyethylene terephthalate (PET) film, but embodiments of the present disclosure are not limited thereto.

The first cover member 131d according to an embodiment of the present disclosure can be connected or coupled to the first electrode portion 131b by a first adhesive layer 131f. For example, the first cover member 131d can be connected or coupled to the first electrode portion 131b by a film laminating process using the first adhesive layer 131f.

The second cover member 131e according to an embodiment of the present disclosure can be connected or coupled to the second electrode portion 131c by a second adhesive layer 131g. For example, the second cover member 131e can be connected or coupled to the second electrode portion 131c by a film laminating process using the second adhesive layer 131g.

The first adhesive layer 131f can be disposed between the first electrode portion 131b and the first cover member 131d. The second adhesive layer 131g can be disposed between the second electrode portion 131c and the second cover member 131e. For example, the first adhesive layer 131f and second adhesive layer 131g can be configured between the first cover member 131d and the second cover member 131e to completely surround the piezoelectric vibration portion 131a, the first electrode portion 131b, and the second electrode portion 131c. For example, the piezoelectric vibration portion 131a, the first electrode portion 131b, and the second electrode portion 131c can be embedded or built-in between the first adhesive layer 131f and the second adhesive layer 131g.

Each of the first adhesive layer 131f and second adhesive layer 131g according to an embodiment of the present disclosure can include an electric insulating material which has adhesiveness and is capable of compression and decompression. For example, each of the first adhesive layer 131f and the second adhesive layer 131g can include an epoxy resin, an acrylic resin, a silicone resin, or a urethane resin, but embodiments of the present disclosure are not limited thereto.

According to an embodiment of the present disclosure, any one of the first cover member 131d and the second cover member 131e can be attached to or coupled to the vibration member (or the vibration plate or the vibration object) by an adhesive member. For example, any one of the first cover member 131d and the second cover member 131e can be attached on or coupled to the vibration member 110 by the adhesive member 120 as described above with reference to FIGS. 1 to 3.

The vibration device 131 according to an embodiment of the present disclosure can further include a first power supply line PL1 disposed at the first cover member 131d, a second power supply line PL2 disposed at the second cover member 131e, and a pad part 131p electrically connected to the first power supply line PL1 and the second power supply line PL2.

The first power supply line PL1 can be disposed between the first electrode portion 131b and the first cover member 131d and can be electrically connected to the first electrode portion 131b. The first power supply line PL1 can be extended long along the second direction Y and can be electrically connected to a central portion of the first electrode portion 131b. As an embodiment of the present disclosure, the first power supply line PL1 can be electrically connected to the first electrode portion 131b by an anisotropic conductive film. As another embodiment of the present disclosure, the first power supply line PL1 can be electrically connected to the first electrode portion 131b through a conductive material (or conductive particles) included in the first adhesive layer 131f.

The second power supply line PL2 can be disposed between the second electrode portion 131c and the second cover member 131e and can be electrically connected to the second electrode portion 131c. The second power supply line PL2 can be extended long along the second direction Y and can be electrically connected to a central portion of the second electrode portion 131c. As an embodiment of the present disclosure, the second power supply line PL2 can be electrically connected to the second electrode portion 131c by an anisotropic conductive film. As another embodiment of the present disclosure, the second power supply line PL2 can be electrically connected to the second electrode portion 131c through a conductive material (or particle) included in the second adhesive layer 131g.

The pad part 131p can be configured at one periphery portion of any one of the first cover member 131d and the second cover member 131e to be electrically connected to one portion (or one end) of each of the first power supply line PL1 and the second power supply line PL2.

The pad part 131p according to an embodiment of the present disclosure can include a first pad electrode electrically connected to one end of the first power supply line PL1, and a second pad electrode electrically connected to one end of the second power supply line PL2.

The first pad electrode can be disposed at one periphery portion of any one of the first cover member 131d and the second cover member 131e to be electrically connected to one portion of the first power supply line PL1. For example, the first pad electrode can pass through any one of the first cover member 131d and the second cover member 131e to be electrically connected to one portion of the first power supply line PL1.

The second pad electrode can be disposed in parallel with the first pad electrode to be electrically connected to one portion of the second power supply line PL2. For example, the second pad electrode can pass through any one of the first cover member 131d and the second cover member 131e to be electrically connected to one portion of the second power supply line PL2.

According to an embodiment of the present disclosure, each of the first power supply line PL1, the second power supply line PL2, and the pad part 131p can be configured to be transparent, translucent, or opaque.

The pad part 131p according to another embodiment of the present disclosure can be electrically connected to a signal cable 132.

The signal cable 132 can be electrically connected to the pad part 131p disposed at the vibration device 131 and can supply the vibration device 131 with vibration driving signals (or a sound signal or a voice signal) provided from a sound processing circuit. The signal cable 132 according to an embodiment of the present disclosure can include a first terminal electrically connected to the first pad electrode of the pad part 131p and a second terminal electrically connected to the second pad electrode of the pad part 131p. For example, the signal cable 132 can be configured as a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The sound processing circuit can generate an alternating current (AC) vibration driving signal including a first vibration driving signal and a second vibration driving signal based on a sound data provided from an external sound data generating circuit part. The first vibration driving signal can be any one of a positive (+) vibration driving signal and a negative (−) vibration driving signal, and the second vibration driving signal can be any one of a positive (+) vibration driving signal and a negative (−) vibration driving signal. For example, the first vibration driving signal can be supplied to the first electrode portion 131b through a first terminal of the signal cable 132, the first pad electrode of the pad part 131p, and the first power supply line PL1. The second vibration driving signal can be supplied to the second electrode portion 131c through a second terminal of the signal cable 132, the second pad electrode of the pad part 131p, and the second power supply line PL2.

According to an embodiment of the present disclosure, the signal cable 132 can be configured to be transparent, semitransparent, or opaque.

As described above, the vibration device 131 according to an embodiment of the present disclosure can be implemented as a thin film type where the first portion 131a1 having a piezoelectric characteristic and a second portion 131a2 having flexibility are alternately repeated and connected, and thus, can be bent in a shape corresponding to a shape of the vibration member or the vibration object. For example, when the vibration device 131 is connected or coupled to the vibration member including various curved portions by an adhesive member 120, the vibration device 131 can be bent in a curved shape along a shape of a curved portion of the vibration member and reliability against damage or breakdown may not be reduced despite being bent in a curved shape.

FIGS. 7A to 7D are perspective views illustrating different types of piezoelectric vibration portions, in the vibration device according to other embodiments of the present disclosure.

Figure 7A:
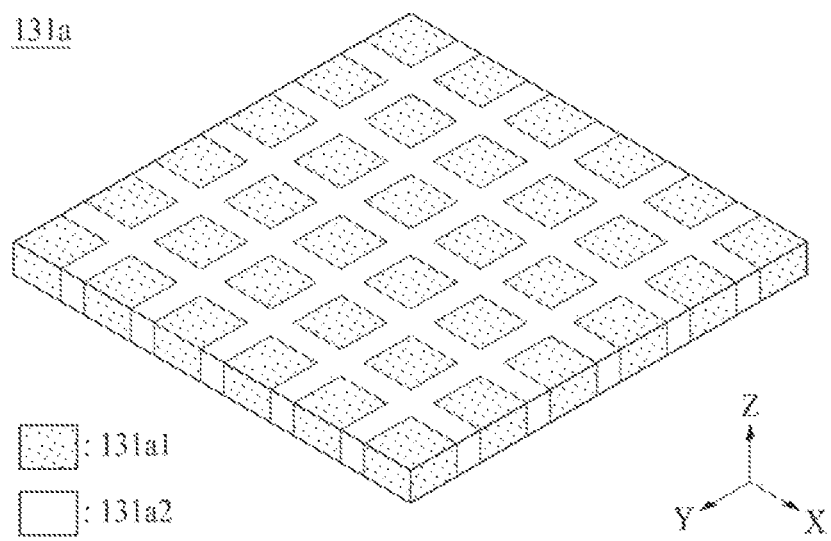
FIGS. 7A to 7D are perspective views illustrating a piezoelectric vibration portion in the vibration device according to embodiments of the present disclosure.

With reference to FIG. 7A, the piezoelectric vibration portion 131a according to another embodiment of the present disclosure can include a plurality of first portions 131a1, which are spaced apart from one another along a first direction X and a second direction Y, and a second portion 131a2 (or one or more second portions) disposed between the plurality of first portions 131a1.

Each of the plurality of first portions 131a1 can be disposed to be spaced apart from one another along the first direction X and the second direction Y. For example, each of the plurality of first portions 131a1 can have a hexahedral shape (or a six-sided object shape) having the same size and can be disposed in a lattice shape or a grid shape. Each of the plurality of first portions 131a1 can include a piezoelectric material which is be substantially the same as the first portion 131a1 described above with reference to FIGS. 4 to 6, and thus, like reference numerals can refer to like elements, and their repetitive descriptions may be omitted.

The second portion 131a2 can be disposed between the plurality of first portions 131a1 along each of the first direction X and the second direction Y. The second portion 131a2 can be configured to fill a gap or a space between two adjacent first portions 131a1 or to surround each of the plurality of first portions 131a1, and thus, can be connected or adhered to an adjacent first portion 131a1. According to an embodiment of the present disclosure, a width of a second portion 131a2 disposed between two first portions 131a1 adjacent to each other along the first direction X can be the same as or different from that of a width of the first portion 131a1, and the width of a second portion 131a2 disposed between two first portions 131a1 adjacent to each other along the second direction Y can be the same as or different from that of the width of the first portion 131a1. The second portion 131a2 can include an organic material which is be substantially the same as the second portion 131a2 described above with reference to FIGS. 4 to 6, and thus, like reference numerals can refer to like elements, and their repetitive descriptions may be omitted.

As described above, the piezoelectric vibration portion 131a according to another embodiment of the present disclosure can include a 1-3 composite structure having a piezoelectric characteristic of a 1-3 vibration mode, and thus, can have a resonance frequency of 30 MHz or less, but embodiments of the present disclosure are not limited thereto. For example, a resonance frequency of the piezoelectric vibration portion 131a can vary based on at least one or more of a shape, a length, and a thickness, or the like.

Figure 7B:
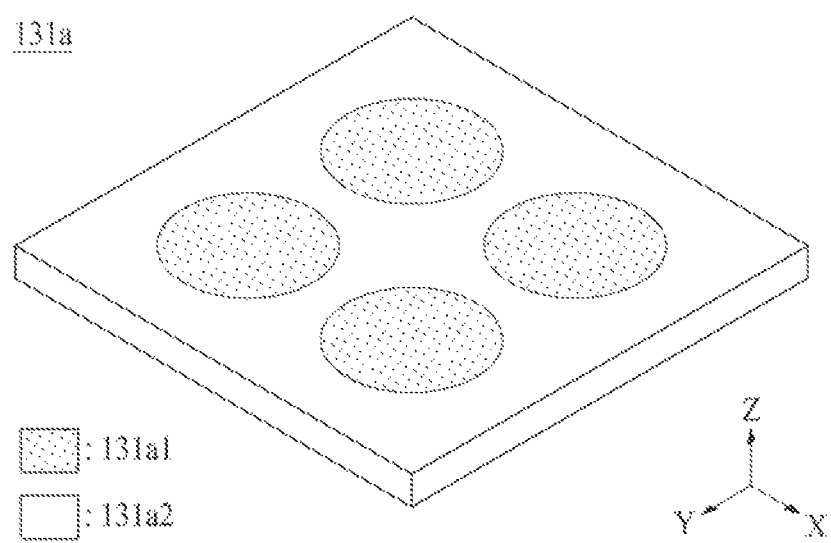

With reference to FIG. 7B, the piezoelectric vibration portion 131a according to another embodiment of the present disclosure can include a plurality of first portions 131a1, which are spaced apart from one another along a first direction X and a second direction Y, and a second portion 131a2 (or one or more second portions) disposed between the plurality of first portions 131a1.

Each of the plurality of first portions 131a1 can have a flat structure of a circular shape. For example, each of the plurality of first portions 131a1 can have a circular plate shape, but embodiments of the present disclosure are not limited thereto. For example, each of the plurality of first portions 131a1 can have a dot shape including an oval shape, a polygonal shape, or a donut shape. Each of the plurality of first portions 131a1 can include a piezoelectric material which is be substantially the same as the first portion 131a1 described above with reference to FIGS. 4 to 6, and thus, like reference numerals can refer to like elements, and their repetitive descriptions may be omitted.

The second portion 131a2 can be disposed between the plurality of first portions 131a1 along each of the first direction X and the second direction Y. The second portion 131a2 can be configured to surround each of the plurality of first portions 131a1, and thus, can be connected or adhered to a side surface of each of the plurality of first portions 131a1. Each of the plurality of first portions 131a1 and the second portion 131a2 can be disposed (or arranged) in parallel on the same plane (or the same layer). The second portion 131a2 can include an organic material which is be substantially the same as the second portion 131a2 described above with reference to FIGS. 4 to 6, and thus, like reference numerals can refer to like elements, and their repetitive descriptions may be omitted.

Figure 7C:
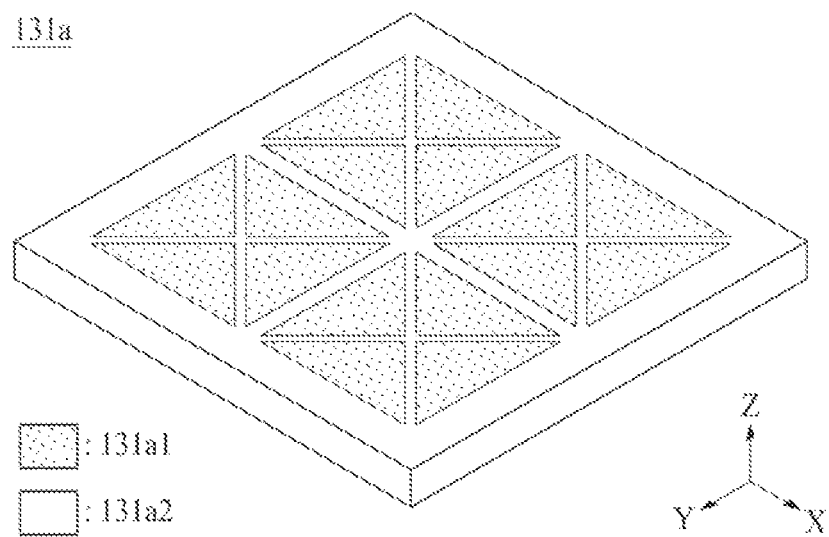

With reference to FIG. 7C, in the vibration device 131 according to another embodiment of the present disclosure, the piezoelectric vibration portion 131a can include a plurality of first portions 131a1, which are spaced apart from one another along a first direction X and a second direction Y, and a second portion (or one or more second portions) 131a2 disposed between the plurality of first portions 131a1.

Each of the plurality of first portions 131a1 can have a flat structure of a triangular shape. For example, each of the plurality of first portions 131a1 can have a triangular plate shape. Each of the plurality of first portions 131a1 can include a piezoelectric material which is be substantially the same as the first portion 131a1 described above with reference to FIGS. 4 to 6, and thus, like reference numerals can refer to like elements, and their repetitive descriptions may be omitted.

According to an embodiment of the present disclosure, four adjacent first portions 131a1 among the plurality of first portions 131a1 can be adjacent to one another to form a tetragonal shape (or a square shape or quadrilateral shape).

Vertices of the four adjacent first portions 131a1 forming a tetragonal shape can be adjacent to one another in a center portion (or a central portion) of the tetragonal shape.

The second portion 131a2 can be disposed between the plurality of first portions 131a1 along each of the first direction X and the second direction Y. The second portion 131a2 can be configured to surround each of the plurality of first portions 131a1, and thus, can be connected or adhered to a side surface of each of the plurality of first portions 131a1. Each of the plurality of first portions 131a1 and the second portion 131a2 can be disposed (or arranged) in parallel on the same plane (or the same layer). The second portion 131a2 can include an organic material which is be substantially the same as the second portion 131a2 described above with reference to FIGS. 4 to 6, and thus, like reference numerals can refer to like elements, and their repetitive descriptions may be omitted.

Figure 7D:
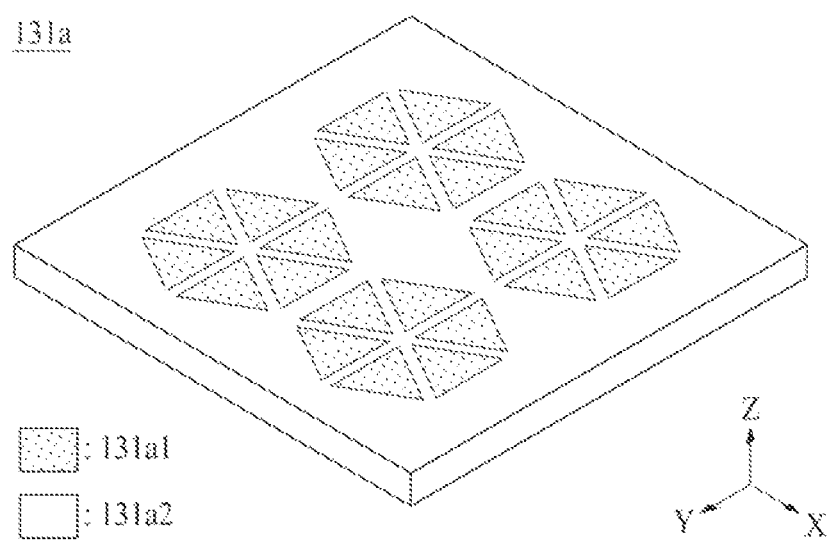

With reference to FIG. 7D, in the vibration device 131 according to another embodiment of the present disclosure, the piezoelectric vibration portion 131a can include a plurality of first portions 131a1, which are spaced apart from one another along a first direction X and a second direction Y, and a second portion (or one or more second portions) 131a2 disposed between the plurality of first portions 131a1.

Each of the plurality of first portions 131a1 can have a flat structure of a triangular shape. For example, each of the plurality of first portions 131a1 can have a triangular plate shape. Each of the plurality of first portions 131a1 can include a piezoelectric material which is be substantially the same as the first portion 131a1 described above with reference to FIGS. 4 to 6, and thus, like reference numerals can refer to like elements, and their repetitive descriptions may be omitted.

According to another embodiment of the present disclosure, six adjacent first portions 131a1 of the plurality of first portions 131a1 can be adjacent to one another to form a hexagonal shape (or a regularly hexagonal shape). Vertices of the six adjacent first portions 131a1 forming a hexagonal shape can be adjacent to one another in a center portion (or a central portion) of the hexagonal shape.

The second portion 131a2 can be disposed between the plurality of first portions 131a1 along each of the first direction X and the second direction Y. The second portion 131a2 can be configured to surround each of the plurality of first portions 131a1, and thus, can be connected or adhered to a side surface of each of the plurality of first portions 131a1. Each of the plurality of first portions 131a1 and the second portion 131a2 can be disposed (or arranged) in parallel on the same plane (or the same layer). The second portion 131a2 can include an organic material which is be substantially the same as the second portion 131a2 described above with reference to FIGS. 4 to 6, and thus, like reference numerals can refer to like elements, and their repetitive descriptions may be omitted.

Figure 8:
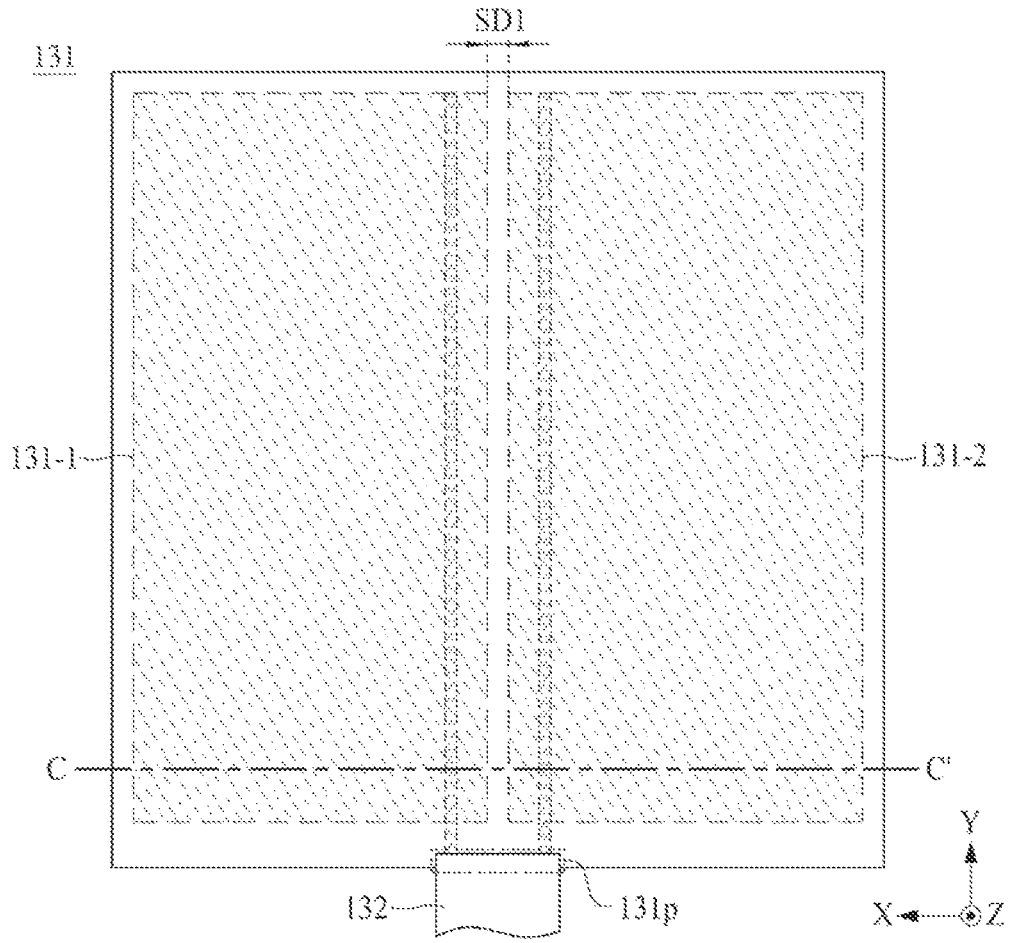
FIG. 8 illustrates a vibration device according to another embodiment of the present disclosure.
Figure 9:
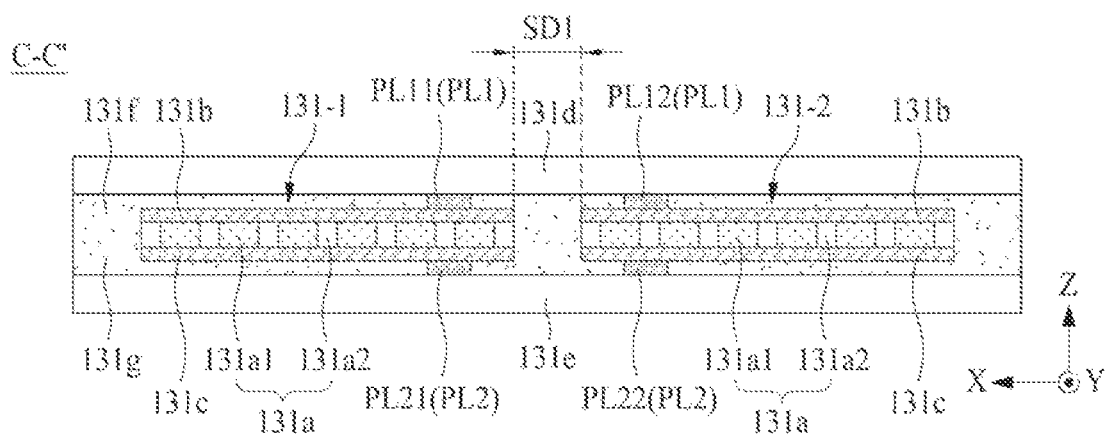
FIG. 9 is a cross-sectional view taken along line C-C' illustrated in FIG. 8.

FIG. 8 illustrates a vibration device according to another embodiment of the present disclosure. FIG. 9 is a cross-sectional view taken along line C-C' illustrated in FIG. 8. FIGS. 8 and 9 illustrate another embodiment of the vibration device illustrated in one or more of FIGS. 1 to 3.

With reference to FIGS. 8 and 9, the vibration device 131 according to another embodiment of the present disclosure can include first and second vibration generating portions 131-1 and 131-2.

Each of the first and second vibration generating portions 131-1 and 131-2 can be electrically separated and disposed while being spaced apart from each other along a first direction X. Each of the first and second vibration generating portions 131-1 and 131-2 can alternately and repeatedly contract and expand based on a piezoelectric effect to vibrate. For example, the first and second vibration generating portions 131-1 and 131-2 can be disposed or tiled at a certain interval (or distance) SD1 along the first direction X. Thus, the vibration device 131 in which the first and second vibration generating portions 131-1 and 131-2 are tiled can be a vibration array, a vibration array portion, a vibration module array portion, a vibration array structure, a tiling vibration array, a tiling vibration array module, or a tiling vibration film.

Each of the first and second vibration generating portions 131-1 and 131-2 according to an embodiment of the present disclosure can have a tetragonal shape. For example, each of the first and second vibration generating portions 131-1 and 131-2 can have a tetragonal shape having a width of about 5 cm or more. For example, each of the first and second vibration generating portions 131-1 and 131-2 can have a square shape having a size of 5 cm×5 cm or more, but embodiments of the present disclosure are not limited thereto.

Each of the first and second vibration generating portions 131-1 and 131-2 can be arranged or tiled on the same plane, and thus, the vibration device 131 can have an enlarged area based on tiling of the first and second vibration generating portions 131-1 and 131-2 having a relatively small size.

Each of the first and second vibration generating portions 131-1 and 131-2 can be arranged or tiled at a certain interval SD1, and thus, can be implemented as one vibration apparatus (or a single vibration apparatus) which is driven as one complete single-body without being independently driven. According to an embodiment of the present disclosure, with respect to the first direction X, a first separation distance (or a first interval) SD1 between the first and second vibration generating portions 131-1 and 131-2 can be 0.1 mm or more and less than 3 cm, but embodiments of the present disclosure are not limited thereto.

According to an embodiment of the present disclosure, each of the first and second vibration generating portions 131-1 and 131-2 can be disposed or tiled to have the first separation distance (or an interval) SD1 of 0.1 mm or more and less than 3 cm, and thus, can be driven as one vibration apparatus, thereby increasing a reproduction band of a sound and a sound pressure level characteristic of a sound which is generated based on a single-body vibration of the first and second vibration generating portions 131-1 and 131-2. For example, the first and second vibration generating portions 131-1 and 131-2 can be disposed in the first separation distance (or the interval) SD1 of 0.1 mm or more and less than 5 mm, in order to increase a reproduction band of a sound generated based on a single-body vibration of the first and second vibration generating portions 131-1 and 131-2 and to increase a sound of a low-pitched sound band (for example, a sound pressure level characteristic in 500 Hz or less).

According to an embodiment of the present disclosure, when the first and second vibration generating portions 131-1 and 131-2 are disposed in the interval SD1 of less than 0.1 mm or without the interval SD1, the reliability of the first and second vibration generating portions 131-1 and 131-2 or the vibration device 131 may be reduced due to damage or a crack caused by a physical contact therebetween which occurs when each of the first and second vibration generating portions 131-1 and 131-2 vibrates.

According to an embodiment of the present disclosure, when the first and second vibration generating portions 131-1 and 131-2 are disposed in the interval SD1 of 3 cm or more, the first and second vibration generating portions 131-1 and 131-2 may not be driven as one vibration apparatus due to an independent vibration of each of the first and second vibration generating portions 131-1 and 131-2 (e.g., may become unsynchronized). Therefore, a reproduction band of a sound and a sound pressure level characteristic of a sound which is generated based on vibrations of the first and second vibration generating portions 131-1 and 131-2 can be reduced. For example, when the first and second vibration generating portions 131-1 and 131-2 are disposed in the interval SD1 of 3 cm or more, a sound characteristic and a sound pressure level characteristic of the low-pitched sound band (for example, in 500 Hz or less) may each be reduced.

According to an embodiment of the present disclosure, when the first and second vibration generating portions 131-1 and 131-2 are disposed in an interval SD1 of 5 mm, each of the first and second vibration generating portions 131-1 and 131-2 may not be perfectly driven as one vibration apparatus, and thus, a sound characteristic and a sound pressure level characteristic of the low-pitched sound band (for example, in 200 Hz or less) may each be reduced.

According to another embodiment of the present disclosure, when the first and second vibration generating portions 131-1 and 131-2 are disposed in an interval SD1 of 1 mm, each of the first and second vibration generating portions 131-1 and 131-2 can be driven as one vibration apparatus, and thus, a reproduction band of a sound can increase and a sound of the low-pitched sound band (for example, a sound pressure level characteristic in 500 Hz or less) can increase. For example, when the first and second vibration generating portions 131-1 and 131-2 are disposed in the interval SD1 of 1 mm, the vibration device 131 can be implemented as a large-area vibrator which is enlarged based on optimization of a separation distance between the first and second vibration generating portions 131-1 and 131-2. Therefore, the vibration device 131 can be driven as a large-area vibrator based on a single-body vibration of the first and second vibration generating portions 131-1 and 131-2, and thus, a sound characteristic and a sound pressure level characteristic can each increase a reproduction band of a sound and in the low-pitched sound band generated based on a large-area vibration of the vibration device 131.

Therefore, to implement a single-body vibration (or one vibration apparatus) of the first and second vibration generating portions 131-1 and 131-2, the separation distance (or the interval) SD1 between the first and second vibration generating portions 131-1 and 131-2 can be adjusted to 0.1 mm or more and less than 3 cm. In addition, to implement a single-body vibration (or one vibration apparatus) of the first and second vibration generating portions 131-1 and 131-2 and to increase a sound pressure level characteristic of a sound of the low-pitched sound band, the separation distance (or the interval) SD1 between the first and second vibration generating portions 131-1 and 131-2 can be adjusted to 0.1 mm or more and less than 5 mm.

Each of the first and second vibration generating portions 131-1 and 131-2 according to an embodiment of the present disclosure can include a piezoelectric vibration portion 131a, a first electrode portion 131b, and a second electrode portion 131c.

The piezoelectric vibration portion 131a of each of the first and second vibration generating portions 131-1 and 131-2 can include a piezoelectric material (or an electroactive material) including a piezoelectric effect. For example, the piezoelectric vibration portion 131a of each of the first and second vibration generating portions 131-1 and 131-2 can be configured substantially the same as any one of the piezoelectric vibration portion 131a described above with reference to FIGS. 6 and 7A to 7D, and thus, like reference numeral can refer to like element, and the repetitive description thereof may be omitted.

According to an embodiment of the present disclosure, each of the first and second vibration generating portions 131-1 and 131-2 can include any one piezoelectric vibration portion 131a of the piezoelectric vibration portion 131a described above with reference to FIGS. 6 and 7A to 7D, or can include different piezoelectric vibration portion 131a.

The first electrode portion 131b can be disposed at a first surface of the piezoelectric vibration portion 131a and can be electrically connected to the first surface of the piezoelectric vibration portion 131a. For example, the first electrode portion 131b can be substantially the same as the first electrode portion 131b described above with reference to FIG. 5, and thus, like reference numeral can refer to like element, and the repetitive description thereof may be omitted.

The second electrode portion 131c can be disposed at a second surface of the piezoelectric vibration portion 131a and electrically connected to the second surface of the piezoelectric vibration portion 131a. The second electrode portion 131c can be substantially the same as the second electrode portion 131c described above with reference to FIG. 5, and thus, like reference numerals can refer to like elements, and the repetitive description thereof may be omitted.

The vibration device 131 according to another embodiment of the present disclosure can further include a first cover member 131d and a second cover member 131e.

The first cover member 131d can be disposed at the first surface of the vibration device 131. For example, the first cover member 131d can cover the first electrode portion 131b which is disposed at a first surface of each of the first and second vibration generating portions 131-1 and 131-2, and thus, the first cover member 131d can be connected to the first surface of each of the first and second vibration generating portions 131-1 and 131-2 in common or can support the first surface of each of the first and second vibration generating portions 131-1 and 131-2 in common. Accordingly, the first cover member 131d can protect the first surface or the first electrode portion 131b of each of the first and second vibration generating portions 131-1 and 131-2.

The second cover member 131e can be disposed at the second surface of the vibration device 131. For example, the second cover member 131e can cover the second electrode portion 131c which is disposed at a second surface of each of the first and second vibration generating portions 131-1 and 131-2, and thus, the second cover member 131e can be connected to the second surface of each of the first and second vibration generating portions 131-1 and 131-2 in common or can support the second surface of each of the first and second vibration generating portions 131-1 and 131-2 in common. Accordingly, the second cover member 131e can protect the second surface or the second electrode portion 131c of each of the first and second vibration generating portions 131-1 and 131-2.

The first cover member 131d and the second cover member 131e according to an embodiment of the present disclosure can each include one or more materials of plastic, fiber, and wood, but embodiments of the present disclosure are not limited thereto. For example, each of the first cover member 131d and the second cover member 131e can include the same material or different material. For example, each of the first cover member 131*d* and the second cover member 131*e* can be a polyimide (PI) film or a polyethylene terephthalate (PET) film, but embodiments of the present disclosure are not limited thereto.

The first cover member 131*d* according to an embodiment of the present disclosure can be disposed at the first surface of each of the first and second vibration generating portions 131-1 and 131-2 by a first adhesive layer 131*f*. For example, the first cover member 131*d* can be directly disposed at the first surface of each of the first and second vibration generating portions 131-1 and 131-2 by a film laminating process using the first adhesive layer 131*f*. Accordingly, each of the first and second vibration generating portions 131-1 and 131-2 can be integrated (or disposed) or tiled with the first cover member 131*d* to have the certain interval SD1.

The second cover member 131*e* according to an embodiment of the present disclosure can be disposed at the second surface of each of the first and second vibration generating portions 131-1 and 131-2 by a second adhesive layer 131*g*. For example, the second cover member 131*e* can be directly disposed at the second surface of each of the first and second vibration generating portions 131-1 and 131-2 by a film laminating process using the second adhesive layer 131*g*. Accordingly, each of the first and second vibration generating portions 131-1 and 131-2 can be integrated (or disposed) or tiled with the second cover member 131*e* to have the certain interval SD 1.

The first adhesive layer 131*f* can be disposed between the first and second vibration generating portions 131-1 and 131-2 and disposed at the first surface of each of the first and second vibration generating portions 131-1 and 131-2. For example, the first adhesive layer 131*f* can be formed at a rear surface (or an inner surface) of the first cover member 131*d* facing the first surface of each of the first and second vibration generating portions 131-1 and 131-2, filled between the first and second vibration generating portions 131-1 and 131-2, and disposed between at the first cover member 131*d* and the first surface of each of the first and second vibration generating portions 131-1 and 131-2.

The second adhesive layer 131*g* can be disposed between the first and second vibration generating portions 131-1 and 131-2 and disposed at the second surface of each of the first and second vibration generating portions 131-1 and 131-2. For example, the second adhesive layer 131*g* can be formed at a front surface (or an inner surface) of the second cover member 131*e* facing the second surface of each of the first and second vibration generating portions 131-1 and 131-2, filled between the first and second vibration generating portions 131-1 and 131-2, and disposed between at the second cover member 131*e* and the second surface of each of the first and second vibration generating portions 131-1 and 131-2.

The first and second adhesive layers 131*f* and 131*g* can be connected or coupled to each other between the first and second vibration generating portions 131-1 and 131-2. Therefore, each of the first and second vibration generating portions 131-1 and 131-2 can be surrounded by the first and second adhesive layers 131*f* and 131*g*. For example, the first and second adhesive layers 131*f* and 131*g* can be configured between the first cover member 131*d* and the second cover member 131*e* to completely surround the first and second vibration generating portions 131-1 and 131-2. For example, each of the first and second vibration generating portions 131-1 and 131-2 can be embedded or built-in between the first adhesive layer 131*f* and the second adhesive layer 131*g*. Thus, the first and second vibration generating portions 131-1 and 131-2 can be effectively sealed and protected between the first adhesive layer 131*f* and the second adhesive layer 131*g*.

Each of the first and second adhesive layers 131*f* and 131*g* according to an embodiment of the present disclosure can include an electric insulating material which has adhesiveness and is capable of compression and decompression. For example, each of the first and second adhesive layers 131*f* and 131*g* can include an epoxy resin, an acrylic resin, a silicone resin, or a urethane resin, but embodiments of the present disclosure are not limited thereto. Each of the first and second adhesive layers 131*f* and 131*g* can be configured to be transparent, translucent, or opaque.

The vibration device 131 according to another embodiment of the present disclosure can further include a first power supply line PL1 disposed at the first cover member 131*d*, a second power supply line PL2 disposed at the second cover member 131*e*, and a pad part 131*p* electrically connected to the first power supply line PL1 and the second power supply line PL2.

The first power supply line PL1 can be disposed at the rear surface of the first cover member 131*d* facing the first surface of each of the first and second vibration generating portions 131-1 and 131-2. The first power supply line PL1 can be electrically connected to the first electrode portion 131*b* of each of the first and second vibration generating portions 131-1 and 131-2. For example, the first power supply line PL1 can be electrically and directly connected to the first electrode portion 131*b* of each of the first and second vibration generating portions 131-1 and 131-2. As an embodiment of the present disclosure, the first power supply line PL1 can be electrically connected to the first electrode portion 131*b* of each of the first and second vibration generating portions 131-1 and 131-2 by an anisotropic conductive film. As another embodiment of the present disclosure, the first power supply line PL1 can be electrically connected to the first electrode portion 131*b* of each of the first and second vibration generating portions 131-1 and 131-2 through a conductive material (or conductive particles) included in the first adhesive layer 131*f*.

The first power supply line PL1 according to an embodiment of the present disclosure can include first and second upper power lines PL11 and PL12 disposed along a second direction Y. For example, the first upper power line PL11 can be electrically connected to the first electrode portion 131*b* of the first vibration generating portion 131-1. The second upper power line PL12 can be electrically connected to the first electrode portion 131*b* of the second vibration generating portion 131-2.

The second power supply line PL2 can be disposed at the front surface of the second cover member 131*e* facing the second surface of each of the first and second vibration generating portions 131-1 and 131-2. The second power supply line PL2 can be electrically connected to the second electrode portion 131*c* of each of the first and second vibration generating portions 131-1 and 131-2. For example, the second power supply line PL2 can be electrically and directly connected to the second electrode portion 131*c* of each of the first and second vibration generating portions 131-1 and 131-2. As an embodiment of the present disclosure, the second power supply line PL2 can be electrically connected to the second electrode portion 131*c* of each of the first and second vibration generating portions 131-1 and 131-2 by an anisotropic conductive film. As another embodiment of the present disclosure, the second power supply line PL2 can be electrically connected to the second electrode portion 131*c* of each of the first and second vibration generating portions 131-1 and 131-2 through a conductive material (or conductive particles) included in the second adhesive layer 131g.

The second power supply line PL2 according to an embodiment of the present disclosure can include first and second lower power lines PL21 and PL22 disposed along a second direction Y. For example, the first lower power line PL21 can be electrically connected to the second electrode portion 131c of the first vibration generating portion 131-1. For example, the first lower power line PL21 can be overlapped the first upper power line PL11. For example, the first lower power line PL21 can be disposed not to overlap the first upper power line PL11. The second lower power line PL22 can be electrically connected to the second electrode portion 131c of the second vibration generating portion 131-2. For example, the second lower power line PL22 can be overlapped the second upper power line PL12. For example, the second lower power line PL22 can be disposed not to overlap the second upper power line PL12.

The pad part 131p can be configured at one periphery portion of any one of the first cover member 131d and the second cover member 131e to be electrically connected to one portion (or one end) of each of the first power supply line PL1 and the second power supply line PL2.

The pad part 131p according to an embodiment of the present disclosure can include a first pad electrode electrically connected to one end of the first power supply line PL1, and a second pad electrode electrically connected to one end of the second power supply line PL2.

The first pad electrode can be connected to one portion of each of the first and second upper power lines PL11 and PL12 of the first power supply line PL1 in common. For example, the one portion of each of the first and second upper power lines PL11 and PL12 can branch out from the first pad electrode. The second pad electrode can be connected to one portion of each of the first and second lower power lines PL21 and PL22 of the second power supply line PL2 in common. For example, the one portion of each of the first and second lower power lines PL21 and PL22 can branch out from the second pad electrode.

The vibration device 131 according to another embodiment of the present disclosure can further include a signal cable 132.

The signal cable 132 can be electrically connected to the pad part 131p disposed at the vibration device 131 and can supply the vibration device 131 with a vibration driving signal (or a sound signal or a voice signal) provided from a sound processing circuit. The signal cable 132 according to an embodiment of the present disclosure can include a first terminal electrically coupled to the first pad electrode of the pad part 131p and a second terminal electrically coupled to the second pad electrode of the pad part 131p. For example, the signal cable 132 can be configured as a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The sound processing circuit can generate an alternating current (AC) vibration driving signal including a first vibration driving signal and a second vibration driving signal based on a sound data. The first vibration driving signal can be any one of a positive (+) vibration driving signal and a negative (−) vibration driving signal, and the second vibration driving signal can be any one of a positive (+) vibration driving signal and a negative (−) vibration driving signal. For example, the first vibration driving signal can be supplied to the first electrode portion 131b of each of the first and second vibration generating portions 131-1 and 131-2 through a first terminal of the signal cable 132, the first pad electrode of the pad part 131p, and the first power supply line PL1. The second vibration driving signal can be supplied to the second electrode portion 131c of each of the first and second vibration generating portions 131-1 and 131-2 through a second terminal of the signal cable 132, the second pad electrode of the pad part 131p, and the second power supply line PL2.

Figure 10:
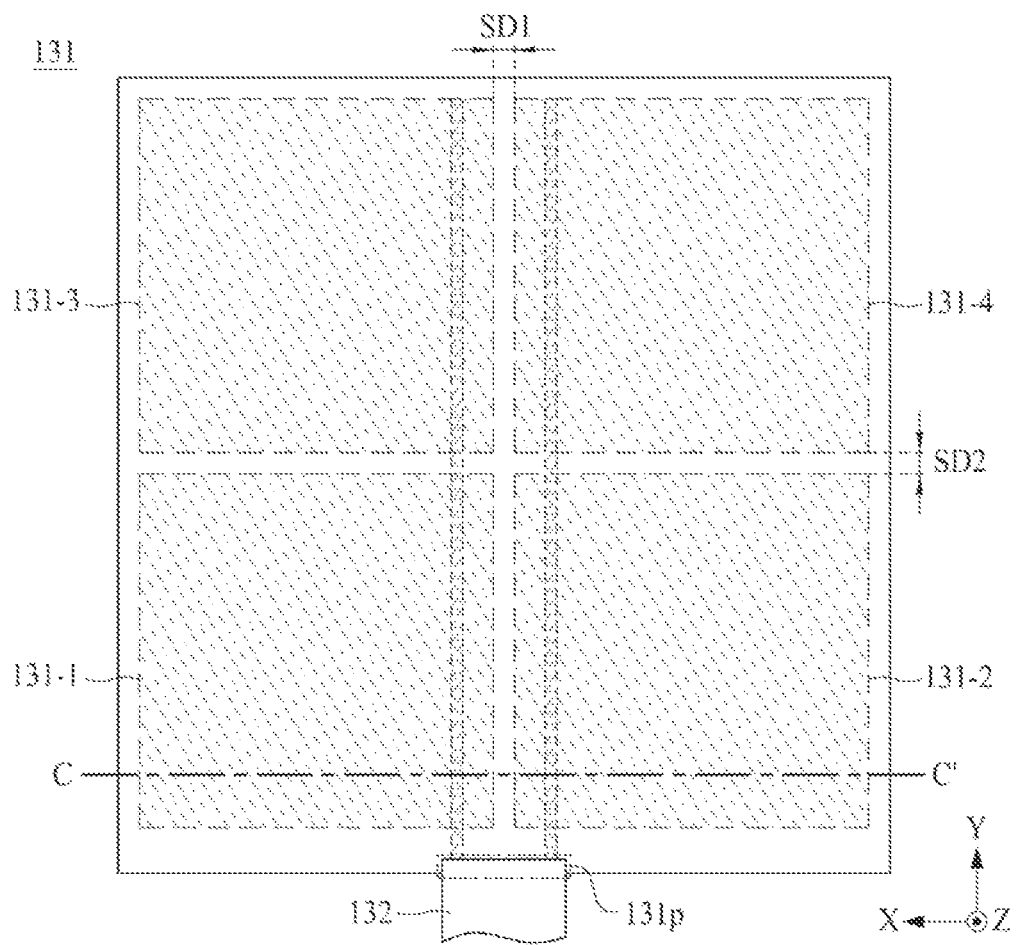
FIG. 10 illustrates a vibration device according to another embodiment of the present disclosure.

FIG. 10 illustrates a vibration device according to another embodiment of the present disclosure. FIG. 10 illustrates an embodiment where four vibration generating portions are provided in the vibration device illustrated in FIGS. 8 and 9. Hereinafter, therefore, the other elements except for the four vibration generating portions and relevant elements can be referred to by like reference numerals, and their repetitive descriptions may be omitted or will be briefly given. A cross-sectional surface taken along line C-C' illustrated in FIG. 10 is illustrated in FIG. 9.

With reference to FIG. 10 in conjunction with FIG. 9, the vibration device 131 according to another embodiment of the present disclosure can include a plurality of vibration generating portions 131-1 to 131-4.

The plurality of vibration generating portions 131-1 to 131-4 can be electrically disconnected and disposed spaced apart from one another along a first direction X and a second direction Y. For example, the plurality of vibration generating portions 131-1 to 131-4 can be arranged or tiled in an i×j form on the same plane, and thus, the vibration device 131 can be implemented to have a large area based on tiling of the plurality of vibration generating portions 131-1 to 131-4 having a relatively small size, where i and j are positive integers greater than zero. For example, i can be the number of vibration generating portions disposed along the first direction X and can be a natural number of 2 or more, and j can be the number of vibration generating portions disposed along the second direction Y and can be a natural number of 2 or more which is the same as or different from i. For example, the plurality of vibration generating portions 131-1 to 131-4 can be arranged or tiled in a 2×2 form, but embodiments of the present disclosure are not limited thereto. Hereinafter, an example where the vibration device 131 includes first to fourth vibration generating portions 131-1 to 131-4 will be described.

According to an embodiment of the present disclosure, the first and second vibration generating portions 131-1 and 131-2 can be spaced apart from each other along the first direction X. The third and fourth vibration generating portions 131-3 and 131-4 can be spaced apart from each other along the first direction X and can be spaced apart from each of the first and second vibration generating portions 131-1 and 131-2 along the second direction Y. The first and third vibration generating portions 131-1 and 131-3 can be spaced apart from each other along the second direction Y to face each other. The second and fourth vibration generating portions 131-2 and 131-4 can be spaced apart from each other along the second direction Y to face each other.

The first to fourth vibration generating portions 131-1 to 131-4 can be disposed between the first cover member 131d and the second cover member 131e. For example, each of the first cover member 131d and the second cover member 131e can be connected to the first to fourth vibration generating portions 131-1 to 131-4 or can support the first to fourth vibration generating portions 131-1 to 131-4 in common, and thus, can drive the first to fourth vibration generating portions 131-1 to 131-4 as one vibration apparatus (or a single vibration apparatus). For example, the first to fourth vibration generating portions 131-1 to 131-4 can be tiled in a certain interval by the cover members 131*d* and 131*e*, and thus, can be driven as one vibration apparatus (or a single vibration apparatus).

According to an embodiment of the present disclosure, as described above with reference to FIGS. 8 and 9, in order to provide a complete single body vibration or a large-area vibration, the first to fourth vibration generating portions 131-1 to 131-4 can be disposed (or tiled) in the intervals SD1 and SD2 of 0.1 mm or more and less than 3 cm, more preferably, can be disposed (or tiled) in the intervals SD1 and SD2 0.1 mm or more and less than 5 mm (e.g., 2.5 mm), along each of the first direction X and the second direction Y.

Each of the first to fourth vibration generating portions 131-1 to 131-4 can include a piezoelectric vibration portion 131*a*, a first electrode portion 131*b*, and a second electrode portion 131*c*.

The piezoelectric vibration portion 131*a* of each of the first to fourth vibration generating portions 131-1 to 131-4 can include a piezoelectric material (or an electroactive material) including a piezoelectric effect. The piezoelectric vibration portion 131*a* of each of the first to fourth vibration generating portions 131-1 to 131-4 can be configured substantially the same as any one of the piezoelectric vibration portion 131*a* described above with reference to FIGS. 6 and 7A to 7D, and thus, like reference numerals can refer to like elements, and the repetitive description thereof may be omitted.

According to an embodiment of the present disclosure, each of the first to fourth vibration generating portions 131-1 to 131-4 can include any one piezoelectric vibration portion 131*a* of the piezoelectric vibration portion 131*a* described above with reference to FIGS. 6 and 7A to 7D, or can include different piezoelectric vibration portion 131*a*.

According to another embodiment of the present disclosure, one or more of the first to fourth vibration generating portions 131-1 to 131-4 can include different piezoelectric vibration portion 131*a* of the piezoelectric vibration portion 131*a* described above with reference to FIGS. 6 and 7A to 7D.

The first electrode portion 131*b* can be disposed at a first surface of the corresponding piezoelectric vibration portion 131*a* and electrically connected to the first surface of the piezoelectric vibration portion 131*a*. The first electrode portion 131*b* can be substantially the same as the first electrode portion 131*b* described above with reference to FIG. 5, and thus, like reference numeral can refer to like element, and the repetitive description thereof may be omitted.

The second electrode portion 131*c* can be disposed at a second surface of the corresponding piezoelectric vibration portion 131*a* and electrically connected to the second surface of the piezoelectric vibration portion 131*a*. The second electrode portion 131*c* can be substantially the same as the second electrode portion 131*c* described above with reference to FIG. 5, and thus, like reference numeral can refer to like element, and the repetitive description thereof may be omitted.

According to an embodiment of the present disclosure, first and second adhesive layers 131*f* and 131*g* can be connected or coupled to each other between first to fourth vibration generating portions 131-1 to 131-4. Therefore, each of the first to fourth vibration generating portions 131-1 to 131-4 can be surrounded by the first and second adhesive layers 131*f* and 131*g*. For example, the first and second adhesive layers 131*f* and 131*g* can be configured between a first cover member 131*d* and a second cover member 131*e* to completely surround each of the first to fourth vibration generating portions 131-1 to 131-4. For example, each of the first to fourth vibration generating portions 131-1 to 131-4 can be embedded or built-in between the first adhesive layer 131*f* and the second adhesive layer 131*g*.

The vibration device 131 according to another embodiment of the present disclosure can further include a first power supply line PL1, a second power supply line PL2, and a pad part 131*p*.

Except for an electrical connection structure between the first and second power supply lines PL1 and PL2 and the first to fourth vibration generating portions 131-1 to 131-4, the first and second power supply lines PL1 and PL2 can be substantially the same as the first and second power supply lines PL1 and PL2 described above with reference to FIGS. 8 and 9, and thus, only the electrical connection structure between the first and second power supply lines PL1 and PL2 and the first to fourth vibration generating portions 131-1 to 131-4 will be briefly described below.

The first power supply line PL1 according to an embodiment of the present disclosure can include first and second upper power lines PL11 and PL12 disposed along a second direction Y. For example, the first upper power line PL11 can be electrically connected to the first electrode portion 131*b* of each of the first and third vibration generating portions 131-1 and 131-3 (or a first group or a first vibration generating group) disposed at a first row parallel to a second direction Y of the first to fourth vibration generating portions 131-1 to 131-4. The second upper power line PL12 can be electrically connected to the first electrode portion 131*b* of each of the second and fourth vibration generating portions 131-2 and 131-4 (or a second group or a second vibration generating group) disposed at a second row parallel to the second direction Y of the first to fourth vibration generating portions 131-1 to 131-4.

The second power supply line PL2 according to an embodiment of the present disclosure can include first and second lower power lines PL21 and PL22 disposed along a second direction Y. For example, the first lower power line PL21 can be electrically connected to the second electrode portion 131*c* of each of the first and third vibration generating portions 131-1 and 131-3 (or the first group or the first vibration generating group) disposed at the first row parallel to the second direction Y of the first to fourth vibration generating portions 131-1 to 131-4. The second lower power line PL22 can be electrically connected to the second electrode portion 131*c* of each of the second and fourth vibration generating portions 131-2 and 131-4 (or the second group or the second vibration generating group) disposed at the second row parallel to the second direction Y of the first to fourth vibration generating portions 131-1 to 131-4.

The pad part 131*p* can be configured at one periphery portion of any one among the first cover member 131*d* and the second cover member 131*e* to be electrically connected to one side (or one end) of each of the first and second power supply lines PL1 and PL2. The pad part 131*p* can be substantially the same as the pad part 131*p* illustrated in FIGS. 8 and 9, and thus, like reference numeral can refer to like element, and the repetitive description thereof may be omitted.

As described above, the vibration device 131 according to another embodiment of the present disclosure can have the same effect as that of the vibration device 131 described above with reference to FIGS. 4 to 9, and thus, the repetitive description thereof may be omitted.

Figure 11:
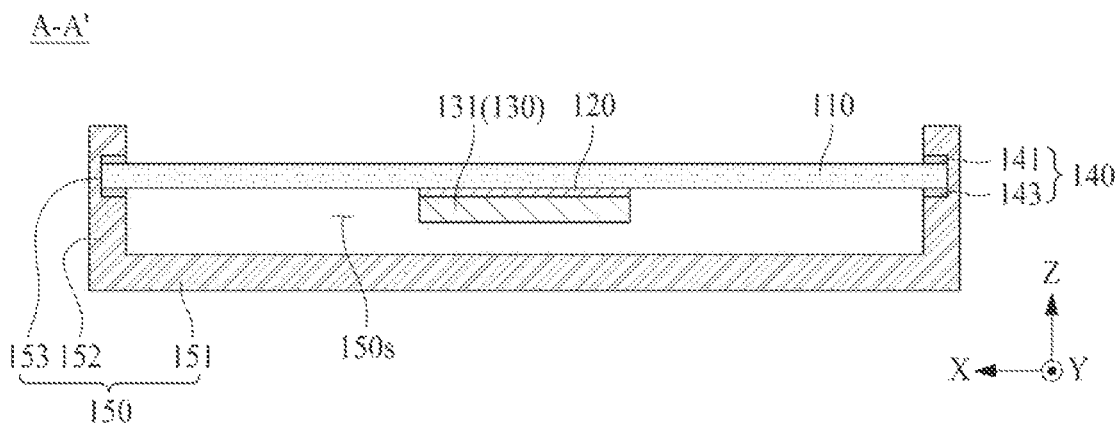
FIGS. 11 to 14 are cross-sectional views taken along line A-A' illustrated in FIG. 1 according to embodiments of the present disclosure.
Figure 12:
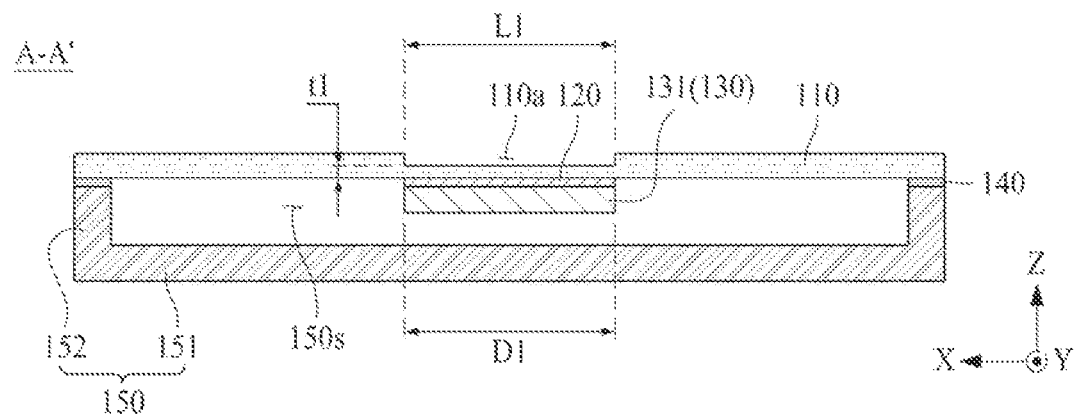
Figure 13:
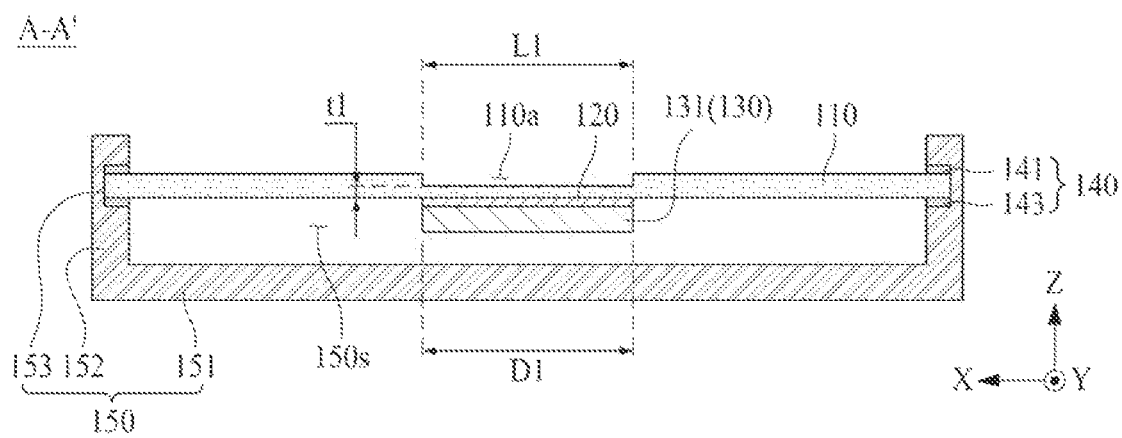
Figure 14:
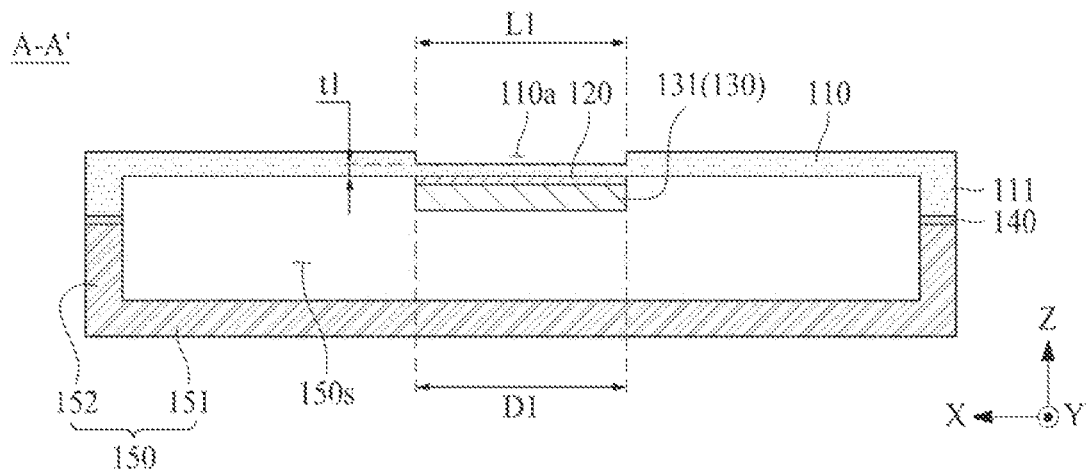

FIGS. 11 to 14 are a cross-sectional view taken along line A-A' illustrated in FIG. 1. FIG. 11 illustrates a sound apparatus according to another embodiment of the present disclosure and illustrates an embodiment implemented by modifying a structure of the vibration member of in FIG. 3. FIG. 12 illustrates a sound apparatus according to another embodiment of the present disclosure and illustrates an embodiment implemented by modifying a structure of the vibration member of in FIG. 2. FIG. 13 illustrates a sound apparatus according to another embodiment of the present disclosure and illustrates an embodiment implemented by modifying a structure of the vibration member and the housing of in FIG. 11. FIG. 14 illustrates a sound apparatus according to another embodiment of the present disclosure and illustrates an embodiment implemented by modifying a structure of the vibration member and the housing of in FIG. 2. Therefore, in the following description, repetitive descriptions of the other elements except a vibration member and the housing, and relevant elements may be omitted.

With reference to FIGS. 1 and 11, a vibration member 110 can be configured in a form where the vibration member 110 is inserted or accommodated into a second groove portion 153 of a housing 150. The vibration member 110 of a sound apparatus 10 according to another embodiment of the present disclosure can be configured in a form where both ends of a first surface and a second surface of the vibration member 110 are fixed in the second groove portion 153. In detail, the first surface of the vibration member 110 can be connected to the second groove portion 153 of the housing 150 through a first connection member 141, and the second surface of the vibration member 110 can be connected to the second groove portion 153 of the housing 150 through a second connection member 143. According to another embodiment of the present disclosure, because both ends of the vibration member 110 are fixed by the second groove portion 153, a reflected wave can be offset at the both ends of the vibration member 110, and thus, the peak or dip phenomenon of a sound characteristic caused by a standing wave can be reduced. The peak can be a phenomenon where a sound pressure level bounces in a specific frequency, and the dip can be phenomenon where a low pressure level occurs because the occurrence of a specific frequency is prevented. A sound output characteristic of a sound apparatus can be reduced by the peak or the dip phenomenon.

In the sound apparatus 10 according to another embodiment of the present disclosure, because both ends of the vibration member 110 are fixed by the second groove portion 153, a reflected wave can be offset at the both ends of the vibration member 110, and thus, the peak or dip phenomenon of a sound characteristic caused by a standing wave can be reduced, a sound characteristic of the low-pitched sound band can be enhanced, and when the peak or dip phenomenon occurs, a sound output characteristic of the sound apparatus can be reduced. In detail, in the sound apparatus according to another embodiment of the present disclosure, a sound characteristic of the low-pitched sound band can be enhanced, and a dip phenomenon of a middle-pitched sound band and a dip phenomenon of a high-pitched sound band can be reduced. For example, the low pitched sound can be a frequency range of 500 Hz or less, the middle-pitched sound band can be a frequency range of 500 Hz to 2,000 Hz, and the high-pitched sound band can be a frequency range of 2,000 Hz to 20,000 Hz. However, the frequency ranges of the middle-pitched sound band and a middle-high-pitched sound band according an embodiment of the present disclosure are not limited thereto.

With reference to FIGS. 1 and 12, the vibration member 110 can further include a first groove portion 110a (e.g., in an area overlapping with the vibration apparatus 130). In FIG. 12, for convenience of description, a first groove portion 110a can denote an empty space where a vibration member 110 is not provided, but the first groove portion 110a can denote a portion which is thinner in thickness t1 of at least a portion of the vibration member 110 than another portion. At least a portion of the first groove portion 110a can overlap a vibration apparatus 130. According an embodiment of the present disclosure, a thickness of the vibration member 110 overlapping the first groove portion 110a can be a thickness which is thinner than a portion, which does not overlap the first member groove portion 110a, of the vibration member 110. For example, a thickness of the vibration member 110 overlapping the first groove portion 110a can be adjusted to 10% to 90% (e.g., 50%) of a thickness of a portion, where the first groove portion 110a is not provided, of the vibration member 110. For example, a first groove portion 110a can be a groove portion, a second groove portion, or a groove portion of a vibration member, or a vibration member groove portion, but embodiments of the present disclosure are not limited thereto.

The vibration apparatus 130 can be adjusted to have a first length D1 in a first direction X and can be adjusted to have a second length in a second direction Y. The first groove portion 110a can be set to have a first length L1 in the first direction X and can be adjusted to have a second length in the second direction Y.

According an embodiment of the present disclosure, the first length D1 of the vibration apparatus 130 can be equal to or different from the first length L1 of the first groove portion 110a, and the second length of the vibration apparatus 130 can be equal to or different from the second length of the first groove portion 110a. According an embodiment of the present disclosure, the first length D1 of the vibration apparatus 130 can be greater than or equal to the first length L1 of the first groove portion 110a, and the second length of the vibration apparatus 130 can be greater than or equal to the second length of the first groove portion 110a.

According an embodiment of the present disclosure, a dimension of the first groove portion 110a adjusted in the first direction X and the second direction Y can have a value which is adjusted to be two times each dimension adjusted in the first direction X and the second direction Y. When adjusted in this manner, the flatness of a sound pressure level output characteristic can increase.

The first groove portion 110a can have a thickness which is thinner than another portion of the vibration member 110, and thus, bending stiffness of the vibration apparatus 130 disposed on a rear surface of the vibration member 110 at a position corresponding to the first groove portion 110a can be reduced, a sound reproduction characteristic of the low-pitched sound band can be enhanced because a vibration displacement based on the application of a driving force or a voltage of the vibration apparatus 130 increases, and the dip phenomenon of the middle-pitched sound band and the peak phenomenon of the high-pitched sound band can be reduced. For example, the first groove portion 110a can allow the vibration member 110 to flex more in an area overlapping with the vibration apparatus 130, which can improve sound production.

According an embodiment of the present disclosure, bending stiffness of the vibration apparatus 130 can be calculated as expressed in the following Equation 1.

$$\text{Bending Stiffness} = Eh^3/12 \qquad \text{[Equation 1]}$$

In Equation 1, E can denote a young's modulus, and h can denote a thickness of a vibration member at a position at which the first groove portion 110a is provided. Accordingly, With reference to Equation 1, it can be seen that the bending stiffness is proportional to cube (or 3 raised to the power) of a thickness of the vibration member 110.

According an embodiment of the present disclosure, the bending stiffness should be 0.20 Nm or more. For example, when the vibration member 110 configures as a material including acrylonitrile-butadiene-styrene (ABS) and has a thickness of 1 mm, the vibration member 110 can be calculated to have a bending stiffness value of about 0.19 Nm. When the bending stiffness is less than 0.20 Nm, a sound pressure level of 75 dB or more may not be secured near 100 Hz. Accordingly, when the vibration member 110 includes a material including ABS and is set to have a thickness of less than 1 mm, it may be unable to realize a desired low sound characteristic (e.g., bass sounds may be impaired).

With reference to FIGS. 1 and 13, a vibration member 110 can be configured in a form where the vibration member 110 is inserted or accommodated into a second groove portion 153 of a housing 150. The vibration member 110 of a sound apparatus 10 according to another embodiment of the present disclosure can be configured in a form where both ends of a first surface and a second surface of the vibration member 110 are fixed in the second groove portion 153. In detail, the first surface of the vibration member 110 can be connected to the second groove portion 153 of the housing 150 through a first connection member 141, and the second surface of the vibration member 110 can be connected to the second groove portion 153 of the housing 150 through a second connection member 143. According to another embodiment of the present disclosure, because both ends of the vibration member 110 are fixed by the second groove portion 153, a reflected wave can be offset at the both ends of the vibration member 110, and thus, the peak or dip phenomenon of a sound characteristic caused by a standing wave can be reduced. In addition, the vibration member 110 can be configured to further include a first groove portion 110a.

With reference to FIGS. 1 and 14, the vibration member 110 according to another embodiment of the present disclosure can be configured to further include a protrusion portion 111. The protrusion portion 111 can be connected to a periphery portion of the vibration member 110. For example, the protrusion portion 111 can be bent from the periphery portion of the vibration member 110 along a third direction Z parallel to a thickness direction of the vibration member 110. For example, the protrusion portion 111 can include first to fourth lateral portions. The protrusion portion 111 can be connected or coupled to a lateral portion 152 of the housing 150 by the connection member 140. The protrusion portion 111 can be configured to increase stiffness (or bending stiffness) of the vibration member 110. The vibration member 110 including a protrusion portion 111 can be configured to further include a first groove portion 110a.

Figure 15:
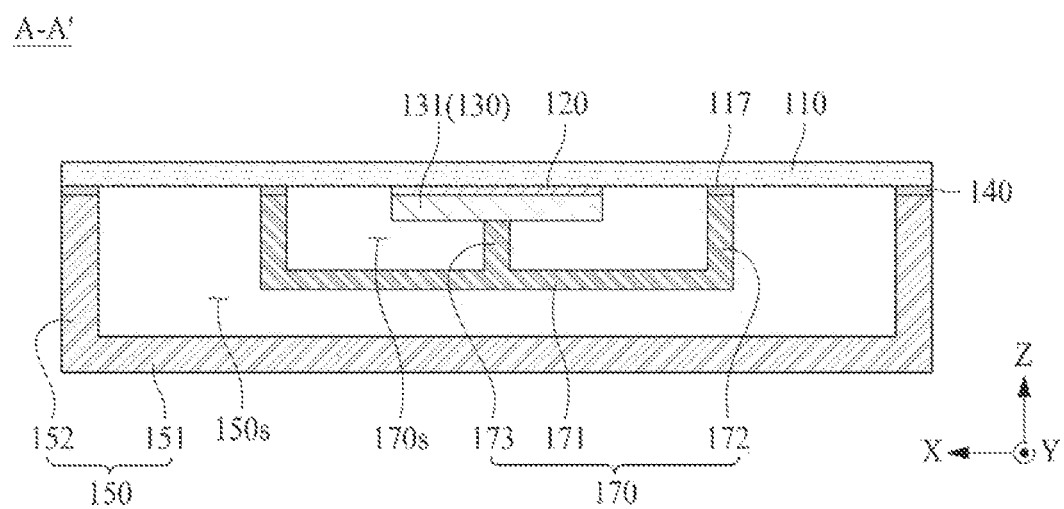
FIGS. 15 to 17 are cross-sectional views taken along line A-A' illustrated in FIG. 1 according to other embodiments of the present disclosure.
Figure 16:
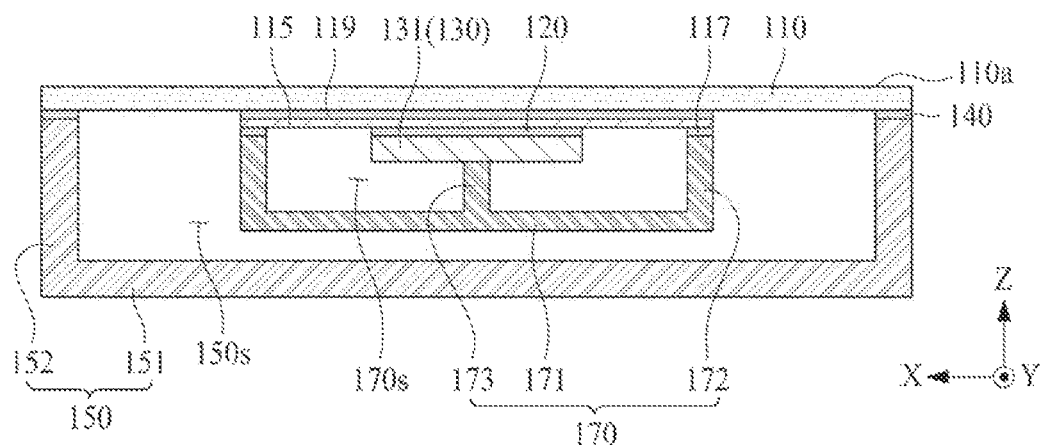
Figure 17:
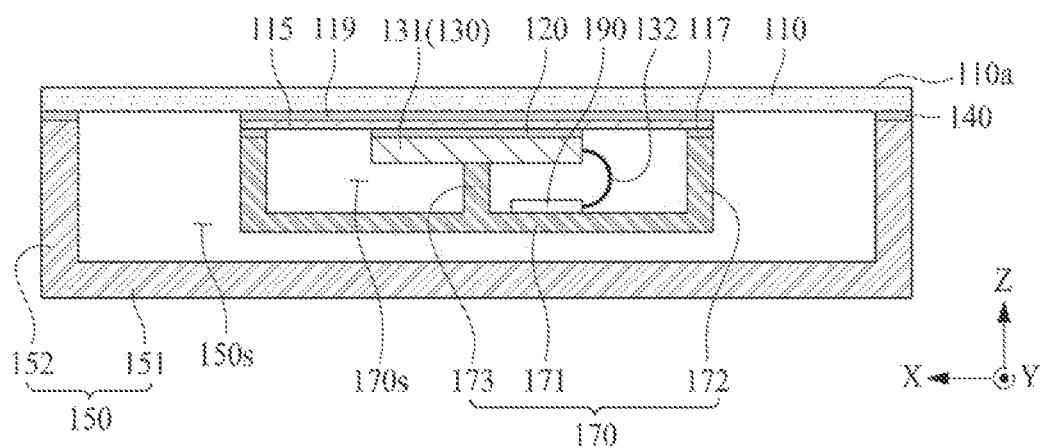

FIGS. 15 to 17 are another cross-sectional views taken along line A-A' illustrated in FIG. 1. FIGS. 15 to 17 are diagrams illustrating a sound apparatus according to another embodiment of the present disclosure and illustrate an embodiment where a structure of an inner housing is added to an inner portion of a housing and a structure of a sound apparatus is modified so that the inner housing is coupled to an auxiliary vibration member (or a secondary vibration member). Therefore, in the following description, repetitive descriptions of the other elements except an inner housing, and relevant elements is omitted.

With reference to FIGS. 1 and 15, a sound apparatus 10 according to another embodiment of the present disclosure can further include an inner housing 170 which is disposed inside (or an inward) a housing 150. The housing 150 can be disposed to surround the inner housing 170, can include an accommodation space 170s for accommodating the vibration apparatus 130, and can have a box shape where one side is opened. In addition, an opening of one side of the accommodation space 170s is covered by the vibration member 110, and a predetermined air gap can be formed between the accommodation space 170s and the vibration member 110.

The inner housing 170 according to an embodiment of the present disclosure can include one or more of a metal material and a nonmetal material (or a composite nonmetal material), but embodiments of the present disclosure are not limited thereto. For example, the inner housing 170 can include one or more materials of a metal material, plastic, and wood, but embodiments of the present disclosure are not limited thereto. For example, the inner housing 170 can be referred to as the term such as an inner case, an inner case member, a housing member, an inner cabinet, an inner enclosure, an inner sealing member, an inner sealing cap, an inner sealing box, or an inner sound box, or the like, but embodiments of the present disclosure are not limited thereto. For example, the accommodation space 170s of the inner housing 170 can be referred to as various terms, such as a gap space, an air gap, a vibration space, a sound space, a sound box, or a sealing space, but embodiments of the present disclosure are not limited thereto.

The inner housing 170 according to an embodiment of the present disclosure can include a bottom portion 171 and a lateral portion 172. The bottom portion 171 can be disposed at a rear surface of the vibration member 110 to cover a second surface of the vibration member 110 and the vibration apparatus 130. For example, the bottom portion 171 can be disposed to be spaced apart from the second surface of the vibration member 110 and the vibration apparatus 130.

The lateral portion 172 can be connected to a periphery portion of the bottom portion 171. For example, the lateral portion 172 can be bent from the periphery portion of the bottom portion 171 in a third direction Z parallel to a thickness direction of the vibration member 110. For example, the lateral portion 172 can include first to fourth lateral portions. The lateral portion 172 can be integrated into the bottom portion 171. For example, the bottom portion 171 and the lateral portion 172 can be integrated as one body, and thus, the accommodation space 170s surrounded by the lateral portion 172 can be provided on the bottom portion 171. Accordingly, the bottom portion 171 and the lateral portion 172 can have a box shape where one side is opened.

The inner housing 170 can further include a first reinforcement member 173 which is formed to protrude toward the vibration apparatus 130 from the bottom portion 171 thereof. The first reinforcement member 173 can also define different chambers within the inner housing 170.

The first reinforcement member 173 can be formed to protrude toward the vibration apparatus 130 from a center portion of the bottom portion 171 and can be configured to contact the vibration apparatus 130. The first reinforcement member 173 can have a certain width at a portion contacting the vibration apparatus 130 or can be implemented in a stumpy shape and can have a height capable of contacting the vibration apparatus 130.

When an impact is applied from the outside (for example, a rear surface of the bottom portion 171), the first reinforcement member 173 can disperse a dotted-contact impact into a line-contact impact (e.g., spreading out the force across a larger area), thereby preventing a specific portion of the vibration apparatus 130 from being damaged.

The inner housing 170 can be coupled to the vibration member 110 through a connection member 117 (or a third connection member). The connection member 117 (or the third connection member) can couple inner housing 170 to the vibration member 110.

The connection member 117 according to an embodiment of the present disclosure can include an adhesive layer (or a tacky layer) which is good in adhesive force or attaching force. For example, the connection member 117 can include a double-sided adhesive tape, a double-sided foam pad, or a tacky sheet. For example, when the connection member 117 includes a tacky sheet or adhesive film (or a tacky layer), the connection member 117 can include only an adhesive layer or a tacky layer without a base member such as a plastic material or the like.

The adhesive layer (or a tacky layer) of the connection member 117 according to an embodiment of the present disclosure can include epoxy, acrylic, silicone, or urethane, but embodiments of the present disclosure are limited thereto.

The adhesive layer (or a tacky layer) of the connection member 117 according to another embodiment of the present disclosure can include a pressure sensitive adhesive (PSA), an optically clear adhesive (OCA), or an optically clear resin (OCR), but embodiments of the present disclosure are limited thereto.

With reference to FIGS. 1 and 16, the sound apparatus 10 according to another embodiment of the present disclosure can further include a secondary vibration member 115 between the vibration apparatus 130 and the vibration member 110 and can further include a connection member 119 (or a fourth connection member) between the secondary vibration member 115 and the vibration member 110.

The secondary vibration member 115 can include a metal material or a nonmetal material (or a composite nonmetal material) having a material characteristic suitable for outputting a sound based on a vibration. The metal material of the secondary vibration member 115 according to an embodiment of the present disclosure can include any one or more materials of stainless steel, aluminum (Al), an Al alloy, magnesium (Mg), a Mg alloy, and a magnesium-lithium (Mg—Li) alloy, but embodiments of the present disclosure are not limited thereto. The nonmetal material (or the composite nonmetal material) of the secondary vibration member 115 can include one or more of glass, plastic, fiber, leather, wood, cloth, rubber, carbon, and paper, but embodiments of the present disclosure are not limited thereto.

The connection member 119 according to an embodiment of the present disclosure can include an adhesive layer (or a tacky layer) which is good in adhesive force or attaching force. For example, the connection member 119 can include a double-sided adhesive tape, a double-sided foam pad, or a tacky sheet. For example, when the connection member 119 includes a tacky sheet (or a tacky layer), the connection member 119 can include only an adhesive layer or a tacky layer without a base member such as a plastic material or the like.

The adhesive layer (or a tacky layer) of the connection member 119 according to an embodiment of the present disclosure can include epoxy, acrylic, silicone, or urethane, but embodiments of the present disclosure are limited thereto.

The adhesive layer (or a tacky layer) of the connection member 119 according to another embodiment of the present disclosure can include a pressure sensitive adhesive (PSA), an optically clear adhesive (OCA), or an optically clear resin (OCR), but embodiments of the present disclosure are limited thereto.

Moreover, according to an embodiment of the present disclosure, the secondary vibration member 115, the vibration apparatus 130 at the rear surface of the secondary vibration member 115, and the inner housing 170 coupled to the secondary vibration member 115 can be provided as a module type. Accordingly, a vibration apparatus module including the secondary vibration member 115, the vibration apparatus 130, and the inner housing 170 can be assembled as a predetermined configuration, and then, can be connected or coupled to a rear surface of the vibration member 110 by the connection member 119 as needed.

With reference to FIGS. 1 and 17, a sound apparatus 10 according to another embodiment of the present disclosure can further include a sound processing circuit 190 mounted at a bottom portion of the inner housing 170, and the sound processing circuit 190 can be connected to a vibration apparatus 130 through a signal cable 132.

The sound processing circuit 190 can be connected to the signal cable 132, or can be mounted at the signal cable 132. The sound processing circuit 190 can be protected from impacts and outside elements by being housed within a chamber inside the inner housing 170.

The sound processing circuit 190 according to an embodiment of the present disclosure can include a decoding part which receives sound data supplied from an external sound data generating circuit part, an audio amplifier circuit which outputs first and second vibration driving signals based on the sound data supplied from the decoding part, a memory circuit which stores a setting value of the audio amplifier circuit, a control circuit which controls an operation of each of the decoding part, the audio amplifier circuit, and the memory circuit, and a passive element such as a resistor.

The sound processing circuit 190 can generate first and second vibration driving signals based on the sound data and can output each of the generated first and second vibration driving signals to a corresponding terminal of first and second terminals through each of a corresponding contact pad and a corresponding driving signal supply line. Therefore, a vibration apparatus 130 can vibrate based on the first and second vibration driving signals which are supplied from the sound processing circuit 190 through each of a signal line of the signal cable 132, the first and second terminals, a pad portion, and first and second power supply lines.

Figure 18A:
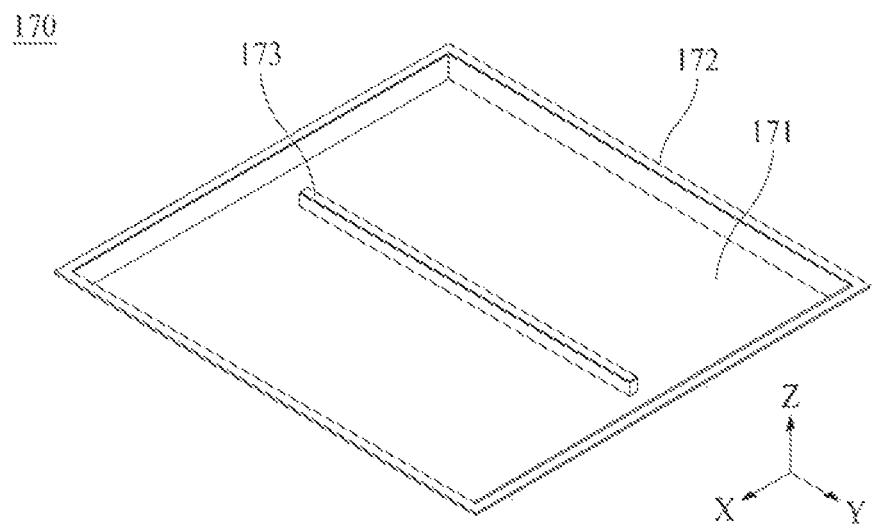
FIGS. 18A and 18B are perspective views illustrating an inner housing according to embodiments of the present disclosure.
Figure 18B:
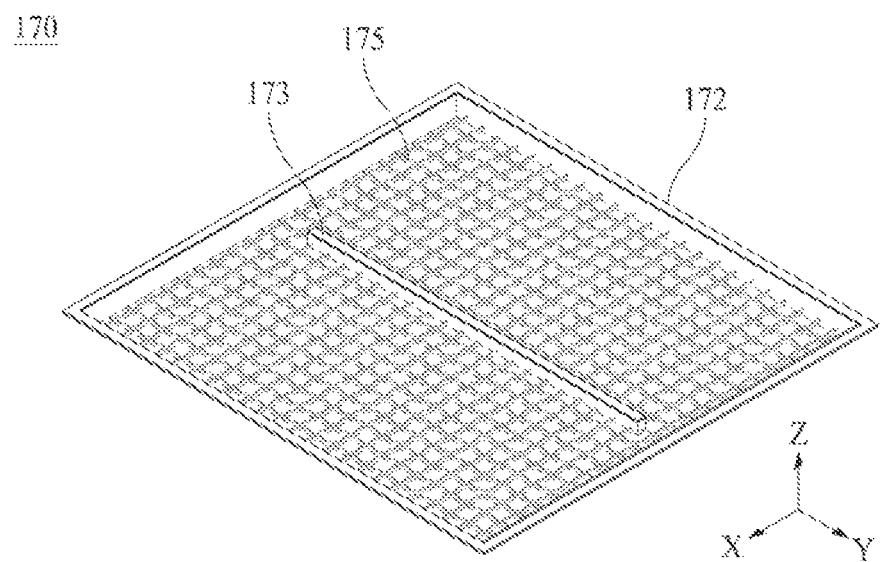
Figure 19A:
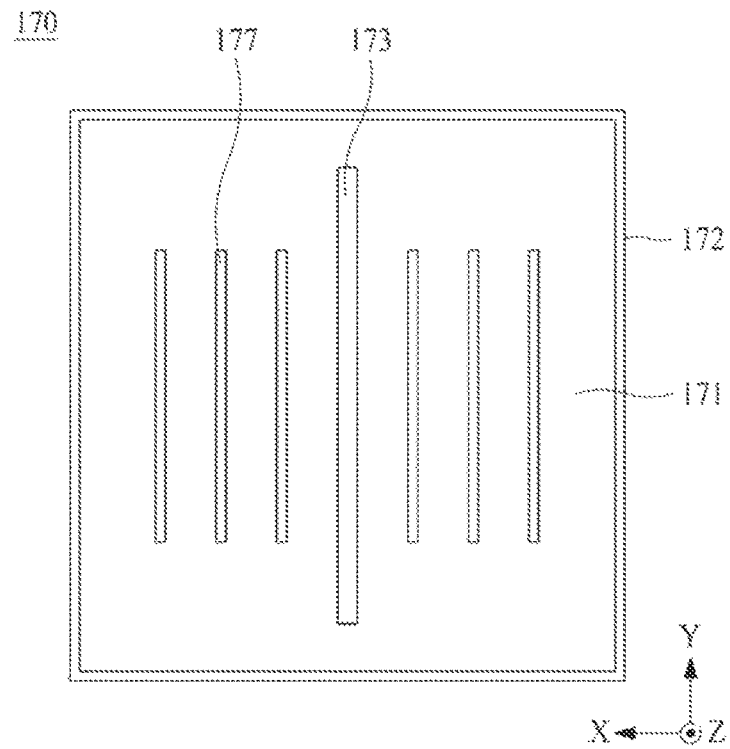
FIGS. 19A, 19B, and 19C are plan views illustrating an inner housing according to embodiments of the present disclosure.
Figure 19B:
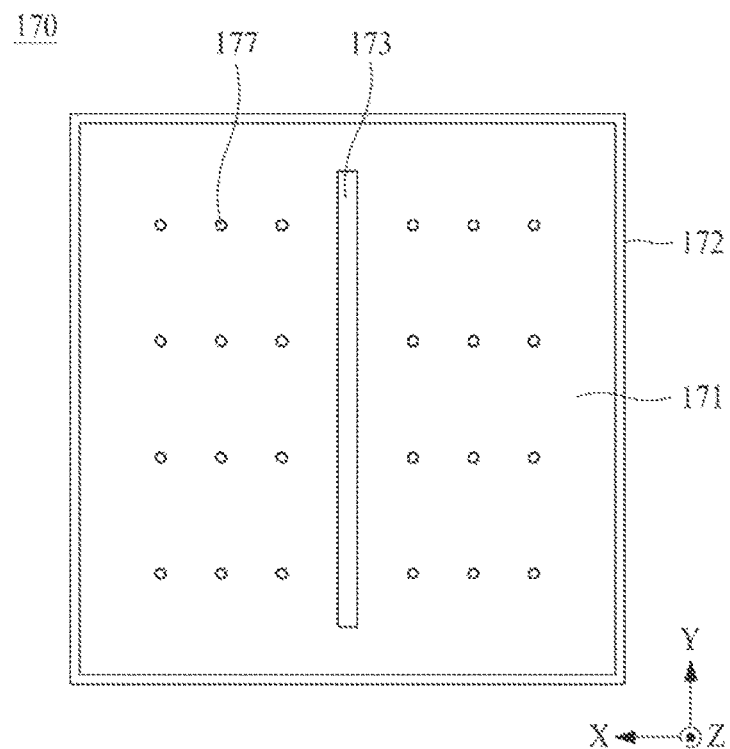
Figure 19C:
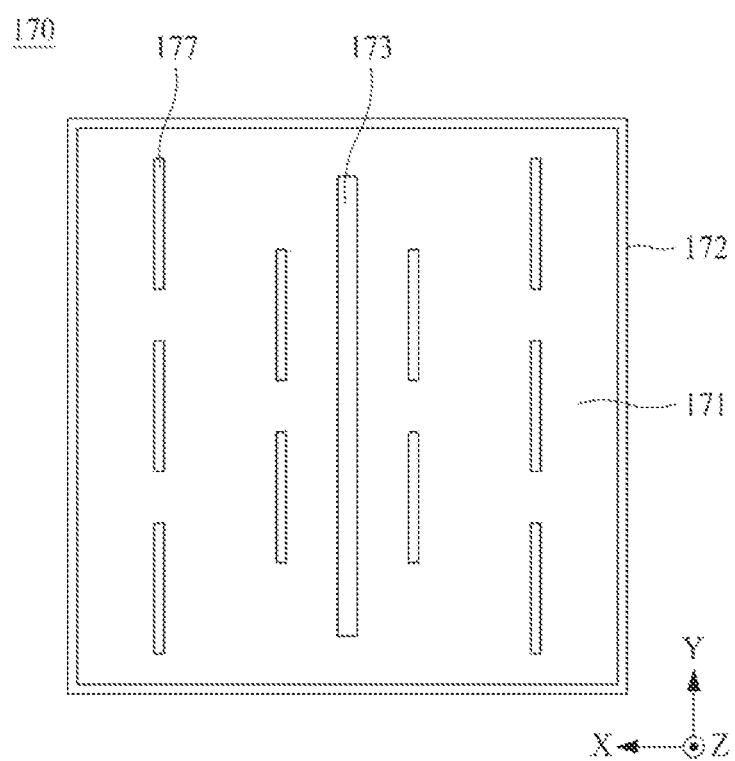

FIGS. 18A and 18B are a perspective view illustrating an inner housing according to an embodiment of the present disclosure. FIGS. 19A, 19B, and 19C are a plan view illustrating an inner housing according to an embodiment of the present disclosure.

With reference to FIG. 18A, the inner housing 170 can further include a first reinforcement member 173 which is formed to protrude toward a vibration apparatus 130 from a bottom portion 171 thereof.

The first reinforcement member 173 can be formed to protrude toward the vibration apparatus 130 from a center portion of the bottom portion 171 and can be configured to contact the vibration apparatus 130. The first reinforcement member 173 can have a certain width at a portion contacting the vibration apparatus 130 or can be implemented in a stumpy shape and can have a height capable of contacting the vibration apparatus 130.

When an impact is applied from the outside (for example, a rear surface of the bottom portion 171), the first reinforcement member 173 can disperse a dotted-contact impact into a line-contact impact, thereby preventing a specific portion of the vibration apparatus 130 from being damaged by spreading the force out across a larger area.

With reference to FIG. 18B, the inner housing 170 can further include a second reinforcement member 175 which is formed to protrude toward a vibration apparatus 130 form the bottom portion 171 thereof.

The second reinforcement member 175 can be formed to protrude toward the vibration apparatus 130 in a mesh form or a net network form at all regions of the bottom portion 171 except a region where the first reinforcement member 173 is provided and can be configured not to contact the vibration apparatus 130. An upper end of the second reinforcement member 175 can have a certain width or can be configured in a stumpy shape and can have a height which is lower than the first reinforcement member 173. For example, the first reinforcement member 173 and the second reinforcement member 175 can have the same width. For example, the second reinforcement member 175 can have an egg crate type of structure or a honeycomb type of structure.

When an impact is applied from the outside (for example, a rear surface of the bottom portion 171), the first reinforcement member 173 can disperse a dotted-contact impact into a line-contact impact, thereby preventing a specific portion of the vibration apparatus 130 from being damaged.

When an impact is applied from the outside (for example, a rear surface of the bottom portion 171), the second reinforcement member 175 can disperse a dotted-contact impact to be similar to a surface contact in a mesh structure, thereby preventing a specific portion of the vibration apparatus 130 from being damaged by spreading out the force across a larger area.

With reference to FIGS. 19A to 19C, the inner housing 170 can further include an opening portion 177 which communicates a first surface (or an upper surface) of the bottom portion 191 with a second surface (or a lower surface) of the bottom portion 191. The opening portion 177 can be formed in a slit shape formed in parallel with a second direction Y, or can be formed like a cylindrical hole having a certain standard. However, in the present disclosure, when the opening portion 177 is configured in a slit shape, a long side of the opening portion 177 having a slit shape is not limited to be parallel with the second direction Y. In addition, the opening portion 177 having a cylindrical hole shape in FIG. 19B is not limited in shape and can be prepared in various shapes as well as an opening portion having a cylindrical hole shape.

In FIGS. 19A to 19C, with respect to a plane, a cross-sectional area of a plurality of opening portions can be variously adjusted. For example, a sum of cross-sectional areas of opening portions 177 having a plurality of slit shapes can be adjusted to an area of 700 mm$^2$ to 1,000 mm$^2$ in FIG. 19A, a sum of cross-sectional areas of opening portions 177 having a plurality of cylindrical hole shapes can be adjusted to an area of 50 mm$^2$ to 200 mm$^2$ in FIG. 19B, and a sum of cross-sectional areas of opening portions 177 having a plurality of slit shapes can be adjusted to an area of 500 mm$^2$ to 700 mm$^2$ in FIG. 19C.

According to an embodiment of the present disclosure, when a plurality of opening portions 177 capable of communication of air are formed in a rear surface of the vibration apparatus 130, a close space surrounding the vibration apparatus 130 can be configured to communicate with a rear surface of the inner housing 170, and in this situation, an impedance component (or an air impedance or an elastic impedance) acting on the vibration member 110 can vary. The holes can all allow air to pass in and out of one or more sound chambers within the inner housing 170. For example, when a plurality of opening portions are formed in the inner housing 170, a sound characteristic of the high-pitched sound band can be enhanced.

Figure 20:
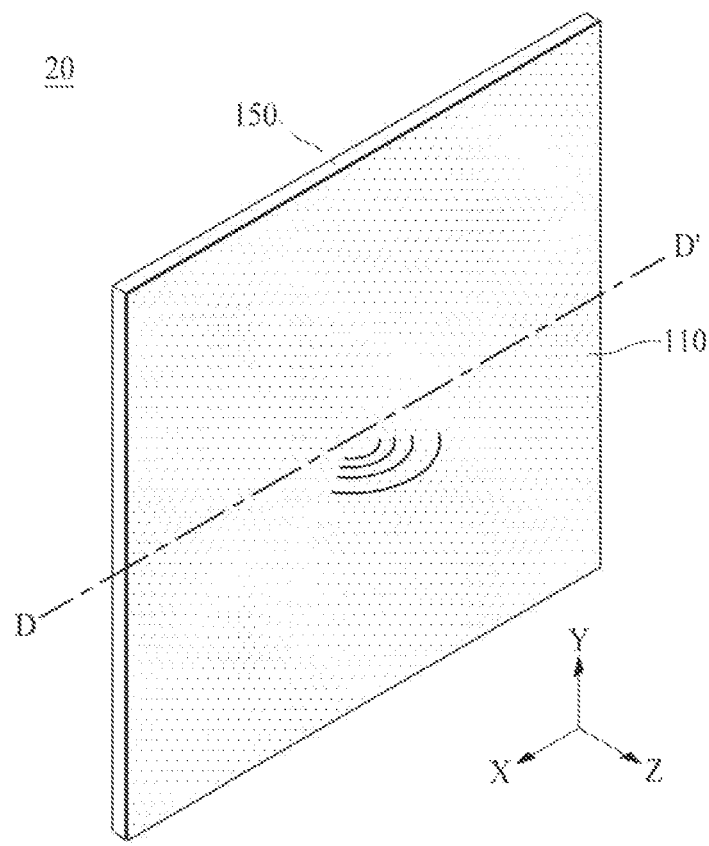
FIG. 20 is a perspective view illustrating a sound apparatus according to another embodiment of the present disclosure.
Figure 21:
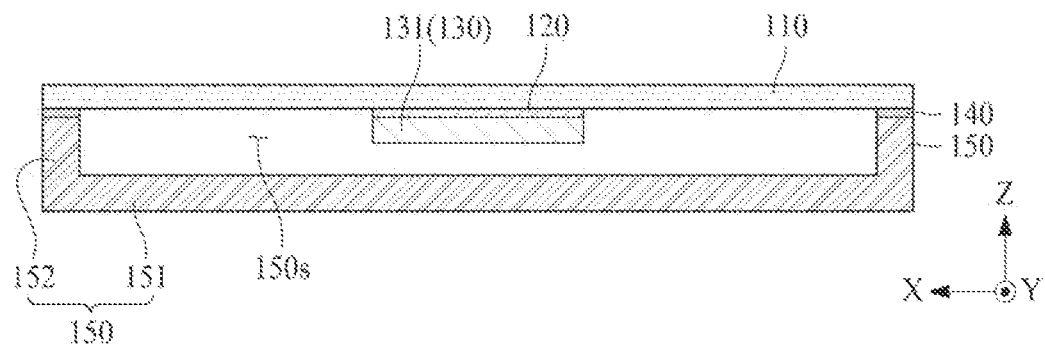
FIG. 21 is a cross-sectional view taken along line D-D' illustrated in FIG. 20 according to an embodiment of the present disclosure.
Figure 22:
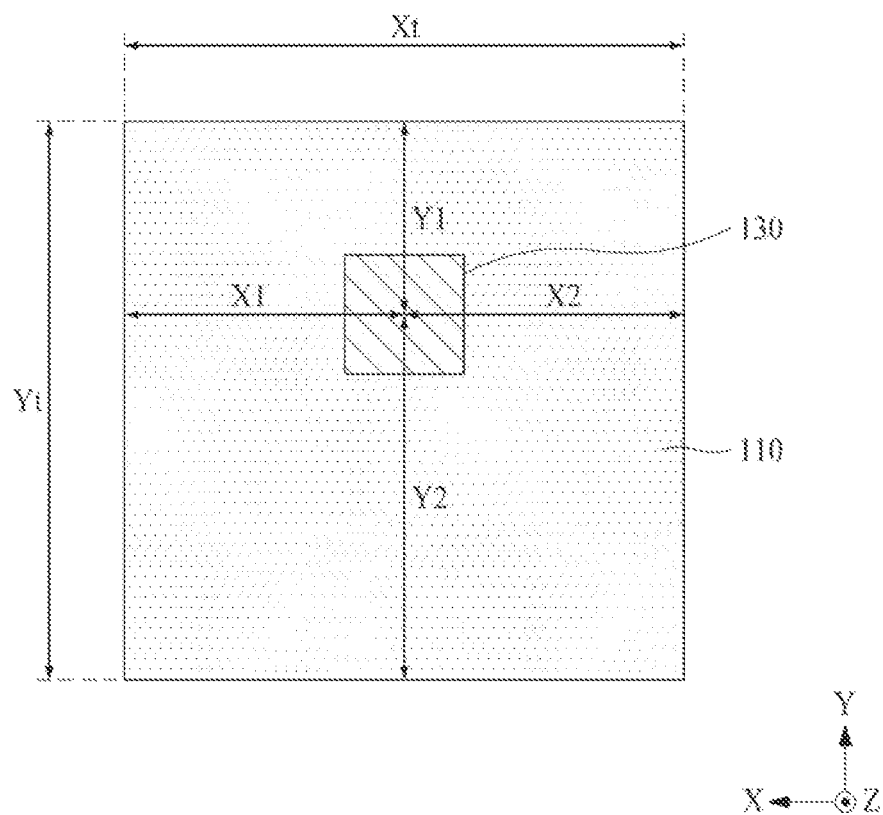
FIG. 22 illustrates an arrangement structure of a vibration apparatus on a rear surface of a vibration member according to an embodiment of the present disclosure.

FIG. 20 is a perspective view of a sound apparatus according to another embodiment of the present disclosure. FIG. 21 is a cross-sectional view taken along line D-D' of FIG. 20. FIG. 22 illustrates an arrangement structure of a vibration apparatus on a rear surface of a vibration member. A sound apparatus 20 of FIG. 20 is implemented by modifying a structure so that a dimension of the sound apparatus 10 of FIG. 1 in a first direction X is the same as a dimension of the sound apparatus 10 of FIG. 1 in a second direction Y. In the following description, therefore, repetitive descriptions of the other elements except an arrangement structure of each of a vibration member 110 and a vibration apparatus 130 may be omitted.

With reference to FIGS. 20 and 21, the sound apparatus according to another embodiment of the present disclosure can be configured so that a dimension thereof in a first direction X is the same as a dimension thereof in a second direction Y. In addition, a structure of each of a vibration member 110 and a housing 150 in the sound apparatus 20 of FIG. 21 can be applied to be identical to a structure of each of the vibration member 110 and the housing 150 of the sound apparatus 10 described above with reference to FIGS. 2, 3, and 11 to 17.

With reference to FIG. 22, the vibration member 110 can have a length corresponding to Xt in a first direction X and can have a length corresponding to Yt in a second direction Y. According to another embodiment of the present disclosure, in the vibration member 110, Xt in the first direction X can be adjusted to the same length as Yt in the second direction Y, and thus, the vibration member 110 can be prepared in a square shape. The vibration apparatus 130 can be disposed at a second surface (or a rear surface) of the vibration member 110.

With respect to a direction parallel with the first direction X, a length from one side of the vibration member 110 to a center portion of the vibration apparatus 130 can be a first length X1, and a length from the center portion of the vibration apparatus 130 to the other side of the vibration member 110 can be a second length X2. A sum of the first length X1 and the second length X2 can be the same length as the length Xt of the vibration member 110 in the first direction X.

With respect to a direction parallel with the second direction Y, a length from one side of the vibration member 110 to a center portion of the vibration apparatus 130 can be a first length Y1, and a length from the center portion of the vibration apparatus 130 to the other side of the vibration member 110 can be a second length Y2. A sum of the first length Y1 and the second length Y2 can be the same length as the length Yt of the vibration member 110 in the first direction Y.

According to another embodiment of the present disclosure, a sound characteristic of the sound apparatus 20 can be enhanced based on the optimal arrangement of a rear surface of the vibration member 110 of the vibration apparatus 130. For example, the vibration apparatus 130 may not be disposed at a center of the vibration member 110, and a sound characteristic can be enhanced in a direction biased toward the first direction X or the second direction Y from the center of the vibration member 110.

Figure 23:
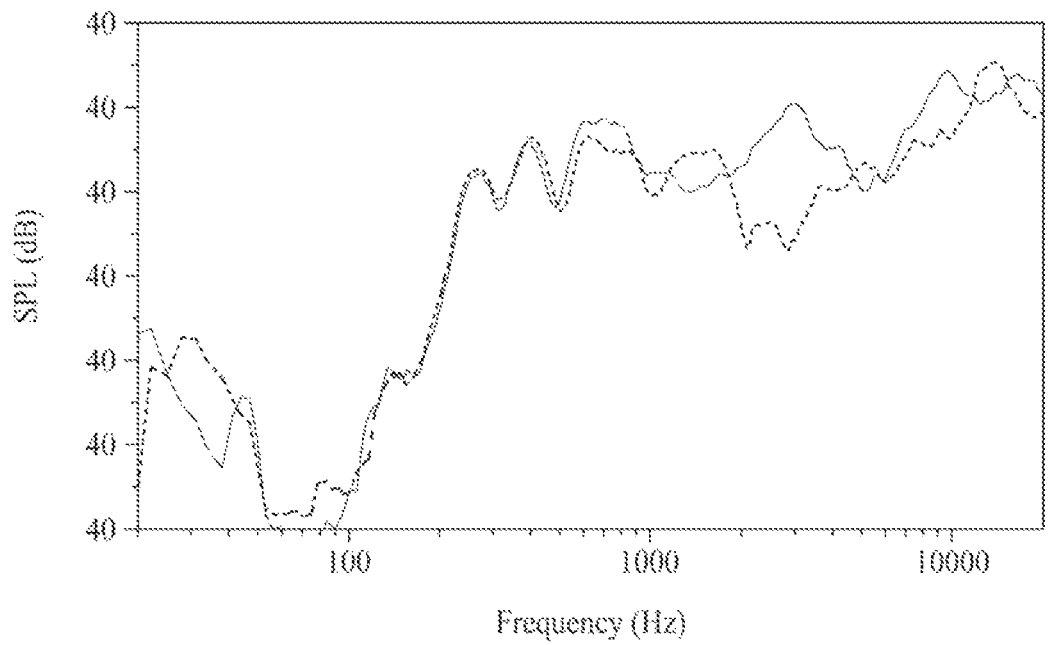
FIG. 23 illustrates a sound output characteristic of a sound apparatus where a vibration member protrusion portion is not provided in the sound apparatus of FIG. 2 according to an embodiment of the present disclosure.

FIG. 23 illustrates a sound output characteristic of a sound apparatus where a protrusion portion is not provided in the sound apparatus of FIG. 2.

A sound output characteristic can be measured by a sound analysis equipment. The sound output characteristic has been measured by a B&K audio measurement apparatus. The sound analysis equipment can include a sound card which transmits or receives a sound to or from a control personal computer (PC), an amplifier which amplifies a signal generated from the sound card and transfers the amplified signal to a vibration apparatus, and a microphone which collects a sound generated by the vibration apparatus in a display panel. For example, the microphone can be disposed at a center of the vibration apparatus, and a distance between the display panel and the microphone can be 50 cm. A sound can be measured under a condition where the microphone is vertical to the vibration apparatus. The sound collected through the microphone can be input to the control PC through the sound card, and a control program can check the input sound to analyze a sound of the vibration apparatus. For example, a frequency response characteristic corresponding to a frequency range of 100 Hz to 20 kHz can be measured by using a pulse program.

In FIG. 23, the abscissa axis represents a frequency in hertz (Hz), and the ordinate axis represents a sound pressure level SPL in decibels (dB). A solid line of FIG. 23 represents a sound output characteristic of the sound apparatus of FIG. 2, and a dotted line represents a sound output characteristic of a sound apparatus structure where the protrusion portion 111 is not provided in the sound apparatus structure of FIG. 2.

With reference to FIG. 23, comparing with a dotted line, in a solid line, it can be seen that a sound output characteristic is enhanced in a frequency range of 2,000 Hz to 4,000 Hz and 6 kHz to 10 kHz. For example, comparing with the dotted line, in the solid line, it can be seen that a sound pressure level is enhanced in the middle-pitched sound band and the high-pitched sound band. For example, comparing with the dotted line, in the solid line, it can be seen that a sound pressure level is averagely enhanced by about 10 dB or more in a frequency range of 2,000 Hz to 4,000 Hz and is enhanced by about 5 dB or more in a frequency range of 6 kHz to 10 kHz. In other words, the protrusion portion 111 can help improve the midrange sound frequencies produced by the vibration apparatus 130.

Figure 24:
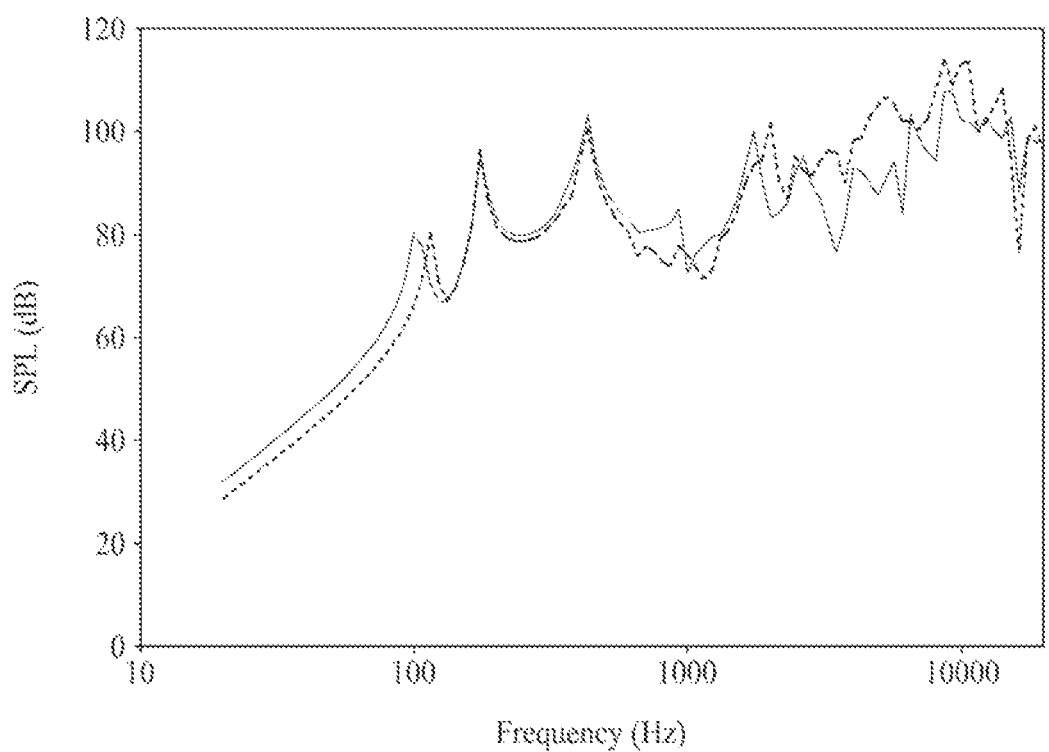
FIG. 24 illustrates a sound pressure level with respect to a frequency of a sound apparatus where a first groove portion is provided in the sound apparatus of FIG. 11 and is not provided in the sound apparatus of FIG. 12 according to embodiments of the present disclosure.

FIG. 24 illustrates a sound pressure level with respect to a frequency of a sound apparatus where a first groove portion 110a is provided in the sound apparatus of FIG. 11 and is not provided in the sound apparatus of FIG. 12.

A method of measuring a sound output characteristic can be the same as the descriptions of FIG. 23, and thus, repetitive descriptions thereof may be omitted.

In FIG. 24, the abscissa axis represents a frequency in hertz (Hz), and the ordinate axis represents a sound pressure level SPL in decibels (dB). A solid line of FIG. 24 represents a sound output characteristic of the sound apparatus of FIG. 11, and a dotted line represents a sound output characteristic of a sound apparatus structure where the first groove portion 110a is not provided in the sound apparatus structure of FIG. 12.

With reference to FIG. 24, comparing with a dotted line, in a solid line, it can be seen that a sound output characteristic is enhanced in a frequency range of 100 Hz or less, 500 Hz to 1,000 Hz, and 2000 Hz or more. For example, comparing with the dotted line, in the solid line, it can be seen that a sound pressure level is enhanced in the low-pitched sound band, the middle-pitched sound band, and the high-pitched sound band. For example, comparing with a dotted line, in a solid line, it can be seen that a sound output characteristic is averagely enhanced by about 5 dB in 100 Hz or less, it can be seen that the dip phenomenon is reduced in a frequency range of 500 Hz to 1,000 Hz, and it can be seen that the peak phenomenon of the high-pitched sound band is reduced in 2,000 Hz or more. In other words, the first groove portion 110a can help the vibration apparatus 130 improve bass response, improve midrange response, and dampen harsh high pitched sound levels.

FIGS. 25a to 25f illustrate a sound pressure level with respect to a frequency of the sound apparatus of FIG. 12 where a first groove portion is prepared through modification under various conditions.

A method of measuring a sound output characteristic can be the same as the descriptions of FIG. 23, and thus, repetitive descriptions thereof may be omitted.

In FIGS. 25a to 25e, the abscissa axis represents a frequency in hertz (Hz), and the ordinate axis represents a sound pressure level SPL in decibels (dB). In FIGS. 25a to 25e, a solid line represents a sound output characteristic of the sound apparatus of FIG. 12 where a thickness of a vibration member is set to 1 mm, and a dotted line represents a sound output characteristic of a sound apparatus structure where the first groove portion 110a is not provided in the sound apparatus structure of FIG. 12 and a thickness of the vibration member is set to 1 mm. In FIG. 25f, a solid line represents a sound output characteristic of a sound apparatus structure where the first groove portion 110a is not provided in the sound apparatus structure of FIG. 12 and a thickness of the vibration member is set to 3 mm.

In FIGS. 25a to 25f, the vibration member 110 can configures a material including acrylonitrile-butadiene-styrene (ABS).

In FIGS. 25a to 25e, an experiment has been performed under a condition where a thickness of the vibration member corresponding to the first groove portion 110a is adjusted to 1 mm, a length of the first groove portion 110a in the first direction X and the second direction Y is formed in the same square shape, and a length of one corner thereof is changed to 60 mm, 120 mm, 140 mm, 180 mm, and 240 mm, and a length of the vibration apparatus 130 in the first direction X and the second direction Y has been formed to 120 mm in the same square shape.

Figure 25A:
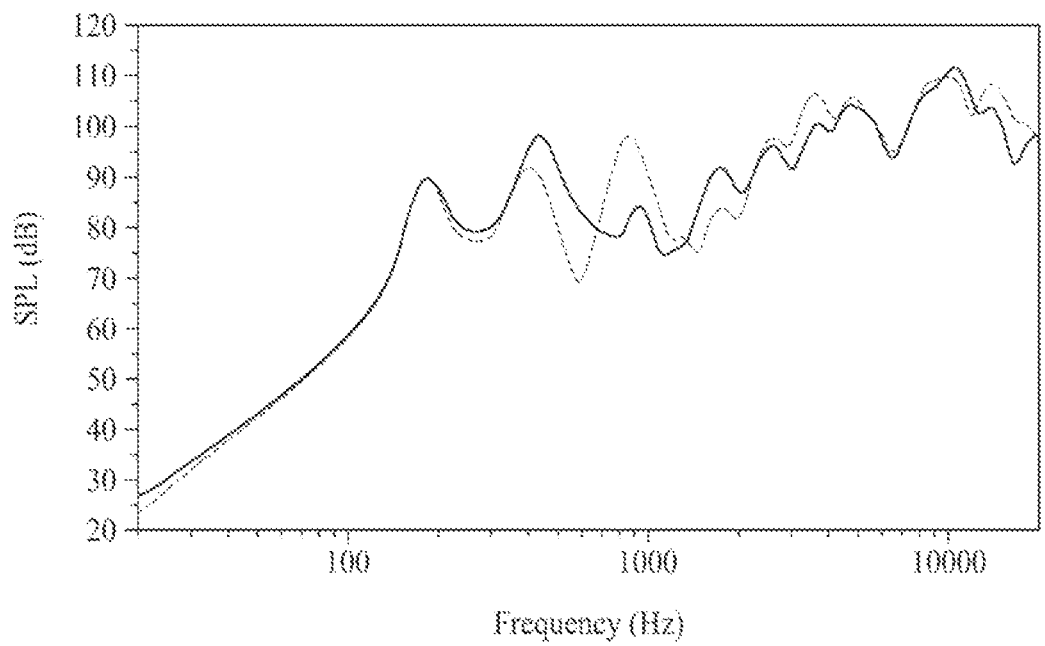
FIGS. 25a to 25f illustrate a sound pressure level with respect to a frequency of the sound apparatus of FIG. 12 where a first groove portion is prepared through modification under various conditions according to embodiments of the present disclosure.

With reference to FIG. 25a, when a length of the first groove portion 110a illustrated by a solid line in the first direction X and the second direction Y is adjusted to 60 mm, it can be seen that a low sound peak observed in a lowest frequency is measured to be a value of about 90 dB in about 190 Hz.

Comparing with a dotted line, in a solid line, it can be seen that a dip phenomenon of a middle-pitched sound band is improved and a sound pressure level of a high-pitched sound band is enhanced. For example, the middle-pitched sound band is a frequency range of 500 Hz to 1,000 Hz, and the high-pitched sound band can be a frequency range of more than 10 kHz.

Figure 25B:
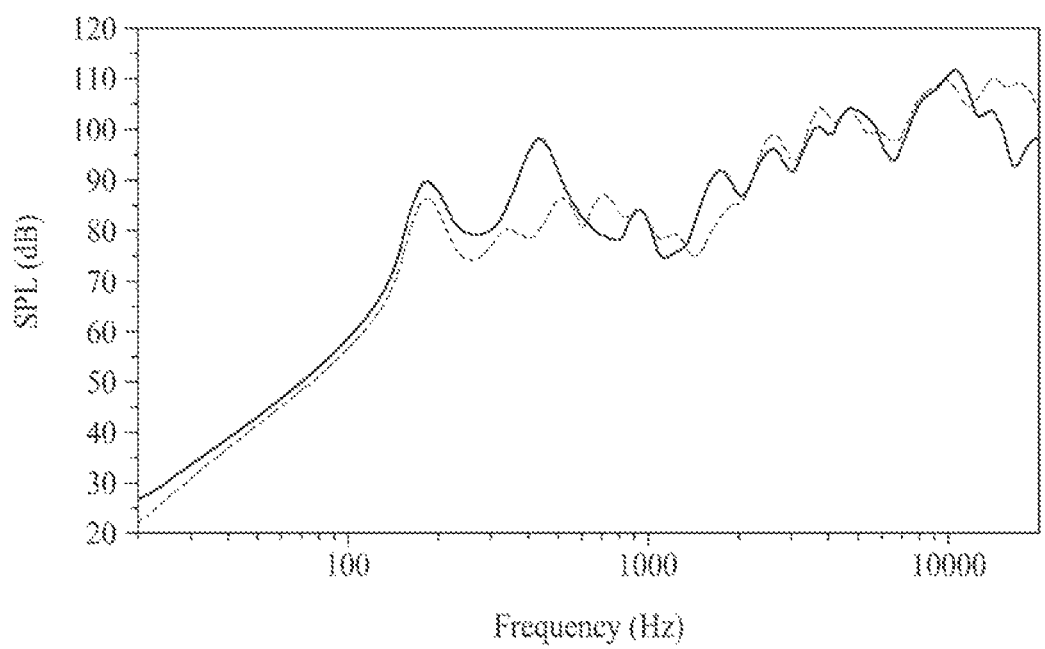

With reference to FIG. 25b, when a length of the first groove portion 110a illustrated by a solid line in the first direction X and the second direction Y is adjusted to 120 mm, it can be seen that a low sound peak observed in a lowest frequency is measured to be a value of about 85 dB in about 180 Hz.

Comparing with a dotted line, in a solid line, it can be seen that a sound pressure level of a high-pitched sound band is enhanced. For example, the high-pitched sound band can be a frequency range of more than 10 kHz.

Figure 25C:
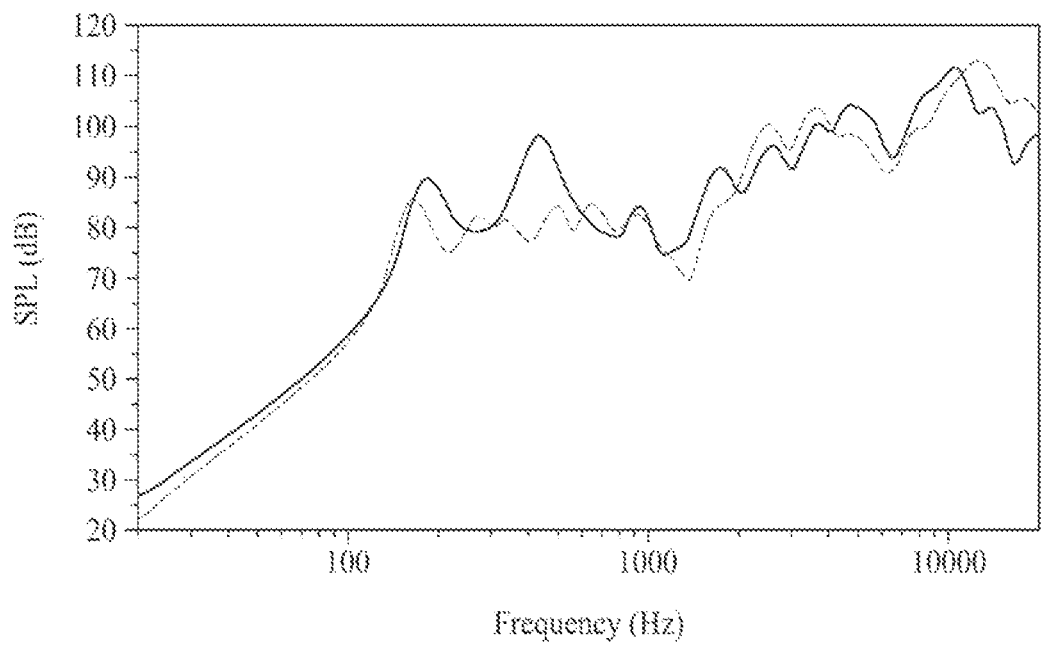

With reference to FIG. 25c, when a length of the first groove portion 110a illustrated by a solid line in the first direction X and the second direction Y is adjusted to 140 mm, it can be seen that a low sound peak observed in a lowest frequency is measured to be a value of about 85 dB in about 170 Hz.

Comparing with a dotted line, in a solid line, it can be seen that a sound pressure level of a high-pitched sound band is enhanced. For example, the high-pitched sound band can be a frequency range of more than 10 kHz.

Figure 25D:
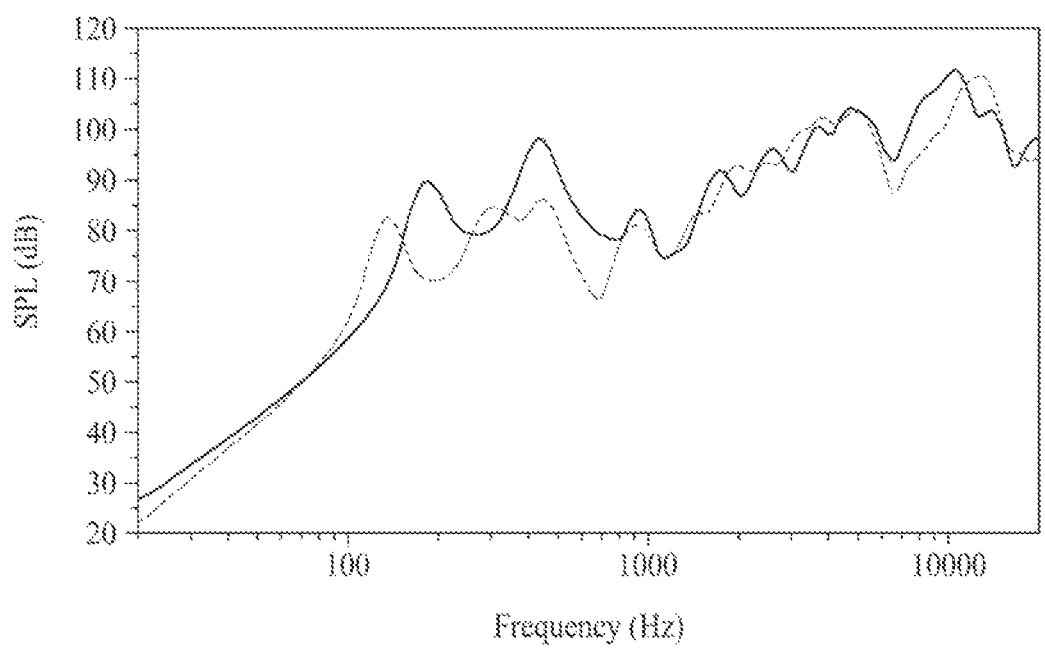

With reference to FIG. 25d, when a length of the first groove portion 110a illustrated by a solid line in the first direction X and the second direction Y is adjusted to 180 mm, it can be seen that a low sound peak observed in a lowest frequency is measured to be a value of about 82 dB in about 150 Hz.

Comparing with a dotted line, in a solid line, it can be seen that a sound pressure level characteristic of the low-pitched sound band is enhanced and a sound pressure level of a high-pitched sound band is enhanced. For example, the low-pitched sound band can be a frequency range of less than 200 Hz, and the high-pitched sound band can be a frequency range of more than 10 kHz.

Figure 25E:
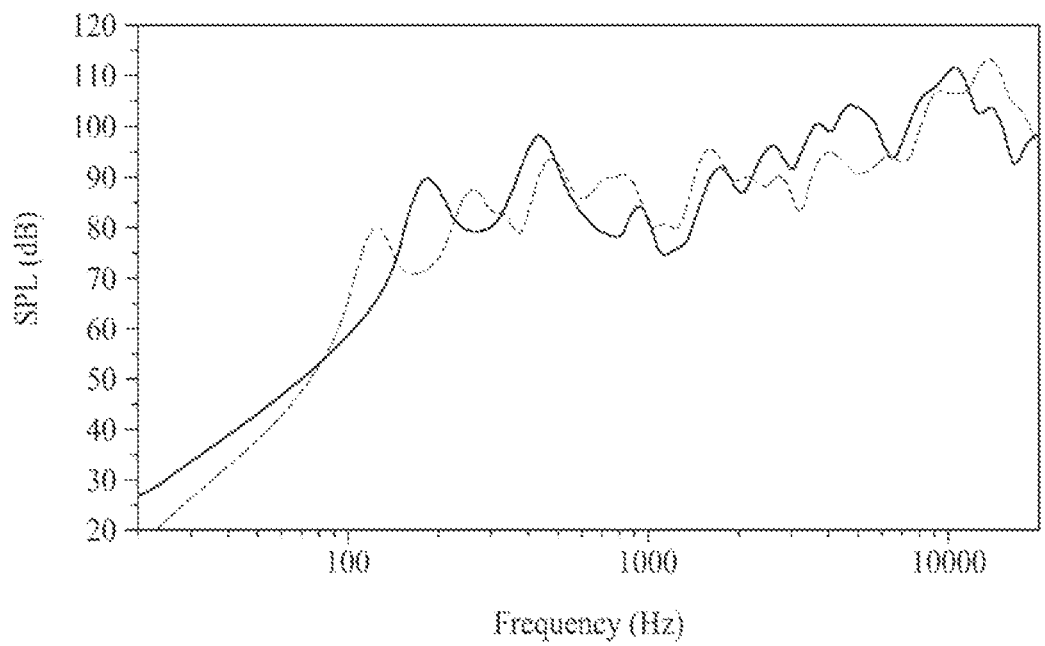
Figure 25F:
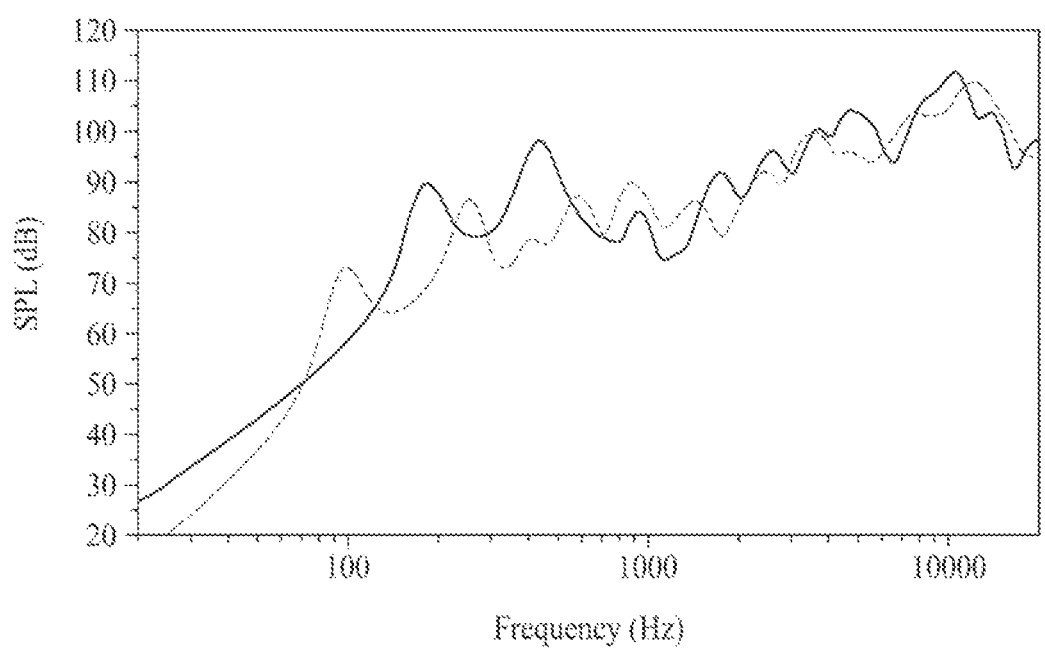

With reference to FIG. 25e, when a length of the first groove portion 110a illustrated by a solid line in the first direction X and the second direction Y is adjusted to 240 mm, it can be seen that a low sound peak observed in a lowest frequency is measured to be a value of about 80 dB in about 130 Hz.

Comparing with a dotted line, in a solid line, it can be seen that a sound pressure level characteristic of the low-pitched sound band is enhanced, a sound pressure level characteristic of the middle-pitched sound band is enhanced, and a sound pressure level characteristic of the high-pitched sound band is enhanced. Also, comparing with a dotted line, in a solid line, it can be seen that the flatness of a total sound pressure level is improved in a frequency range of 200 Hz or more. For example, the low-pitched sound band can be a frequency range of less than 200 Hz, the middle-pitched sound band can be a frequency range of 500 Hz to 2,000 kHz, and the high-pitched sound band can be a frequency range of more than 10 kHz.

With reference to FIG. 25f, when a thickness of the vibration member 110 is adjusted to 3 mm, it can be seen that a low sound peak observed in the lowest frequency is measured to be a value of about 72 dB in about 100 Hz. Comparing with a dotted line, in a solid line, it can be seen that a sound pressure level characteristic of the low-pitched sound band is enhanced.

With reference to results of FIGS. 25a to 25e, it has been confirmed that a low sound peak observed in a low frequency moves in a lowering direction as a relative length of the first groove portion 110a in the first direction X and the second direction Y with respect to the vibration apparatus 130 increases progressively. In other words, as the length of the first groove portion 110a is made longer, a sound peak for the bass response moves to lower and lower sound frequencies, thus improving the lower range response. Accordingly, it can be seen that a sound characteristic of the low-pitched sound band increases as a size of the first groove portion 110a increases compared to the vibration apparatus 130.

FIGS. 26a to 26e illustrate a sound pressure level with respect to a frequency of the sound apparatus of FIG. 12 which is provided by changing a thickness of a vibration member corresponding to a first groove portion under various conditions.

A method of measuring a sound output characteristic can be the same as the descriptions of FIG. 23, and thus, repetitive descriptions thereof may be omitted.

In FIGS. 26a to 26e, the abscissa axis represents a frequency in hertz (Hz), and the ordinate axis represents a sound pressure level SPL in decibels (dB). In FIGS. 26a to 26e, a solid line represents a sound output characteristic of the sound apparatus of FIG. 12 where a thickness of the vibration member 110 corresponding to the first groove portion 110a is adjusted to 0.5 mm to 2.5 mm, and a dotted line represents a sound output characteristic of a sound apparatus structure where the first groove portion 110a is not provided in the sound apparatus structure of FIG. 12 and a thickness of the vibration member is adjusted to 3 mm. In addition, a length of the first groove portion 110a in the first direction X and the second direction Y is adjusted to 240 mm in FIGS. 26a to 26e, and the vibration member 110 in FIGS. 26A to 26E includes a material including acrylonitrile-butadiene-styrene (ABS).

Figure 26A:
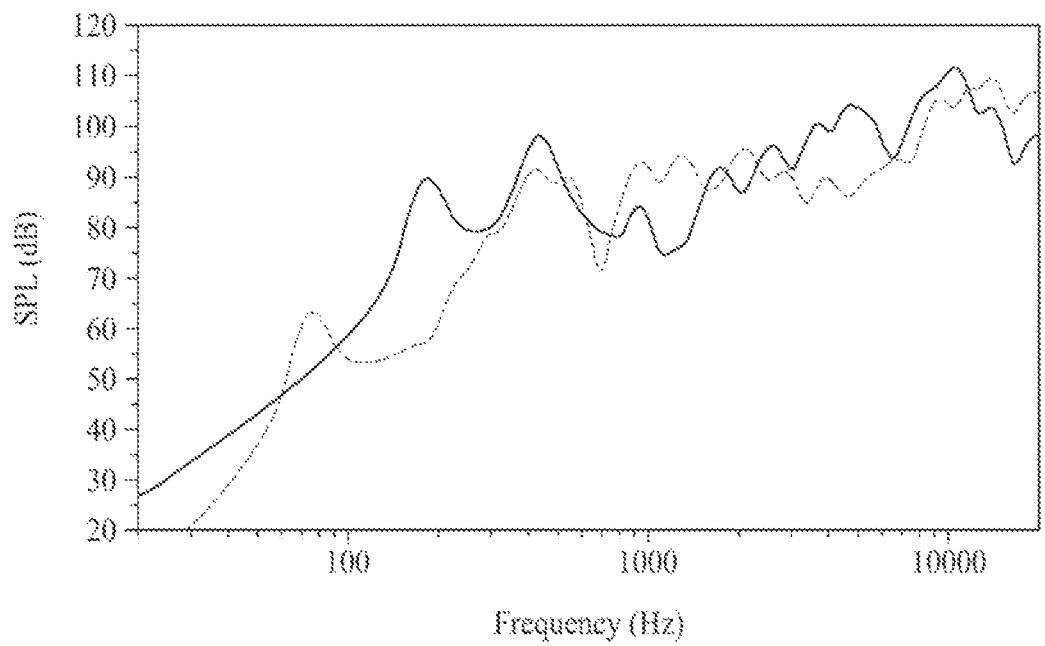
FIGS. 26a to 26e illustrate a sound pressure level with respect to a frequency of the sound apparatus of FIG. 12 which is provided by changing a thickness of a vibration member corresponding to a first groove portion under various conditions according to embodiments of the present disclosure.

With reference to FIG. 26a, in the dotted line, it can be seen that a low sound peak observed in the lowest frequency is measured to be a value of about 90 dB in about 180 Hz. In the solid line, when a thickness of the vibration member 110 corresponding to the first groove portion 110a is adjusted to 0.5 mm, a low sound peak observed in the lowest frequency is measured to be a value of about 62 dB in about 70 Hz. Therefore, when a thickness of the vibration member 110 is adjusted to 1.0 mm or less, because the bending stiffness of the vibration member 110 for appropriate driving of the vibration apparatus 130 is not satisfied, the sound characteristic efficiency of a low-pitched sound band may be reduced. For example, the low-pitched sound band may be a frequency range of less than 200 Hz.

Figure 26B:
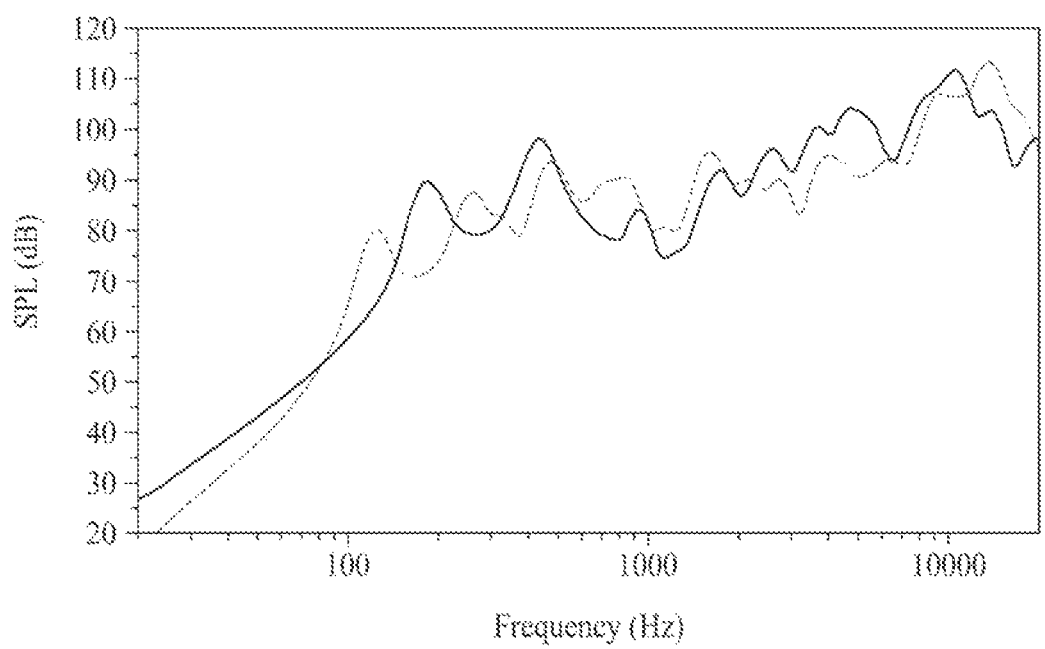

With reference to FIG. 26b, in the dotted line, it can be seen that a low sound peak observed in the lowest frequency is measured to be a value of about 90 dB in about 180 Hz. In the solid line, when a thickness of the vibration member 110 corresponding to the first groove portion 110a is adjusted to 1.0 mm, a low sound peak observed in the lowest frequency is measured to be a value of about 80 dB in about 130 Hz.

Comparing with the dotted line, in the solid line, it can be seen that a sound pressure level characteristic of the low-pitched sound band and a sound pressure level characteristic of the high-pitched sound band are enhanced, and a peak phenomenon of a middle-high-pitched sound band is reduced. For example, the low-pitched sound band can be a frequency range of less than 200 Hz, and the middle-high-pitched sound band can be a frequency range of 2,000 Hz to 5,000 kHz. The high-pitched sound band can be a frequency range of more than 10 kHz.

Figure 26C:
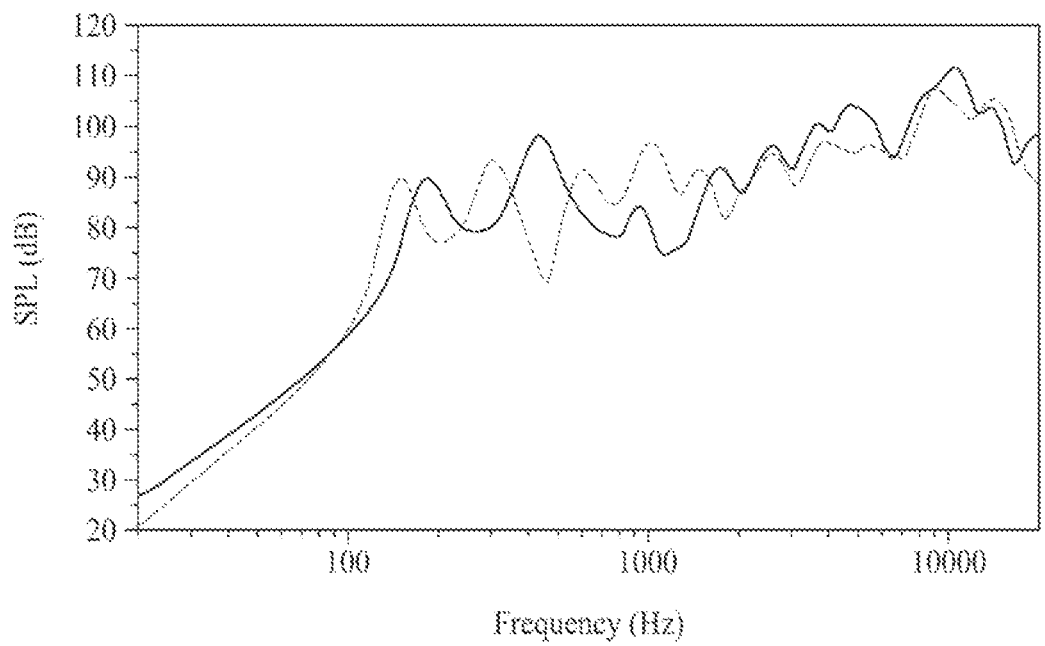

With reference to FIG. 26c, in the dotted line, it can be seen that a low sound peak observed in the lowest frequency is measured to be a value of about 90 dB in about 180 Hz. In the solid line, when a thickness of the vibration member 110 corresponding to the first groove portion 110a is adjusted to 1.5 mm, a low sound peak observed in the lowest frequency is measured to be a value of about 90 dB in about 150 Hz.

Comparing with the dotted line, in the solid line, it can be seen that a sound pressure level characteristic of the low-pitched sound band is enhanced, a peak phenomenon of the middle-high-pitched sound band is reduced, and the flatness of a sound pressure level is improved in a full frequency range of 200 Hz or more. For example, the low-pitched sound band can be a frequency range of less than 200 Hz, and the middle-high-pitched sound band can be a frequency range of 2,000 Hz to 5,000 kHz.

Figure 26D:
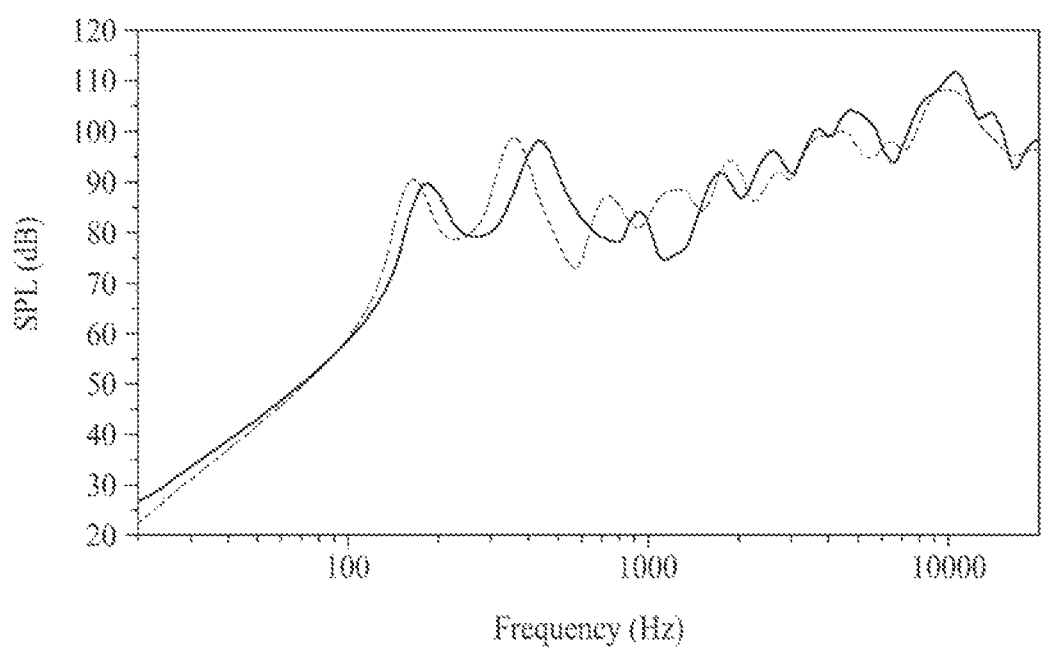

With reference to FIG. 26d, in the dotted line, it can be seen that a low sound peak observed in the lowest frequency is measured to be a value of about 90 dB in about 180 Hz. In the solid line, when a thickness of the vibration member 110 corresponding to the first groove portion 110a is adjusted to 2.0 mm, a low sound peak observed in the lowest frequency is measured to be a value of about 90 dB in about 170 Hz. Comparing with the dotted line, in the solid line, it can be seen that a sound pressure level characteristic of the low-pitched sound band is enhanced, the flatness of a sound pressure level is improved in a full frequency range of 200 Hz or more, and a peak phenomenon of the middle-pitched sound band is reduced. For example, the low-pitched sound band can be a frequency range of less than 200 Hz, and the middle-pitched sound band can be a frequency range of 500 Hz to 2,000 kHz.

Figure 26E:
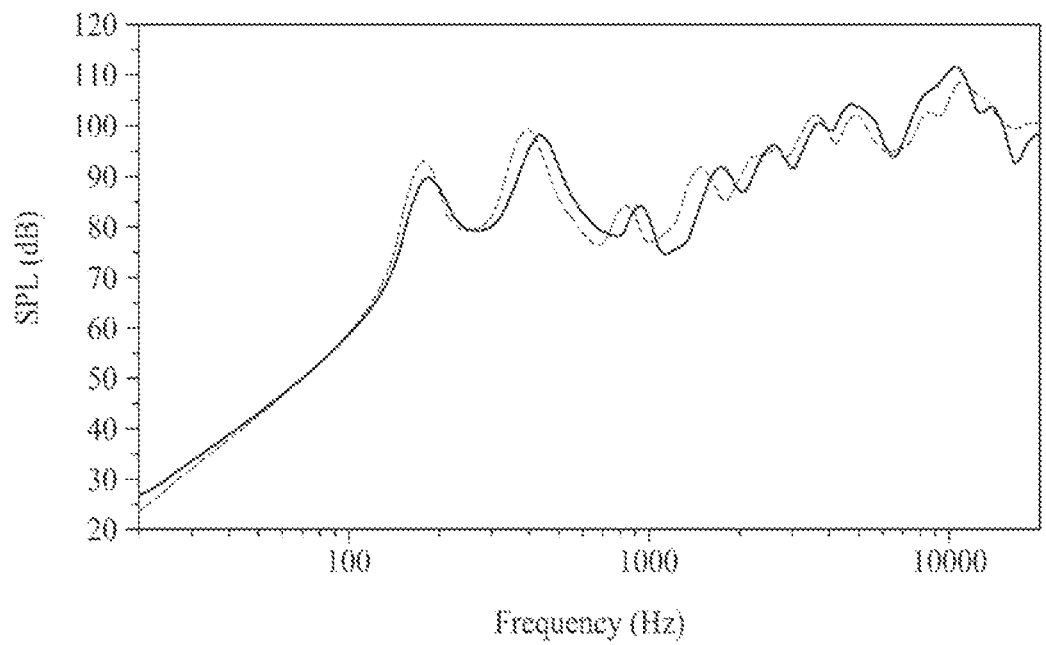

With reference to FIG. 26e, in the dotted line, it can be seen that a low sound peak observed in the lowest frequency is measured to be a value of about 90 dB in about 180 Hz. In the solid line, when a thickness of the vibration member 110 corresponding to the first groove portion 110a is adjusted to 2.5 mm, a low sound peak observed in the lowest frequency is measured to be a value of about 92 dB in about 180 Hz. Comparing with the dotted line, in the solid line, it can be seen that a sound pressure level characteristic of the low-pitched sound band is enhanced, the flatness of a sound pressure level is improved in a full frequency range of 200 Hz or more. For example, the low-pitched sound band can be a frequency range of less than 200 Hz.

With reference to results of FIGS. 26a to 26e, a thickness of the vibration member 110 corresponding to the first groove portion 110a can be adjusted to have a thickness which is greater than or equal to a least thickness, to secure bending stiffness based on the vibration apparatus 130. For example, when the vibration member 110 includes a material including ABS, a lowest thickness can be adjusted to 1 mm, and for example, the bending stiffness of the vibration member 110 can be 0.20 Nm or more. Also, when the first groove portion 110a is provided and the vibration member 110 satisfies a desired thickness, a sound characteristic of the low-pitched sound band can be enhanced, the flatness of a sound pressure level can be improved across a full frequency range, and a dip phenomenon of the middle-pitched sound band and a peak of the high-pitched sound band can be reduced. In other words, a sound frequency response having improved flatness can be provided by appropriately adjusting a thickness of the first groove portion 110a.

Figure 27:
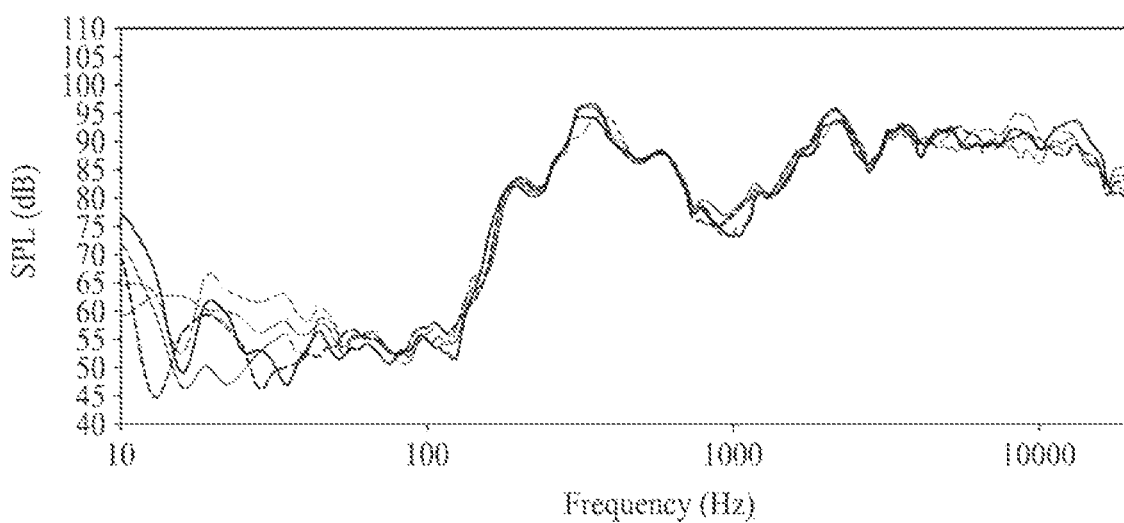
FIG. 27 illustrates a sound pressure level with respect to a frequency of a sound apparatus to which a structure of the inner housing of FIGS. 18A, 18B, 19A, 19B, and 19C is applied, according to embodiments of the present disclosure.

FIG. 27 illustrates a sound pressure level with respect to a frequency of a sound apparatus to which a structure of the inner housing of FIGS. 18A, 18B, 19A, 19B, and 19C is applied.

A method of measuring a sound output characteristic can be the same as the descriptions of FIG. 23, and thus, repetitive descriptions thereof may be omitted.

In FIG. 27, the abscissa axis represents a frequency in hertz (Hz), and the ordinate axis represents a sound pressure level SPL in decibels (dB).

In FIG. 27, a thick solid line represents a sound output characteristic of a sound apparatus to which a structure of the inner housing 150 of FIG. 18A is applied, a thin solid line represents a sound output characteristic of a sound apparatus to which a structure of the inner housing 150 of FIG. 18B is applied, a thick dotted line represents a sound output characteristic of a sound apparatus to which a structure of the inner housing 150 of FIG. 19A is applied, a thin dotted line represents a sound output characteristic of a sound apparatus to which a structure of the inner housing 150 of FIG. 19B is applied, and a dash-single dotted line represents a sound output characteristic of a sound apparatus to which a structure of the inner housing 150 of FIG. 19C is applied.

With reference to FIG. 27, in the sound apparatuses 10 illustrated by the thick solid line, the thin solid line, the thick dotted line, the thin dotted line, and the dash-single dotted line, it can be seen that a difference between sound output characteristics hardly occur in a frequency range of a middle-high-pitched sound band or less. Comparing with the thick solid line, the thin solid line, the thin dotted line, and the dash-single dotted line, in the thick dotted line, it can be seen that a sound pressure level is enhanced in a frequency range of a high-pitched sound band. For example, the high-pitched sound band can be in a frequency range of 8,000 Hz to 10,000 Hz.

Figure 28:
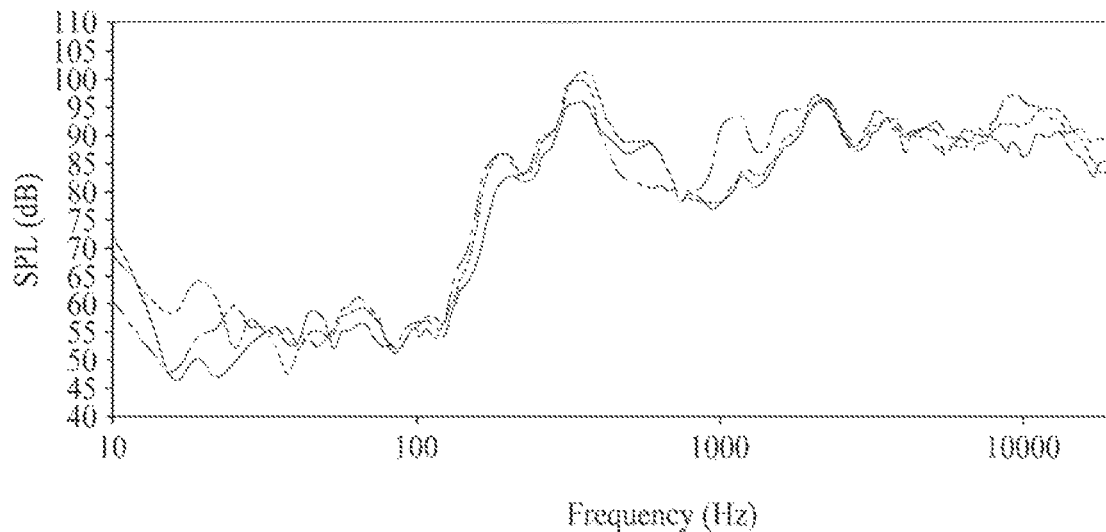
FIG. 28 illustrates a sound pressure level with respect to a frequency of a structure where a first groove portion is not provided in the sound apparatus of FIGS. 15 and 16 and the sound apparatus of FIG. 12, according to embodiments of the present disclosure.

FIG. 28 illustrates a sound pressure level with respect to a frequency of a structure where a first groove portion is not provided in the sound apparatus of FIGS. 15 and 16, and the sound apparatus of FIG. 12.

A method of measuring a sound output characteristic can be the same as the descriptions of FIG. 23, and thus, repetitive descriptions thereof may be omitted.

In FIG. 28, the abscissa axis represents a frequency in hertz (Hz), and the ordinate axis represents a sound pressure level SPL in decibels (dB).

In FIG. 28, a dotted line represents a sound output characteristic of a sound apparatus to which the inner housing of FIG. 15 is applied, a solid line represents a sound output characteristic of a sound apparatus to which the inner housing of FIG. 16 is applied, and a dash-single dotted line represents a sound output characteristic of a structure where a first groove portion is not provided in the sound apparatus 10 of FIG. 12.

With reference to FIG. 28, comparing with the dash-single dotted line, in the dotted line and the solid line, it can be seen that a sound pressure level characteristic is enhanced in a frequency range of a middle-low-pitched sound band. For example, the middle-low-pitched sound band can be a frequency range of 300 Hz to 500 Hz. Also, comparing with the dash-single dotted line, in the dotted line and the solid line, it can be seen that there is no difference between sound output characteristics in a full-pitched sound band, except for the middle-low-pitched sound band.

Figure 29:
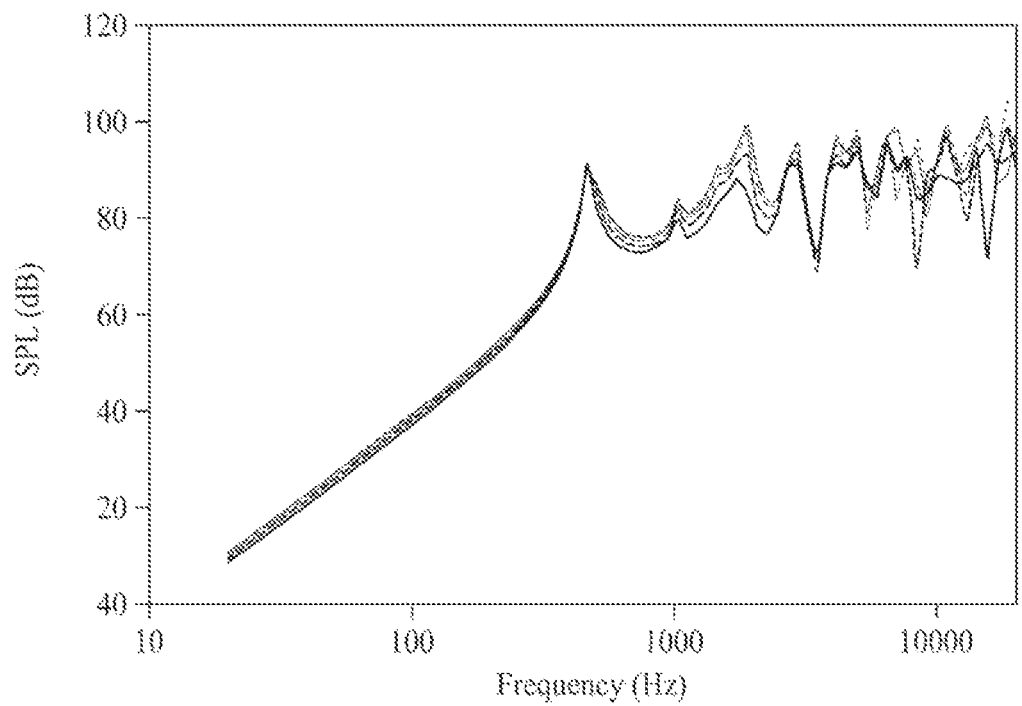
FIG. 29 illustrates a sound pressure level with respect to a frequency of the sound apparatus of FIG. 22 according to an embodiment of the present disclosure.

FIG. 29 shows a sound pressure level with respect to a frequency of the sound apparatus of FIG. 22.

A method of measuring a sound output characteristic can be the same as the descriptions of FIG. 23, and thus, repetitive descriptions thereof may be omitted.

In FIG. 28, the abscissa axis represents a frequency in hertz (Hz), and the ordinate axis represents a sound pressure level SPL in decibels (dB).

In FIG. 29, a length of the vibration member 110 in the first direction X and a length of the vibration member 110 in the second direction Y is each adjusted to 150 mm, and a length of a valid vibration plate of the vibration member 110 can be reduced by the connection member 140 at one side and the other side of the vibration member 110 (e.g., see FIG. 22). In FIG. 29, a first-direction length of the connection member 140 is adjusted to 10 mm. Accordingly, a length of a valid vibration plate of the vibration member 110 is 130 mm. The vibration apparatus 130 is disposed at a center of the vibration member 110, and then, a sound pressure level output characteristic has been measured while moving by 5 mm each toward one side of the vibration member in the first direction X. For example, FIG. 29 plots various sound responses as certain dimensions shown in FIG. 22 are adjusted.

In FIG. 29, a dotted line represents a value which has been measured under a condition where each of a first length X1 and a second length X2 of the vibration member 110 in the first direction X is 65 mm identically and each of a first length Y1 and a second length Y2 of the vibration member 110 in the second direction Y is 65 mm identically (e.g., also see FIG. 22).

In FIG. 29, a solid line represents a value which has been measured under a condition where each of a first length X1 and a second length X2 of the vibration member 110 in the first direction X is 65 mm identically, a first length Y1 of the vibration member 110 in the second direction Y is 60 mm, and a second length Y2 of the vibration member 110 in the second direction Y is 70 mm (e.g., also see FIG. 22).

In FIG. 29, a dash-single dotted line represents a value which has been measured under a condition where each of a first length X1 and a second length X2 of the vibration member 110 in the first direction X is 65 mm identically, a first length Y1 of the vibration member 110 in the second direction Y is 55 mm, and a second length Y2 of the vibration member 110 in the second direction Y is 75 mm (e.g., also see FIG. 22).

In FIG. 29, a thick dotted line represents a value which has been measured under a condition where each of a first length X1 and a second length X2 of the vibration member 110 in the first direction X is 65 mm identically, a first length Y1 of the vibration member 110 in the second direction Y is 50 mm, and a second length Y2 of the vibration member 110 in the second direction Y is 80 mm (e.g., also see FIG. 22).

In FIG. 29, a thick solid line represents a value which has been measured under a condition where each of a first length X1 and a second length X2 of the vibration member 110 in the first direction X is 65 mm identically, a first length Y1 of the vibration member 110 in the second direction Y is 45 mm, and a second length Y2 of the vibration member 110 in the second direction Y is 85 mm (e.g., also see FIG. 22).

Comparing with the dotted line, in the solid line, the dash-single dotted line, and the thick solid line, a sound pressure level of a low-pitched sound band or a primarily resonance point band of the vibration apparatus 130 can increase. For example, a sound pressure level of about 400 Hz can increase in the low-pitched sound band or the primarily resonance point band, and thus, comparing with the dotted line, in the solid line, the dash-single dotted line, and the thick solid line, there can be an advantage in sound pressure level of the low-pitched sound band.

In a certain frequency range including 2 kHz which is a quaternary resonance point, a sound pressure level can decrease in a direction distancing from a center portion of the vibration member 110. For example, comparing with the dotted line, in the thick dotted line, a sound pressure level can decrease by about 6 dB.

Therefore, when a position of one corner of the vibration member 110 in the first direction X is defined as a value of 0% and a position of the other corner of the vibration member 110 in the first direction X is defined as a value of 100%, for example, the vibration apparatus 130 can be disposed within a range of 35% to 65% in the first direction X of the vibration member 110, or can be disposed within a range of 38.5% to 61.5%.

Therefore, when a position of one corner of the vibration member 110 in the second direction Y is defined as a value of 0% and a position of the other corner of the vibration member 110 in the second direction Y is defined as a value of 100%, for example, the vibration apparatus 130 can be disposed within a range of 35% to 65% in the second direction Y of the vibration member 110, or can be disposed within a range of 38.5% to 61.5%.

The sound apparatus according to an embodiment of the present disclosure will be described below.

An apparatus according to an embodiment of the present disclosure can comprise a vibration member, a housing at a rear surface of the vibration member, a connection member between the vibration member and the housing, and a vibration apparatus vibrating the vibration member.

According to some embodiments of the present disclosure, the vibration member can have a non-flat structure.

According to some embodiments of the present disclosure, the vibration member can comprise a protrusion portion, the protrusion portion protrudes from the rear surface of the vibration member, and the protrusion portion and the vibration member can be configured as one body.

According to some embodiments of the present disclosure, the vibration member can further comprise a first groove portion, the first groove portion can be provided at a first surface of the vibration member to have a thickness which is thinner than another portion of the vibration member that does not overlap with the vibration apparatus, and the vibration apparatus can overlap at least a portion of the first groove portion.

According to some embodiments of the present disclosure, the housing can comprise a bottom portion, a lateral portion connected to a periphery of the bottom portion to protrude toward the vibration member, and a second groove portion provided at an inner surface of the lateral portion.

According to some embodiments of the present disclosure, a periphery portion of the vibration member can be inserted or accommodated into the second groove portion of the housing.

According to some embodiments of the present disclosure, the vibration member can comprise a protrusion portion, and the protrusion portion can protrude from a second surface of the vibration member and is inserted or accommodated into the second groove portion.

According to some embodiments of the present disclosure, the vibration member can further comprise a first groove portion, the first groove portion can be provided at a first surface of the vibration member to have a thickness which is thinner than another portion of the vibration member, the vibration apparatus can overlap at least a portion of the first groove portion, and a periphery portion of the vibration member can be inserted or accommodated into the second groove portion of the housing.

According to some embodiments of the present disclosure, the connection member can comprise a first connection member disposed at an upper end of the second groove portion of the housing, and a second connection member disposed at a lower end of the second groove portion of the housing.

According to some embodiments of the present disclosure, the sound apparatus can further comprise an inner housing disposed inside the housing to surround the vibration apparatus, the inner housing can comprise a bottom portion, a lateral portion connected to a periphery of the bottom portion to protrude toward the vibration member, and a first reinforcement member provided at a center portion of the bottom portion, the first reinforcement member, the first reinforcement member protruding to contact the vibration apparatus.

According to some embodiments of the present disclosure, the inner housing can further comprise a second reinforcement member provided at a periphery portion of the first reinforcement member to protrude toward the vibration apparatus from the bottom portion, and the second reinforcement member can have a height which is lower than the first reinforcement member.

According to some embodiments of the present disclosure, the inner housing can further comprise an opening portion formed to pass through a first surface of the bottom portion and a second surface, which is opposite to the first surface, of the bottom portion, and the opening portion can comprise at least one of a hole shape and a slit shape. For example, the opening portion can allow air to pass in and out of the inner housing.

According to some embodiments of the present disclosure, the sound apparatus can further comprise a secondary vibration member between the inner housing and the vibration member, a third connection member between the inner housing and the secondary vibration member, and a fourth connection member between the secondary vibration member and the vibration member.

According to some embodiments of the present disclosure, the sound apparatus can further comprise a sound processing circuit mounted at the bottom portion of the inner housing, and the sound processing circuit can be connected to the vibration apparatus through a signal cable.

According to some embodiments of the present disclosure, the vibration apparatus can be disposed to overlap the vibration member, between one corner and the other corner of the vibration member in a first direction or a second direction, and a center portion of a horizontal surface of the vibration apparatus can overlap a center portion of a horizontal surface of the vibration member, or can be disposed close thereto in the first direction or the second direction.

According to some embodiments of the present disclosure, the center portion of the horizontal surface of the vibration apparatus can be disposed within a range of 0% to 15% in the first direction or the second direction from the center portion of the horizontal surface of the vibration member, with respect to a size of a valid vibration plate of the vibration member.

According to some embodiments of the present disclosure, the vibration apparatus can comprise a vibration device, the vibration device can comprise a vibration portion, a first electrode portion at a first surface of the vibration portion, and a second electrode portion at a second surface different from the first surface of the vibration portion.

According to some embodiments of the present disclosure, the vibration apparatus can further comprise a first cover member at the first electrode portion, and a second cover member at the second electrode portion.

According to some embodiments of the present disclosure, the vibration apparatus can further comprise a first adhesive layer between the first cover member and the first electrode portion, and a second adhesive layer between the second cover member and the second electrode portion.

According to some embodiments of the present disclosure, the vibration portion can comprise an inorganic material portion having a piezoelectric characteristic.

According to some embodiments of the present disclosure, the vibration portion can comprise a plurality of inorganic material portions having a piezoelectric characteristic, and a plurality of organic material portion between the plurality of inorganic material portions.

According to some embodiments of the present disclosure, the vibration member can comprise a metal material, or comprises single nonmetal materials or composite nonmetal materials of one or more of wood, rubber, plastic, glass, fiber, cloth, paper, a mirror, carbon, and leather.

According to some embodiments of the present disclosure, the vibration member can comprise one or more of a display panel including a pixel configured to display an image, a light emitting diode lighting panel, an organic light emitting lighting panel, and an inorganic light emitting lighting panel.

According to some embodiments of the present disclosure, the vibration member can comprise one or more of a display panel including a pixel configured to display an image, a screen panel on which an image is to be projected from a display apparatus, a lighting panel, a signage panel, a vehicular dash board, a vehicular roof panel, side panel or column, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

The sound apparatus according to an embodiment of the present disclosure can be connected to all electronic devices by wire or wirelessly and can be used as a sound apparatus of a corresponding electronic device. For example, an apparatus connectable to the sound apparatus according to some embodiments of the present disclosure can be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. Also, the sound apparatus according to some embodiments of the present disclosure can be applied to organic light-emitting lighting apparatuses or inorganic light-emitting lighting apparatuses. When the sound apparatus according to some embodiments of the present disclosure is applied to lighting apparatuses, the lighting apparatuses can act as lighting and a speaker. Also, when the sound apparatus according to some embodiments of the present disclosure is applied to a mobile device, or the like, the sound apparatus can be one or more of a speaker, a receiver, and a haptic device, but embodiments of the present disclosure are not limited thereto.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A sound apparatus, comprising:
a vibration member;
a housing at a rear surface of the vibration member;

a connection member disposed between the vibration member and the housing; and a vibration apparatus configured to vibrate the vibration member, wherein the vibration member comprises a first groove portion at a front surface of the vibration member, and wherein the vibration apparatus overlaps at least a portion of the first groove portion.

2. The sound apparatus of claim 1, wherein the vibration member has a non-flat structure.

3. The sound apparatus of claim 2, wherein:
the vibration member comprises a protrusion portion;
the protrusion portion protrudes from the rear surface of the vibration member; and
the protrusion portion and the vibration member are configured as one body.

4. The sound apparatus of claim 2,
wherein the first groove portion of the vibration member is thinner than another portion of the vibration member that does not overlap with the vibration apparatus.

5. The sound apparatus of claim 1, wherein the housing comprises:
a bottom portion;
a lateral portion connected to a periphery of the bottom portion and protruding toward the vibration member; and
a second groove portion at an inner surface of the lateral portion of the housing.

6. The sound apparatus of claim 5, wherein a periphery portion of the vibration member is fitted into the second groove portion of the housing.

7. The sound apparatus of claim 6, wherein the connection member comprises:
a first connection member disposed at an upper side of the second groove portion of the housing; and
a second connection member disposed at a lower side of the second groove portion of the housing,
wherein at least a portion of the vibration member is disposed between the first connection member and the second connection member.

8. The sound apparatus of claim 5, wherein the vibration member comprises a protrusion portion, and
wherein the protrusion portion protrudes from a second surface of the vibration member and is fitted into the second groove portion of the housing.

9. The sound apparatus of claim 5, wherein:
the first groove portion of the vibration member is being-thinner than another portion of the vibration member that does not overlap with the vibration apparatus; and
a periphery portion of the vibration member is fitted into the second groove portion of the housing.

10. The sound apparatus of claim 1, further comprising an inner housing disposed inside the housing, the inner housing at least partially surrounding the vibration apparatus,
wherein the inner housing comprises:
a bottom portion;
a lateral portion connected to a periphery of the bottom portion and protruding toward the vibration member; and
a first reinforcement member at a center portion of the bottom portion, the first reinforcement member protruding toward the vibration apparatus for supporting the vibration apparatus.

11. The sound apparatus of claim 10, wherein:
the inner housing further comprises a second reinforcement member provided at a periphery portion of the first reinforcement member and protruding toward the vibration apparatus from the bottom portion of the inner housing, and
the second reinforcement member has a height lower than a height of the first reinforcement member.

12. The sound apparatus of claim 10, wherein:
the inner housing further comprises an opening portion passing through a first surface of the bottom portion of the inner housing and a second surface of the inner housing; and
the opening portion in the inner housing comprises at least one of a hole shape and a slit shape.

13. The sound apparatus of claim 10, further comprising:
an auxiliary vibration member disposed between the inner housing and the vibration member;
a third connection member disposed between the inner housing and the auxiliary vibration member; and
a fourth connection member disposed between the auxiliary vibration member and the vibration member.

14. The sound apparatus of claim 10, further comprising a sound processing circuit mounted at the bottom portion of the inner housing,
wherein the sound processing circuit is connected to the vibration apparatus through a signal cable.

15. The sound apparatus of claim 1, wherein:
the vibration apparatus overlaps with the vibration member, between one corner and another corner of the vibration member in a first direction or a second direction; and
a center portion of a horizontal surface of the vibration apparatus overlaps a center portion of a horizontal surface of the vibration member in the first direction or the second direction, or the center portion of the horizontal surface of the vibration apparatus corresponds to the center portion of the horizontal surface of the vibration member in the first direction or the second direction.

16. The sound apparatus of claim 1, wherein the vibration apparatus comprises a vibration device,
wherein the vibration device comprises:
a vibration portion;
a first electrode portion at a first surface of the vibration portion; and
a second electrode portion at a second surface different from the first surface of the vibration portion.

17. The sound apparatus of claim 16, wherein the vibration apparatus further comprises:
a first cover member at the first electrode portion; and
a second cover member at the second electrode portion.

18. The sound apparatus of claim 17, wherein the vibration apparatus further comprises:
a first adhesive layer disposed between the first cover member and the first electrode portion; and
a second adhesive layer disposed between the second cover member and the second electrode portion.

19. The sound apparatus of claim 16, wherein the vibration portion comprises an inorganic material portion having a piezoelectric characteristic.

20. The sound apparatus of claim 16, wherein the vibration portion comprises:
a plurality of inorganic material portions having a piezoelectric characteristic; and
an organic material portion disposed between the plurality of inorganic material portions.

21. The sound apparatus of claim 1, wherein the vibration member comprises a metal material, a single nonmetal material, or a composite including one or more of wood, rubber, plastic, glass, fiber, cloth, paper, a mirror, carbon, and leather.

22. The sound apparatus of claim 1, wherein the vibration member is mounted on or in at least one of a display panel including a pixel configured to display an image, a light emitting diode lighting panel, an organic light emitting lighting panel, an inorganic light emitting lighting panel, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

23. A sound apparatus, comprising:
a vibration member;
a vibration apparatus configured to vibrate the vibration member, the vibration apparatus including at least one piezoelectric element for producing sound;
a housing disposed at a rear surface of the vibration member; and
a connection member disposed between the vibration member and the housing,
wherein the connection member has a first stiffness that is less than a second stiffness of the housing,
wherein the vibration member is isolated from the housing by the connection member,
wherein the vibration member comprises a first groove portion at a front surface of the vibration member, and
wherein the vibration apparatus overlaps at least a portion of the first groove portion.

24. The sound apparatus of claim 23,
wherein the first groove portion is being-configured to reduce a stiffness of the vibration member for adjusting a sound frequency response of the sound apparatus, and
wherein a thickness of the first groove portion of the vibration member is thinner than a thickness of another portion of vibration member that does not overlap with the vibration apparatus.

25. The sound apparatus of claim 23, further comprising:
a first reinforcement member disposed at a rear surface of the vibration apparatus for supporting the vibration apparatus and for adjusting a sound frequency response of the sound apparatus.

26. The sound apparatus of claim 23, wherein the first reinforcement member directly contacts the rear surface of the vibration apparatus.

* * * * *